(12) United States Patent
Inoue et al.

(10) Patent No.: US 8,835,967 B2
(45) Date of Patent: Sep. 16, 2014

(54) NITRIDE-BASED SEMICONDUCTOR LIGHT-EMITTING DEVICE

(71) Applicant: Panasonic Corporation, Osaka (JP)

(72) Inventors: Akira Inoue, Osaka (JP); Masaki Fujikane, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/837,453

(22) Filed: Mar. 15, 2013

(65) Prior Publication Data

US 2013/0207150 A1 Aug. 15, 2013

Related U.S. Application Data

(63) Continuation of application No. PCT/JP2012/003488, filed on May 29, 2012.

(30) Foreign Application Priority Data

Jul. 14, 2011 (JP) ................. 2011-155901

(51) Int. Cl.
 *H01L 33/16* (2010.01)
(52) U.S. Cl.
 USPC ........................ 257/98; 257/E33.003
(58) Field of Classification Search
 USPC ............... 257/98, E33.002, E33.003; 438/29
 See application file for complete search history.

(56) References Cited

U.S. PATENT DOCUMENTS

| 2008/0258156 A1 | 10/2008 | Hata |
| 2009/0078951 A1 | 3/2009 | Miki et al. |
| 2010/0163887 A1 | 7/2010 | Kim et al. |
| 2011/0037089 A1* | 2/2011 | Oya et al. ................. 257/94 |
| 2012/0182495 A1 | 7/2012 | Yokogawa et al. |

FOREIGN PATENT DOCUMENTS

| JP | 2008-141015 A | | 6/2008 | |
| JP | 2008141015 A | * | 6/2008 | ............. H01L 33/00 |
| JP | 2008-305971 A | | 12/2008 | |
| WO | 2008-109098 A | | 5/2008 | |
| WO | 2010/113406 A1 | | 10/2010 | |
| WO | 2011/070770 A1 | | 6/2011 | |
| WO | 2012/017686 A1 | | 2/2012 | |

OTHER PUBLICATIONS

Co-pending U.S. Appl. No. 13/813,777, filed Feb. 1, 2013 (copy of application provided) corresponds to WO 2012/017686).
International Search Report for corresponding International Application No. PCT/JP2012/003488 mailed Jul. 10, 2012.
Form PCT/ISA/237 for corresponding International Application No. PCT/JP2012/003488 dated Jul. 10, 2012 and Partial English translation.
Okuno et al., "*m*-Plane GaN Films Grown on Patterned *a*-Plane Sapphire Substrates With 3-inch Diameter", Applied Physics Express 2 (2009) 031002 (cited in [0211] of the specification).

* cited by examiner

*Primary Examiner* — Daniel Shook
(74) *Attorney, Agent, or Firm* — Renner, Otto, Boisselle & Sklar, LLP

(57) ABSTRACT

A nitride-based semiconductor light-emitting device of the present disclosure includes: a semiconductor multilayer structure which includes an active layer that is made of a nitride semiconductor, a principal surface of the nitride semiconductor being a semi-polar plane or a non-polar plane and which has recessed/elevated surfaces including at least either of recessed portions and elevated portions; an electrode covering a side of the semiconductor multilayer structure at which the recessed/elevated surfaces is provided, the electrode being configured to reflect at least part of light emitted from the active layer; and a birefringent substrate provided on a side of the semiconductor multilayer structure which is opposite to the recessed/elevated surfaces, the birefringent substrate being configured to transmit light emitted from the active layer and light reflected by the electrode.

19 Claims, 31 Drawing Sheets

● N
◐ Ga

◐ N
◐ Ga

[1-100] ↑
⊙ [11-20]   → [000-1]

m- PLANE

◐ N
◐ Ga

[0001] ↑
⊙ [1-100]   → [-1-120]

c- PLANE

Lp=33um

Lp=36um ated along the c-axis direction in the InGaN quantum well in the active
NITRIDE-BASED SEMICONDUCTOR LIGHT-EMITTING DEVICE This is a continuation of International Application No. PCT/JP2012/003488, with an international filing date of May 29, 2012, which claims priority of Japanese Patent Application No. 2011-155901, filed on Jul. 14, 2011, the contents of which are hereby incorporated by reference.

BACKGROUND

1. Technical Field

The present application relates to a nitride-based semiconductor light-emitting device which has polarization characteristics.

2. Description of the Related Art

A nitride semiconductor containing nitrogen (N) as a Group V element is a prime candidate for a material to make a short-wave light-emitting device, because its bandgap is sufficiently wide. Among other things, gallium nitride-based compound semiconductors have been researched and developed particularly extensively. As a result, blue light-emitting diodes (LEDs), green LEDs, and blue semiconductor laser diodes in which gallium nitride-based compound semiconductors are used have already been used in actual products.

Hereinafter, the gallium nitride-based compound semiconductors are referred to as nitride semiconductors. The nitride semiconductors include a compound semiconductor in which some or all of gallium (Ga) atoms are replaced with at least one of aluminum (Al) and indium (In) atoms. Therefore, the nitride semiconductors are represented by compositional formula $Al_xGa_yIn_zN$ ($0 \leq x, y, z \leq 1$, $x+y+z=1$).

By replacing Ga atoms with Al atoms, the bandgap can be greater than that of GaN. By replacing Ga atoms with In atoms, the bandgap can be smaller than that of GaN. This enables not only emission of short-wave light, such as blue light or green light, but also emission of orange light or red light. Because of such a feature, a nitride-based semiconductor light-emitting device has been expected to be applied to image display devices and lighting devices.

The nitride semiconductor has a wurtzite crystal structure. FIGS. 1A, 1B, and 1C show planes of a wurtzite crystal structure using four characters (hexagonal indices). In a four-character expression, crystal planes and orientations are expressed using primitive vectors of a1, a2, a3, and c. The primitive vector c runs in the [0001] direction, which is called a "c-axis". A plane that intersects with the c-axis at right angles is called either a "c-plane" or a "(0001) plane". FIG. 1A shows c-plane as well as a-plane and m-plane. The c-plane, the a-plane, and the m-plane are perpendicular to one another. FIG. 1B shows r-plane. FIG. 1C shows (11-22) plane.

FIG. 2A shows a ball-and-stick model of the crystal structure of the nitride semiconductor. FIG. 2B shows an atomic arrangement near an m-plane surface, which is observed from the a-axis direction that is perpendicular to the a-plane, i.e., the [11-20] direction. The m-plane is perpendicular to the drawing sheet of FIG. 2B. FIG. 2C shows an atomic arrangement at a +c-plane surface, which is observed from the m-axis direction. The c-plane is perpendicular to the drawing sheet of FIG. 2C. As seen from FIG. 2B, N atoms and Ga atoms reside at a plane which is parallel to the m-plane. On the other hand, as seen from FIG. 2C, the c-plane includes layers in which only Ga atoms reside and layers in which only N atoms reside.

In general, in fabricating a semiconductor device using nitride semiconductors, a c-plane substrate, i.e., a substrate which has a (0001)-plane principal surface, is used as a substrate on which nitride semiconductor crystals are to be grown. In this case, due to the arrangement of Ga atoms and N atoms, spontaneous electrical polarization is produced in the c-axis direction in the nitride semiconductor. That is why the c-plane is also called a "polar plane". As a result of the electrical polarization, a piezoelectric field is generated along the c-axis direction in the InGaN quantum well in the active layer of the nitride-based semiconductor light-emitting device. This electric field causes some positional deviation in the distributions of electrons and holes in the active layer, so that the internal quantum yield decreases due to the quantum confinement Stark effect of carriers.

Thus, it has been proposed that a substrate of which the principal surface is a so-called "non-polar plane", such as m-plane or a-plane, or a so-called "semi-polar plane", such as –r plane or (11-22) plane, be used. As shown in FIG. 1, the m-planes in the wurtzite crystal structure are parallel to the c-axis and are six equivalent planes which intersect with the c-plane at right angles. For example, in FIG. 1, the (1-100) plane that is perpendicular to the [1-100] direction is the m-plane. The other m-planes which are equivalent to the (1-100) plane include (–1010) plane, (10-10) plane, (–1100) plane, (01-10) plane, and (0-110) plane. Here, "-" attached on the left-hand side of a Miller-Bravais index in the parentheses means a "bar".

On the m-plane, as shown in FIG. 2B, Ga atoms and N atoms are on the same atomic-plane. For that reason, no electrical polarization will be produced perpendicularly to the m-plane. Therefore, if a light-emitting device is fabricated using a semiconductor multilayer structure which has been formed on the m-plane, no piezoelectric field will be generated in the active layer, thus overcoming the problem that the internal quantum yield decreases due to the quantum confinement Stark effect of carriers. This also applies to the a-plane that is one of the other non-polar planes than the m-plane. Also, similar effects can be achieved even in the case of a so-called semi-polar plane, such as –r plane or (11-22) plane.

Further, a nitride-based semiconductor light-emitting device including an active layer which is formed on the m-plane or a-plane or the r-plane or (11-22) plane has a polarization characteristic which is attributed to the structure of its valence band. Light which is emitted in the c-axis direction from an active layer of which principal surface is a c-plane is not polarized light. However, polarized light can be extracted from an active layer of which principal surface is inclined with respect to the c-plane.

Japanese Laid-Open Patent Publication No. 2008-305971 discloses, as a solution to improve light extraction with polarization being maintained in a Group III nitride-based semiconductor light-emitting device of which principal surface is a non-polar plane or a semi-polar plane, a configuration in which striped grooves which have a sawtooth shape are provided across a light extraction surface of the nitride-based semiconductor light-emitting device. The extending direction of the striped grooves is perpendicular to the polarization direction.

Applied Physics Express 2 (2009) 031002 discloses a configuration in which an m-plane GaN layer of excellent crystallinity is provided on an a-plane sapphire which has striped recesses and elevations. The extending direction of the striped recesses and elevations corresponds to the m-axis direction of the sapphire, i.e., the a-axis direction of the GaN.

Japanese Laid-Open Patent Publication No. 2008-109098 proposes a light-emitting diode device which is configured so as to reduce the difference in emission intensity which is attributed to the difference in in-plane azimuth angle of a nitride-based semiconductor light-emitting device. In the fifth embodiment of Japanese Laid-Open Patent Publication No. 2008-109098, the light emission surface of a package is configured such that the direction of light is changed to a direction of an azimuth angle in which the emission intensity is small so as to reduce the difference in intensity of light emitted from the package which is attributed to the difference in in-plane azimuth angle of the chip placing surface.

SUMMARY

In the above-described conventional techniques, further improvement of emission quality has been demanded. Embodiments of the present disclosure can improve the emission quality.

In one general aspect, a nitride-based semiconductor light-emitting device disclosed herein is a nitride-based semiconductor light-emitting device which has a light extraction surface, including: a semiconductor multilayer structure including an active layer which is made of a nitride semiconductor, a principal surface of the nitride semiconductor being a semi-polar plane or a non-polar plane; an electrode which is configured to reflect at least part of light emitted from the active layer in a direction toward the light extraction surface; a birefringent substrate provided between the light extraction surface and the electrode, the birefringent substrate being configured to transmit light emitted from the active layer and light reflected by the electrode; and a recessed/elevated surface provided between the active layer and the electrode, wherein the following relationship holds true:

$$90 \cdot (2 \cdot a - 1) - 45 \leq \Delta n \cdot d \cdot \frac{360}{\lambda} \leq 90 \cdot (2 \cdot a - 1) + 45 \quad \text{[Expression 1]}$$

where $\Delta n$ is a birefringence of the substrate, d is a thickness of the substrate, $\lambda$ is an emission wavelength, and a is a natural number, and an angle which is formed between a lateral surface of each of the recessed or elevated portions and a normal line of a principal surface of the active layer, $\theta 1$, is not less than 10° and not more than 58°.

In an embodiment of the present disclosure, a light source includes: the above-described nitride-based semiconductor light-emitting device; and a wavelength converter including a phosphor that converts a wavelength of light emitted from the nitride-based semiconductor light-emitting device.

According to the above aspect, the polarization degree is reduced, the light distribution characteristics are ameliorated, and the emission quality is improved.

These general and specific aspects may be implemented using a method. Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

DETAILED DESCRIPTION

Figure 1A:
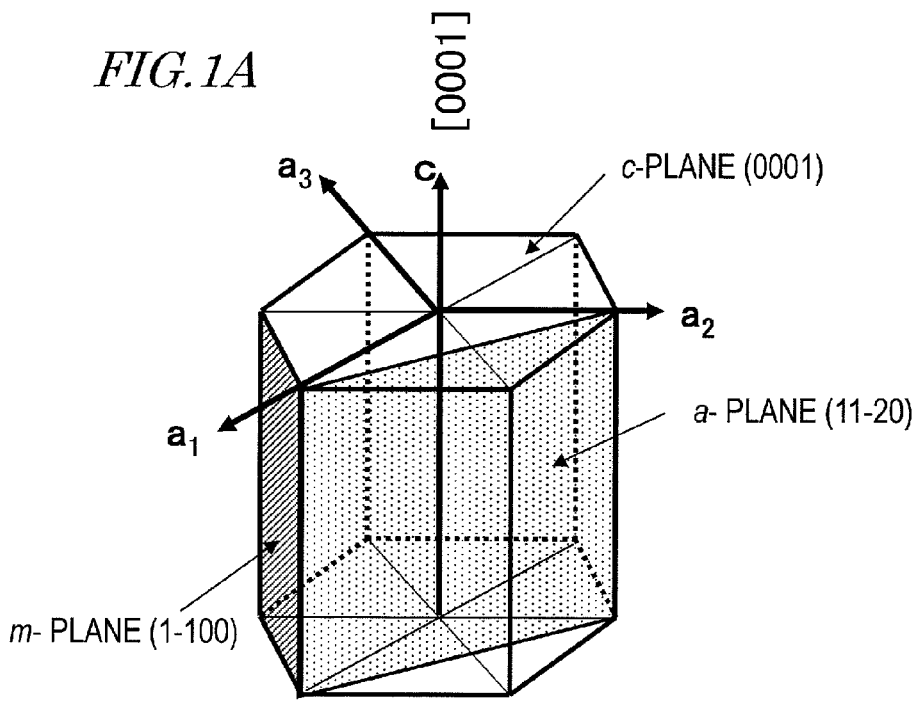
FIGS. 1A through 1C are a diagram showing a wurtzite crystal structure.
Figure 1B:
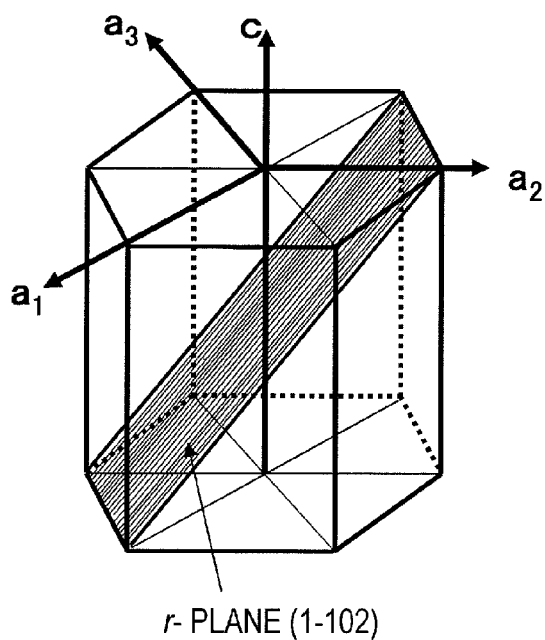
Figure 1C:
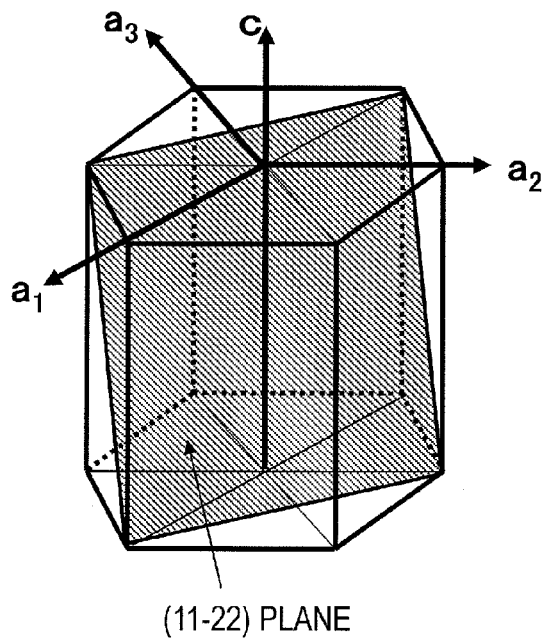
Figure 2A:
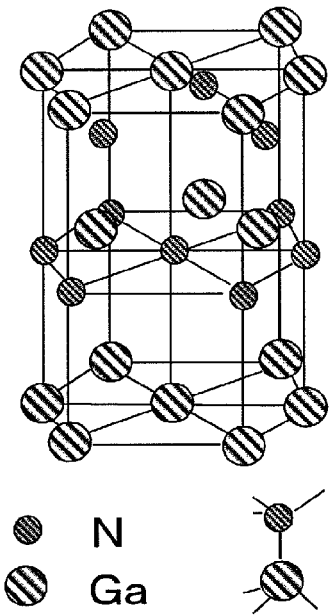
FIGS. 2A through 2C show the crystal structure of a nitride semiconductor using ball-and-stick models.
Figure 2B:
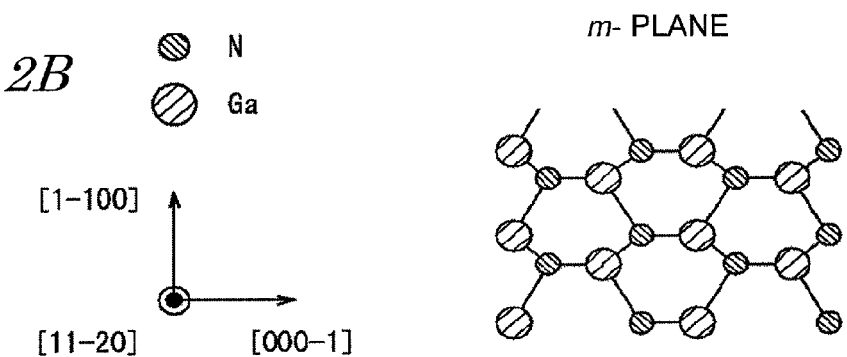
Figure 2C:
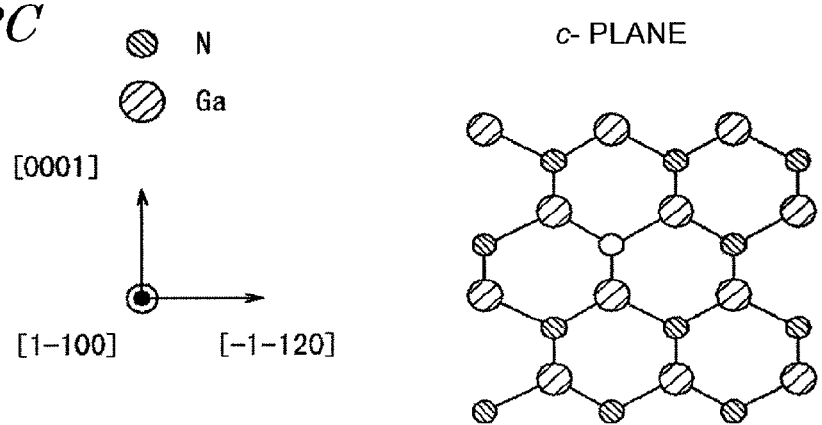

According to an embodiment of the present disclosure, a nitride-based semiconductor light-emitting device is a nitride-based semiconductor light-emitting device having a light extraction surface, including: a semiconductor multilayer structure including an active layer which is made of a nitride semiconductor, a principal surface of the nitride semiconductor being a semi-polar plane or a non-polar plane; an electrode which is configured to reflect at least part of light emitted from the active layer in a direction toward the light extraction surface; a birefringent substrate provided between the light extraction surface and the electrode, the birefringent substrate being configured to transmit light emitted from the active layer and light reflected by the electrode; and a recessed/elevated surface provided between the active layer and the electrode, wherein the following relationship holds true:

$$90 \cdot (2 \cdot a - 1) - 45 \leq \Delta n \cdot d \cdot \frac{360}{\lambda} \leq 90 \cdot (2 \cdot a - 1) + 45 \quad \text{[Expression 1]}$$

where Δn is a birefringence of the substrate, d is a thickness of the substrate, λ is an emission wavelength, and a is a natural number, and an angle which is formed between a lateral surface of each of the recessed or elevated portions and a normal line of a principal surface of the active layer, θ1, is not less than 10° and not more than 58°.

In one embodiment, the recessed/elevated surface is provided in the principal surface of the semiconductor multilayer structure.

In one embodiment, recessed portions that form the recessed/elevated surface of the semiconductor multilayer structure reach the active layer.

In one embodiment, the recessed/elevated surface is provided in the birefringent substrate.

In one embodiment, the active layer is configured to emit light of which electric field intensity is deviated in a direction parallel to the principal surface.

In one embodiment, the birefringent substrate includes a portion which is made of a nitride semiconductor, a principal surface of the nitride semiconductor being a semi-polar plane or a non-polar plane.

In one embodiment, an optic axis of the birefringent substrate is inclined by an angle which does not include 0° or 90° with respect to a principal surface of the substrate.

In one embodiment, the birefringent substrate is any one of the following substrates: a substrate which is made of a GaN, a principal surface of the GaN being an m-plane; a substrate which is made of a GaN, a principal surface of the GaN being an a-plane; a substrate which is made of a GaN, a principal surface of the GaN being a −r plane; an r-plane sapphire substrate which has a GaN layer, a principal surface of the GaN layer being an a-plane on surface of the r-plane sapphire substrate; an m-plane sapphire substrate which has a GaN layer, a principal surface of the GaN layer being an m-plane on surface of the m-plane sapphire substrate; an a-plane sapphire substrate which has a GaN layer, a principal surface of the GaN layer being an en-plane on surface of the a-plane sapphire substrate; and an en-plane SiC substrate which has a GaN layer, a principal surface of the GaN layer being an m-plane on surface of the m-plane SiC substrate.

In one embodiment, the birefringent substrate is a GaN substrate, a principal surface of the GaN substrate being an m-plane.

In one embodiment, a shape of each of the recessed or elevated portions that form the recessed/elevated surface which is viewed from a normal direction of a principal surface of the active layer is a circular or quadrangular shape or a shape which is defined by a combination thereof, and the recessed or elevated portions that form the recessed/elevated surface are two-dimensionally arranged in a plane of the principal surface of the semiconductor multilayer structure or a rear surface of the birefringent substrate.

In one embodiment, a shape of a cross section of each of the recessed or elevated portions that form the recessed/elevated surface which is perpendicular to a principal surface of the active layer is a trapezoidal shape, a triangular shape, a shape which is defined by a portion cut off from a circle or ellipse, or a shape which is defined by a combination thereof, and an angle formed between a tangent line at a point on each of the recessed or elevated portions which is closest to the active layer and a normal line of a principal surface of the active layer, θ1, is not less than 10° and not more than 58°.

In one embodiment, a shape of the recessed or elevated portions that form the recessed/elevated surface which is viewed from a normal direction of a principal surface of the active layer is a stripe shape, and an angle which is formed by an extending direction of the stripe shape with respect to the polarization direction of light emitted from the active layer, θ2, is not less than 30° and not more than 60°.

In one embodiment, an interval between centers of adjoining recessed portions or adjoining elevated portions of the recessed or elevated portions that form the recessed/elevated surface, Lp, is not more than 40 μm.

In one embodiment, a transparent region is provided between the recessed/elevated surface of the semiconductor multilayer structure and the electrode.

In one embodiment, the transparent region is provided in the recessed portions that form the recessed/elevated surface of the semiconductor multilayer structure.

In one embodiment, the transparent region is configured to convert light passing through the transparent region to elliptical polarization.

In one embodiment, recessed portions that form the recessed/elevated surface of the semiconductor multilayer structure reach the active layer.

In one embodiment, the semiconductor multilayer structure includes a p-type semiconductor layer and a n-type semiconductor layer between which the active layer is provided.

In one embodiment, the electrode is provided so as to cover the recessed/elevated surface and is configured to reflect light such that the polarization direction is rotated.

In an embodiment of the present disclosure, a light source includes: any of the above-described nitride-based semiconductor light-emitting devices; and a wavelength converter including a phosphor that converts a wavelength of light emitted from the nitride-based semiconductor light-emitting device.

In an embodiment of the present disclosure, a method for manufacturing a nitride-based semiconductor light-emitting device includes the steps of: providing a birefringent substrate; forming a semiconductor multilayer structure on the birefringent substrate, the semiconductor multilayer structure including an active layer which is made of a nitride semiconductor, a principal surface of the nitride semiconductor being a semi-polar plane or a non-polar plane; forming a recessed/elevated surface in the semiconductor multilayer structure or the birefringent substrate, the recessed/elevated surface including at least either of recessed portions and elevated portions; and forming an electrode so as to face the recessed/elevated surface, the electrode being configured to reflect at least part of light emitted from the active layer.

In one embodiment, the method further includes the step of providing a transparent material between the electrode and the recessed/elevated surface.

In one embodiment, the method further includes the steps of: providing a mounting base; and mounting the semiconductor multilayer structure and the birefringent substrate on the mounting base such that the electrode faces the mounting base.

When a semiconductor light-emitting device has a polarization characteristic, the intensity of light emitted in a direction perpendicular to the polarization direction is higher than the intensity of light emitted in a direction parallel to the polarization direction. As will be described later, for example, a nitride-based semiconductor light-emitting device which includes an active layer formed on the m-plane mainly emits light which is polarized in the a-axis direction. This nitride-based semiconductor light-emitting device also emits light which is polarized in the c-axis direction and light which is polarized in the m-axis direction. However, the light which is polarized in the t-axis direction and the light which is polarized in the m-axis direction have weak intensities as compared with the light which is polarized in the a-axis direction. A nitride-based semiconductor light-emitting device which has a nitride semiconductor layered structure of which principal surface is a semi-polar plane or a non-polar plane generally has such a distinctive polarization characteristic, so that the intensity of light emitted in a direction perpendicular to the a-axis direction is higher than the intensities of light emitted in the other directions, and as a result, the emission pattern (light distribution) becomes nonuniform.

According to an embodiment of the present disclosure, the optical properties of a nitride semiconductor crystal of which principal surface is an m-plane are utilized, whereby the polarization degree can be reduced, and the nonuniformity in the light distribution can be alleviated. Hereinafter, polarized light and the birefringence of a material will be described prior to the description of embodiments of the present disclosure.

In this specification, a substrate surface on which a nitride semiconductor crystal is to be grown is referred to as the principal surface of the substrate. In a layer or region which is made of a nitride semiconductor, a surface of the layer or region in a growing direction is referred to as a growing surface or a principal surface. Light of which electric field intensity is deviated in a specific direction is referred to as "polarized light". For example, light of which electric field intensity is deviated in a direction parallel to X-axis is referred to as "X-axis direction polarized light". The direction parallel to the X-axis on this assumption is referred to as "polarization direction". Note that the "X-axis direction polarized light" not only means linearly-polarized light which is polarized in the X-axis direction but may include linearly-polarized light which is polarized in a different direction. More specifically, the "X-axis direction polarized light" means light in which the intensity (electric field intensity) of light transmitted through a "polarizer which has a polarization transmission axis extending in the X-axis direction" is higher than the electric field intensity of light transmitted through a polarizer which has a polarization transmission axis extending in a different direction. Therefore, the "X-axis direction polarized light" includes not only linearly-polarized light and elliptically-polarized light which are polarized in the X-axis direction but also a wide variety of non-coherent light in which linearly-polarized light and elliptically-polarized light which are polarized in various directions are mixed together.

While the polarization transmission axis of the polarizer is rotated around the optical axis, the electric field intensity of light transmitted through the polarizer exhibits the strongest intensity, Imax, and the weakest intensity, Imin. The polarization degree is defined by the following formula:

$$|Imax - Imin|/|Imax + Imin| \quad \text{(Formula 1)}$$

In the case of the "X-axis direction polarized light", when the polarization transmission axis of the polarizer is parallel to the X-axis, the electric field intensity of the light transmitted through the polarizer is Imax. When the polarization transmission axis of the polarizer is parallel to the Y-axis, the electric field intensity of the light transmitted through the polarizer is Imin. In the case of perfectly linearly-polarized light, Imin=0, and therefore, the polarization degree is equal to 1. On other hand, in the case of perfectly unpolarized light, Imax−Imin=0, and therefore, the polarization degree is equal to 0.

Next, the birefringence of a substance is described. The birefringence is a phenomenon that, when light passes through a substance, the propagation speed of the light varies depending on the orientation of the electric field vector vibration plane (hereinafter, simply referred to as "vibration plane"). Such a birefringence phenomenon is also referred to as "optical anisotropy". A material which has birefringence is referred to as "birefringence material". The birefringence is quantitatively expressed as follows:

[Expression 2]

$$\Delta n = |n_o - n_e| \quad \text{(Formula 2)}$$

where $n_o$ is the refractive index of an ordinary ray, and $n_e$ is the refractive index of an extraordinary ray.

That is, the statement that "the traveling speed of the light varies depending on the orientation of the vibration plane" means that "the refractive index varies depending on the orientation of the vibration plane". This is because the speed of light in a substance is proportional to 1/Refractive Index. $n_o$ does not depend on the angle which is formed between incident light and the optic axis of the substance. On the other hand, $n_e$ varies depending on the angle which is formed between incident light and the optic axis of the substance and reaches the maximum when the angle which is formed between incident light and the optic axis of the substance is 90°. Here, the optic axis refers to a direction in which a birefringence does not occur, or a direction in which the birefringence reaches the minimum, in a crystal which has birefringence.

Figure 3:
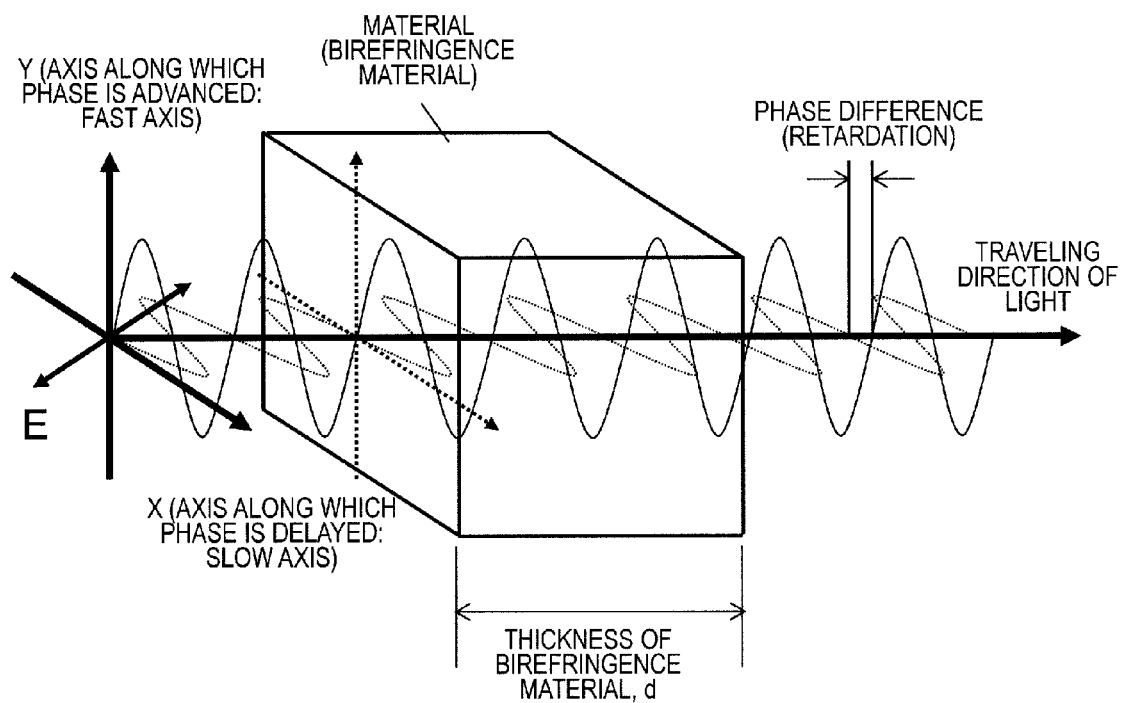
FIG. 3 is a diagram illustrating the characteristics of a birefringent material.

In FIG. 3, the substance is a birefringence material. The Y-axis is an axis along which the phase is advanced (fast axis), and the X-axis is an axis along which the phase is delayed (slow axis). Here, $n_y < n_x$ holds true where $n_y$ is the refractive index along the Y-axis and $n_x$ is the refractive index along the X-axis. Linearly-polarized light is introduced to be incident on the birefringence material that has such features from the left side. Note that, however, the polarization direction of the incident light is inclined by 45° with respect to the Y-axis and the X-axis. In this case, the incident light can be separated into the Y-axis component and the X-axis component for analysis. Before the light impinges on the substance, the separated light components are coincident in phase. During passage of the incident light through the birefringence material, the speed of the light of the Y-axis component is faster, and the phase of the Y-axis component is advanced. On the other hand, the speed of the light of the X-axis component is slower, and the phase of the X-axis component is delayed. As a result, after the passage of the light through the substance, the light has a phase difference between the Y-axis component and the X-axis component. Due to occurrence of the phase difference, the light which has passed through the birefringence material is elliptical polarization or circular polarization even when the incident light is linear polarization. The amount of the phase difference is referred to as "retardation", which is expressed as follows:

[Expression 3]

$$\delta = \Delta n \cdot d \cdot \frac{360}{\lambda}[\text{deg.}] \quad \text{(Formula 3)}$$

where Δn is the birefringence, d is the thickness of the birefringence material, and λ is the wavelength of the incident light.

Transmitted light can be converted to circular polarization under exceptional conditions, i.e., when the polarization direction of the incident light is inclined by 45° with respect to the Y-axis and the X-axis, and the retardation is equivalent to 90° (¼ wavelength) or 270° (¾ wavelength). When the polarization direction of the incident light is coincident with the Y-axis or the X-axis, the linear polarization is maintained. Otherwise, transmitted light is converted to elliptical polarization. When the polarization direction of the incident light is inclined by 45° with respect to the Y-axis and the X-axis, the polarization degree of the transmitted light is the minimum.

Whether or not the crystal has birefringence depends on the crystal structure of the crystal. The crystals which have birefringence include uniaxial crystals and biaxial crystals. The uniaxial crystals include the tetragonal system, the hexagonal system, and the trigonal system, and have one optic axis. The biaxial crystals include the orthorhombic system, the monoclinic system, and the triclinic system, and have two optic axes.

The nitride semiconductor is a material which can have either of the cubic system crystal structure or the hexagonal system crystal structure. A commonly-employed nitride semiconductor crystal is the hexagonal system, which is considered as a uniaxial crystal. However, as of now, there are only a few reports about the birefringence of the nitride semiconductor. In view of such circumstances, the birefringence of an m-plane GaN substrate was first examined.

Figure 46A:
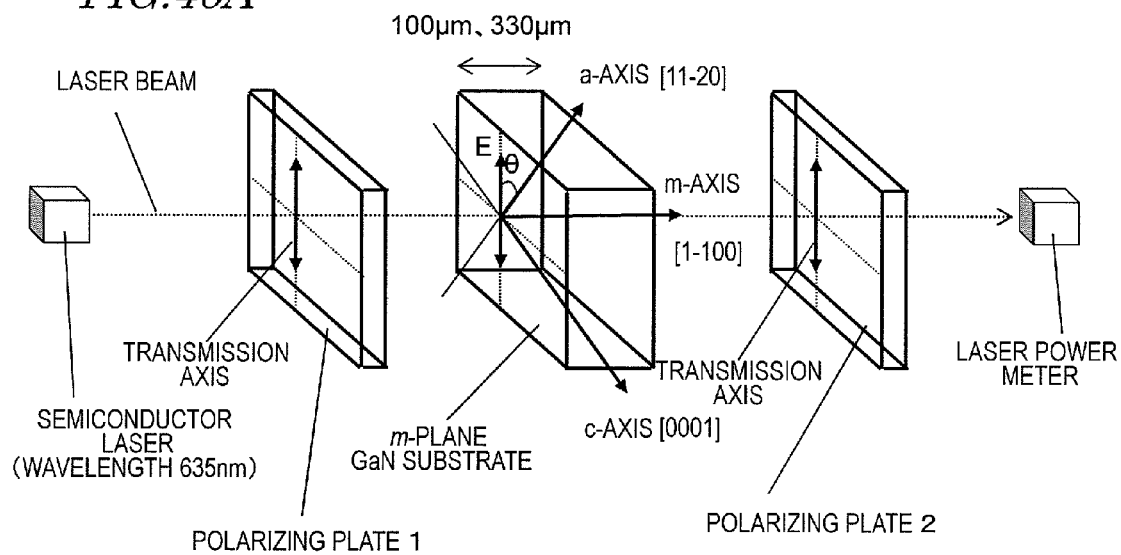
FIG. 46A is a diagram showing an optical system (parallel transmission axes) for illustrating a method for measuring the birefringence.
Figure 46B:
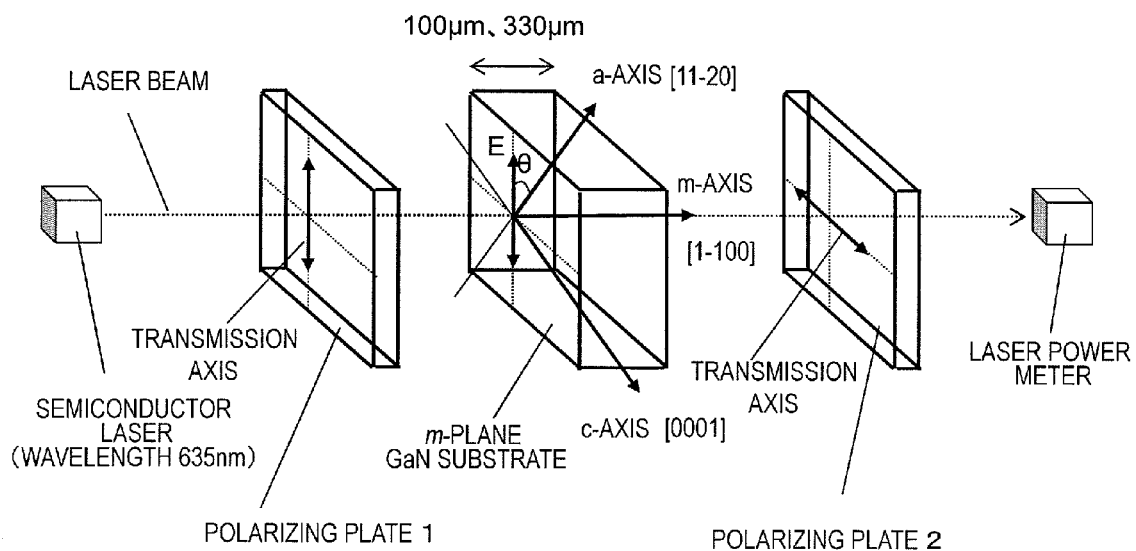
FIG. 46B is a diagram showing an optical system (orthogonal transmission axes) for illustrating a method for measuring the birefringence.

FIG. 46A and FIG. 46B show optical systems for illustrating a method for measuring the birefringence. The light source used was a semiconductor laser having a wavelength of 635 nm. The components are arranged such that a laser beam sequentially passes through a polarizing plate 1, an m-plane GaN substrate, and a polarizing plate 2 in this order. A laser beam which has passed through the polarizing plate 1, the m-plane GaN substrate, and the polarizing plate impinges on a laser power meter (PM-100 manufactured by Kimmon Koha Co., Ltd.). The m-plane GaN substrate is arranged such that the traveling direction of the laser beam and the m-axis are oriented in the same direction.

In the optical system of FIG. 46A, the polarizing plate 1 and the polarizing plate 2 are arranged such that their transmission axes are oriented in the same direction. The angle which is formed between the transmission axis of the polarizing plate 1 and the a-axis of the m-plane GaN substrate is θ. The value of the laser power meter during rotation of θ from 0° to 180° is Ip (θ). In the optical system of FIG. 46B, the polarizing plate 1 and the polarizing plate 2 are arranged such that their transmission axes are orthogonal to each other. The angle which is formed between the transmission axis of the polarizing plate 1 and the a-axis of the m-plane GaN substrate is θ. The value of the laser power meter during rotation of θ from 0° to 180° is Io (θ). The normalized value of Ip (θ), Ip (θ) bar, and the normalized value of Io (θ), Io (θ) bar, are approximately given as follows:

$$\bar{Ip}(\theta) = \frac{\bar{Ip}(\theta)}{\bar{Ip}(\theta) + \bar{Io}(\theta)} = 1 - \frac{1}{2}(1-\cos\delta)\sin^2(2\theta) \quad \text{[Expression 4]}$$

$$\bar{Io}(\theta) = \frac{\bar{Io}(\theta)}{\bar{Ip}(\theta) + \bar{Io}(\theta)} = \frac{1}{2}(1-\cos\delta)\sin^2(2\theta)$$

where δ is the retardation (phase difference), which is given by Formula 3.

From the above, the retardation δ of the m-plane GaN substrate can be determined by measuring Io (θ) and Ip (θ). When the retardation δ is determined, the birefringence Δn of the m-plane GaN substrate can be derived using Formula 3. A 100 μm thick hexagonal system m-plane GaN substrate was measured, and the birefringence Δn was 0.00122. A 330 μm thick hexagonal system m-plane GaN substrate was measured, and the birefringence Δn was 0.00134. The average of these values is 0.00128. From these measurement results, it was found that the hexagonal system GaN crystal is a birefringence material.

Next, in order to clarify the optic axis of the hexagonal system GaN crystal, a 100 μm thick hexagonal system c-plane GaN substrate and a 100 μm thick hexagonal system m-plane GaN substrate were prepared. Linearly-polarized light having a wavelength of 450 nm was introduced to be incident on these substrates in order to examine the polarization degree of transmitted light using the angle (θ) between the polarization direction of the incident light and the a-axis of the GaN crystal as the parameter. Supposing that Δn is 0.00128 in consideration of the above measurement, the retardation of the 100 μm thick hexagonal system m-plane GaN substrate for light at the wavelength of 450 nm corresponds to 102.4°. This value is relatively close to 90°, and therefore, it is inferred that the function of the 100 μm thick hexagonal system m-plane GaN substrate is equivalent to a ¼-wave plate.

Figure 4A:
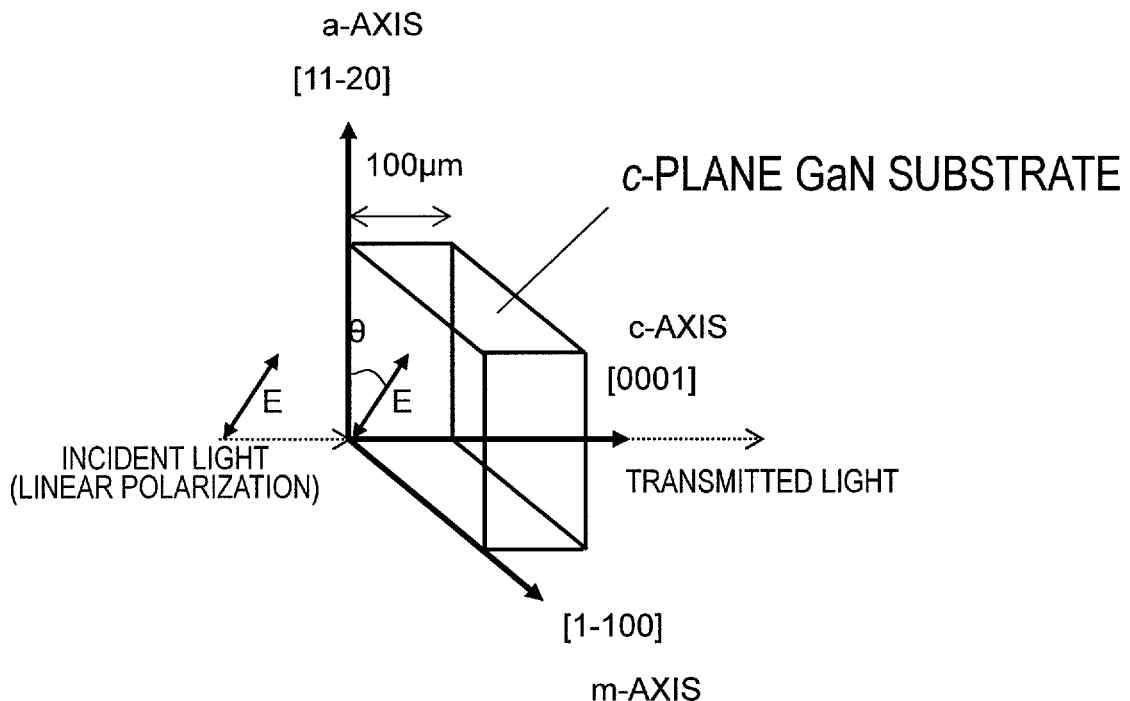
FIG. 4A is a diagram illustrating a method for evaluating the optical anisotropy of a c-plane GaN substrate.
Figure 4B:
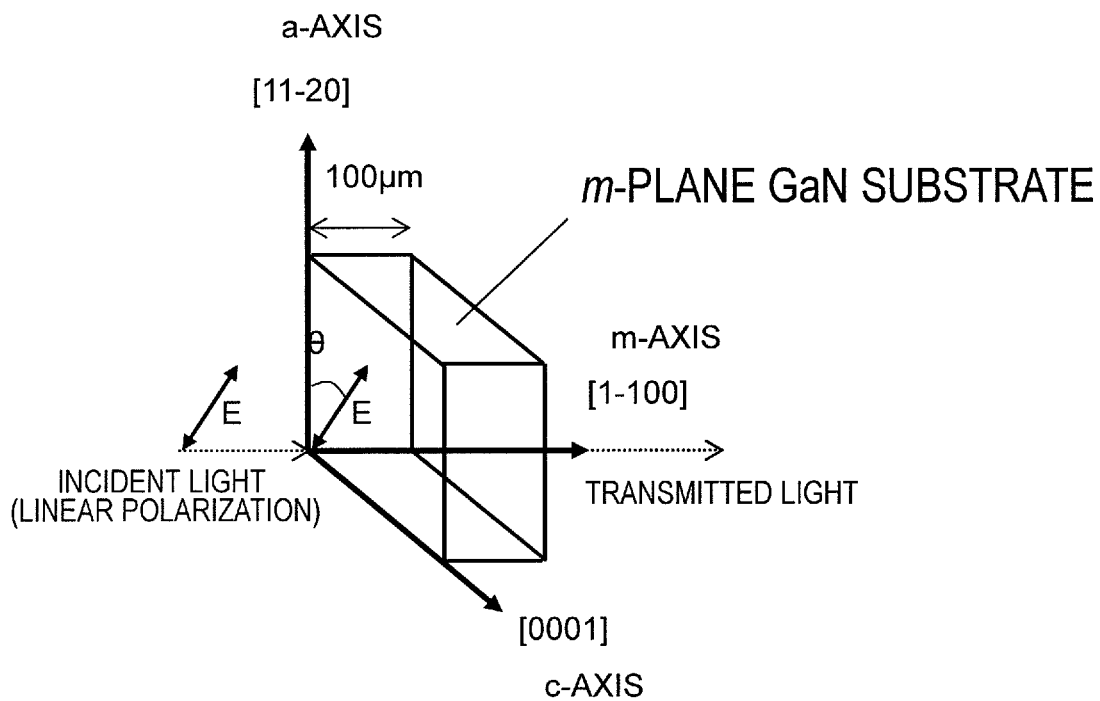
FIG. 4B is a diagram illustrating a method for evaluating the optical anisotropy of an m-plane GaN substrate.

FIG. 4A and FIG. 4B are diagrams for illustrating measurement methods. In the case of a 100 μm thick c-plane GaN substrate shown in FIG. 4A, linearly-polarized light having a wavelength of 450 nm was introduced to be incident on the substrate in the c-axis direction of the GaN in order to measure the polarization degree of transmitted light. In the case of a 100 μm thick m-plane GaN substrate shown in FIG. 4B, linearly-polarized light having a wavelength of 450 nm was introduced to be incident on the substrate in the m-axis direction of the GaN in order to measure the polarization degree of transmitted light. The angle θ that is formed between the polarization direction of the incident light and the a-axis of the GaN crystal was considered as the parameter. The reason why the polarization degree of transmitted light is measured herein is that, when a phase difference is caused due to the birefringence, the transmitted light is converted to elliptical polarization so that the polarization degree decreases as previously described.

Figure 5:
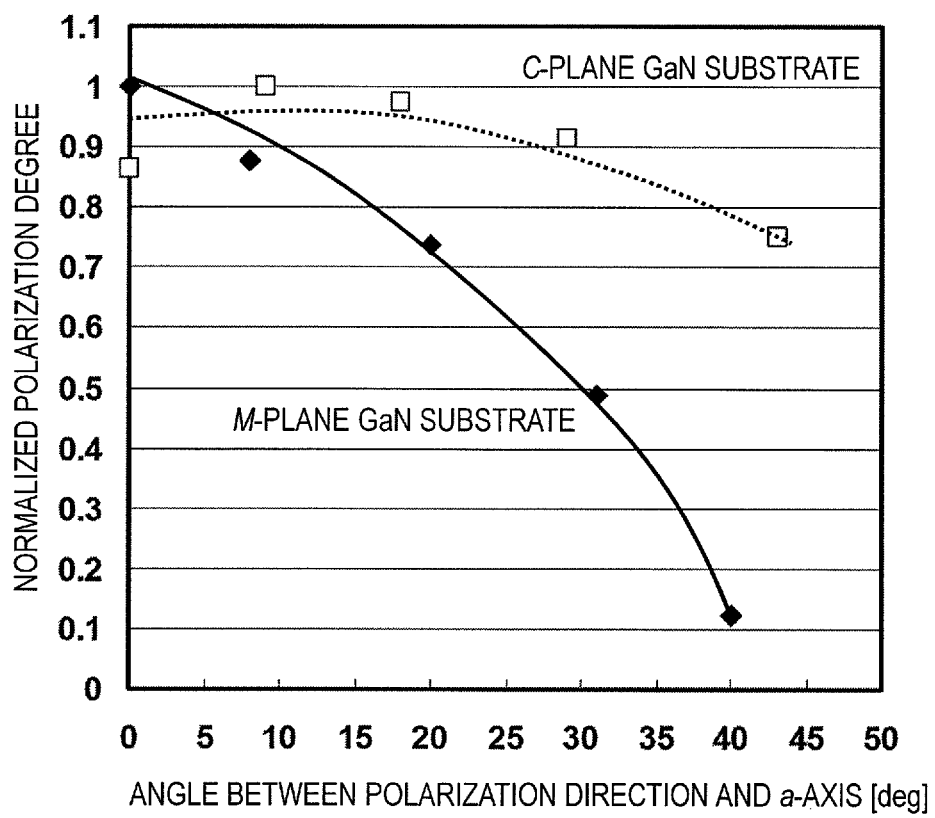
FIG. 5 is a graph showing the change of the normalized polarization degree with the angle which is formed between the polarization direction and the a-axis of the GaN being a parameter.

FIG. 5 is a graph showing measurement results of the polarization degree. In the graph, the vertical axis represents the normalized polarization degree, and the horizontal axis represents the angle (θ) which is formed between the polarization direction and the a-axis. In the graph, open boxes (□) represent the measurement results of the c-plane GaN substrate, and solid diamonds (♦) represent the measurement results of the m-plane GaN substrate. In the case of the c-plane GaN substrate, the polarization degree of the transmitted light is generally constant with respect to θ. Therefore, it is inferred that the optic axis of the GaN crystal is identical with the c-axis direction of the GaN. This is probably because the GaN is the hexagonal system and has a crystal structure which has six-fold rotational symmetry about the c-axis, so that the optical symmetry with respect to the c-axis direction is high. On the other hand, as seen from the results of the m-plane GaN substrate, the polarization degree decreases as θ increases, and the polarization degree reaches the minimum around 45°. From the above results, it is seen that the hexagonal system GaN crystal is a birefringent material, and the optic axis of the hexagonal system GaN crystal is the c-axis.

The present inventors examined the birefringence that the hexagonal system GaN crystal itself has and discovered that, by utilizing this birefringence, the polarization degree of a nitride-based semiconductor light-emitting device which includes a semiconductor multilayer structure of which principal surface is a non-polar plane or a semi-polar plane can be reduced.

Figure 6:
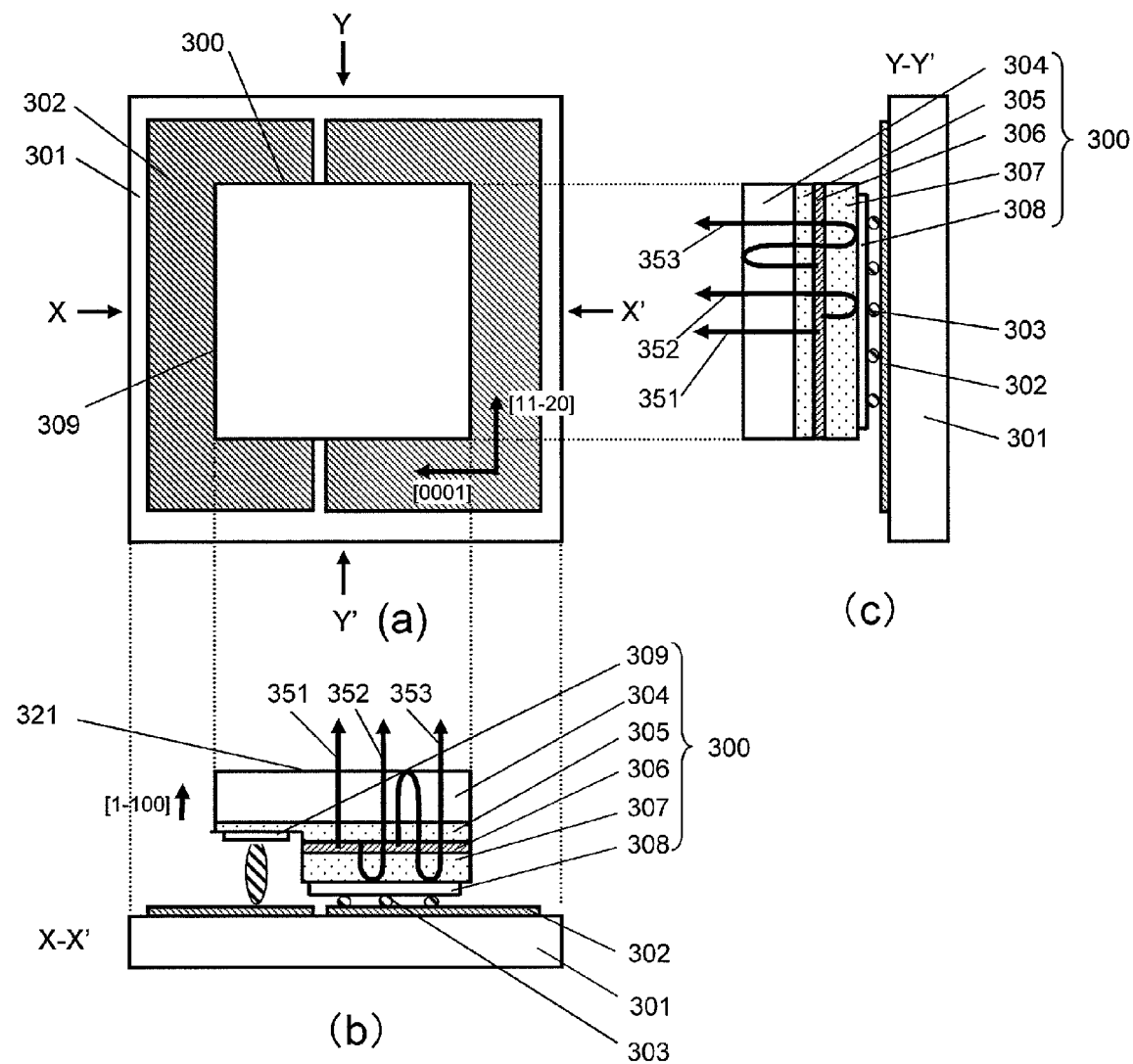
FIG. 6 is a diagram showing a configuration of a nitride-based semiconductor light-emitting device manufactured on an m-plane GaN substrate.

FIG. 6 shows the configuration of a nitride-based semiconductor light-emitting device of which principal surface is an m-plane (Reference Example). FIG. 6(a) is a top view showing the configuration of the nitride-based semiconductor light-emitting device of which principal surface is an m-plane. FIG. 6(b) shows a cross-sectional configuration diagram taken along line X-X' of FIG. 6(a). FIG. 6(c) shows a cross-sectional configuration diagram taken along line Y-Y' of FIG. 6(a).

In the example shown in FIG. 6, a nitride semiconductor light-emitting chip 300 is electrically connected to a wire 302 which is provided on a mounting base 301 via a bump 303. The nitride semiconductor light-emitting chip 300 includes an m-plane GaN substrate 304, a n-type nitride semiconductor layer 305 which is provided on the en-plane GaN substrate 304, a nitride semiconductor active layer 306, a p-type nitride semiconductor layer 307, a p-side electrode 308 which is provided so as to be in contact with the p-type nitride semiconductor layer 307, and a n-side electrode 309 which is provided so as to be in contact with the n-type nitride semiconductor layer 305.

Here, the nitride semiconductor refers to a GaN-based semiconductor and to, more specifically, an $Al_xIn_yGa_zN$ (x+y+z=1, x≥0, y≥0, z≥0) semiconductor. The nitride semiconductor active layer 306 is generally parallel to the m-plane and is configured to emit light of which electric field intensity is deviated in the a-axis direction (polarized light). Light which is emitted from the nitride semiconductor active layer 306 and extracted from a light extraction surface 321 to the outside is generally separated into three parts: specifically, the first emitted light 351, the second emitted light 352, and the third emitted light 353, which are shown in FIGS. 6(b) and 6(c).

The first emitted light 351 refers to light which passes through the n-type nitride semiconductor layer 305 and the m-plane GaN substrate 304 and is extracted from the light extraction surface 321. The ratio of the amount of light (light amount) which is extracted through this route to the total amount of light (total light amount) which is emitted from the nitride semiconductor active layer 306 is about 8.3% under the conditions that the refractive index of the m-plane GaN substrate 304 is 2.5 and the light extraction surface 321 of the m-plane GaN substrate 304 is air (refractive index: 1.0). This ratio increases by about 17.1% when the light extraction surface 321 of the m-plane GaN substrate 304 is covered with a material which has a refractive index of 1.4.

The second emitted light 352 refers to light which passes through the p-type nitride semiconductor layer 307 and is reflected by the p-side electrode 308 and thereafter passes through the p-type nitride semiconductor layer 307, the nitride semiconductor active layer 306, the n-type nitride semiconductor layer 305, and the m-plane GaN substrate 304 and is extracted from the light extraction surface 321. The ratio of the amount of light (light amount) which is extracted through this route to the total amount of light (total light amount) which is emitted from the nitride semiconductor active layer 306 is about 7.5% under the conditions that the reflectance of the p-side electrode 308 is 90%, the refractive index of the m-plane GaN substrate 304 is 2.5, and the light extraction surface 321 of the m-plane GaN substrate 304 is air (refractive index: 1.0). This ratio is about 15.4% when the light extraction surface 321 of the m-plane GaN substrate 304 is covered with a material which has a refractive index of 1.4.

The third emitted light 353 refers to light which is reflected a plurality of times between the light extraction surface 321 and the p-side electrode 308 and thereafter extracted from the light extraction surface 321 to the outside. For the sake of simplicity, the drawings show an example where the light is reflected once by the light extraction surface 321 and then reflected once by the p-side electrode 308. The amount of light which is extracted as the first emitted light 351 and the second emitted light 352 is about 30% of the total amount of light emitted from the nitride semiconductor active layer 306. Therefore, the remaining part, i.e., 70% of the total light amount, is reflected a plurality of times (about 10 to 15 times) between the light extraction surface 321 and the p-side electrode 308 and extracted to the outside as illustrated by the route of the third emitted light 353, or is otherwise absorbed inside the nitride semiconductor light-emitting chip 300.

The first emitted light 351, the second emitted light 352, and the third emitted light 353 each pass through the m-plane GaN substrate 304 that has a birefringence and is extracted from the light extraction surface 321 to the outside. Considering the first emitted light 351, the first emitted light 351 passes through the nitride semiconductor and is extracted to the outside with its polarization being maintained, because the polarized light emitted from the nitride semiconductor active layer 306 is polarized in the a-axis direction and its polarization direction is inclined by 90° with respect to the optic axis of the nitride semiconductor (the c-axis). Considering the second emitted light 352, the polarized light emitted from the nitride semiconductor active layer 306 is reflected by the p-side electrode 308 with its polarization direction being maintained. As a result, the second emitted light 352 passes through the nitride semiconductor with its polarization direction being inclined by 90° with respect to the optic axis of the nitride semiconductor (the c-axis). Therefore, the light is extracted to the outside with its polarization being maintained. Considering the third emitted light 353, the polarized light emitted from the nitride semiconductor active layer 306 is reflected by the light extraction surface 321 and the p-side electrode 308 with its polarization direction being maintained. As a result, the third emitted light 353 passes through the nitride semiconductor with its polarization direction being inclined by 90° with respect to the optic axis of the nitride semiconductor (the c-axis). Therefore, the light is extracted to the outside with its polarization being maintained. That is, in the above-described configuration, the polarization is maintained even though the nitride-based semiconductor light-emitting device has birefringence.

Figure 7:
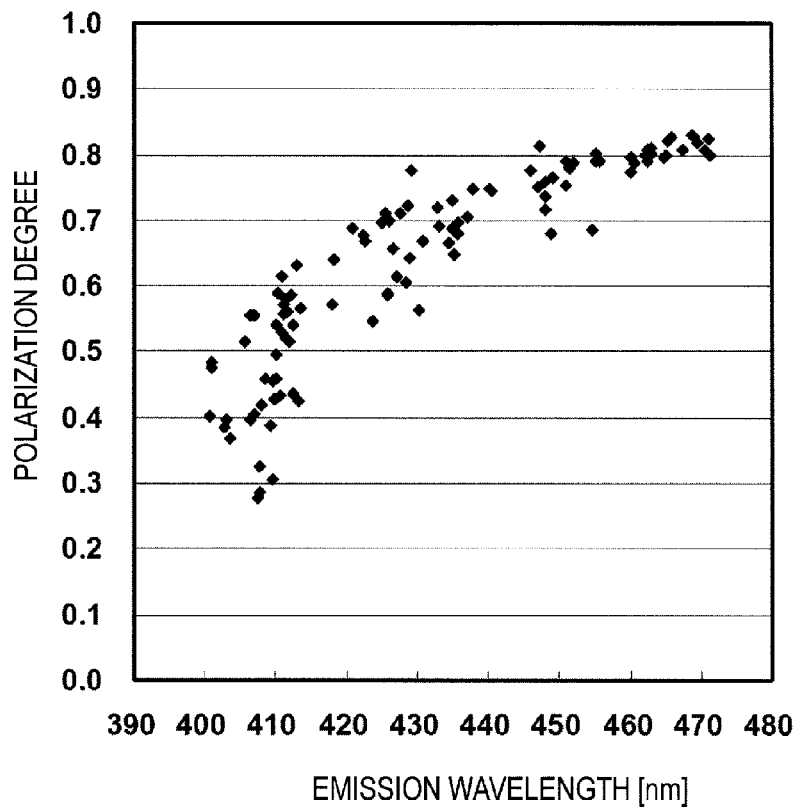
FIG. 7 is a graph showing the relationship between the emission wavelength and the polarization degree of the nitride-based semiconductor light-emitting device manufactured on the m-plane GaN substrate.

FIG. 7 is a graph showing the relationship between the emission wavelength and the measurement results of the polarization degree for the nitride-based semiconductor light-emitting device shown in FIG. 6 that includes the active layer formed on the m-plane. The nitride semiconductor active layer 306 was made of InGaN with the composition of In being varied in order to control the emission wavelength. As seen from FIG. 7, the configuration of FIG. 6 exhibited the polarization degree of about 0.3 to 0.8 depending on the emission wavelength.

Figure 8:
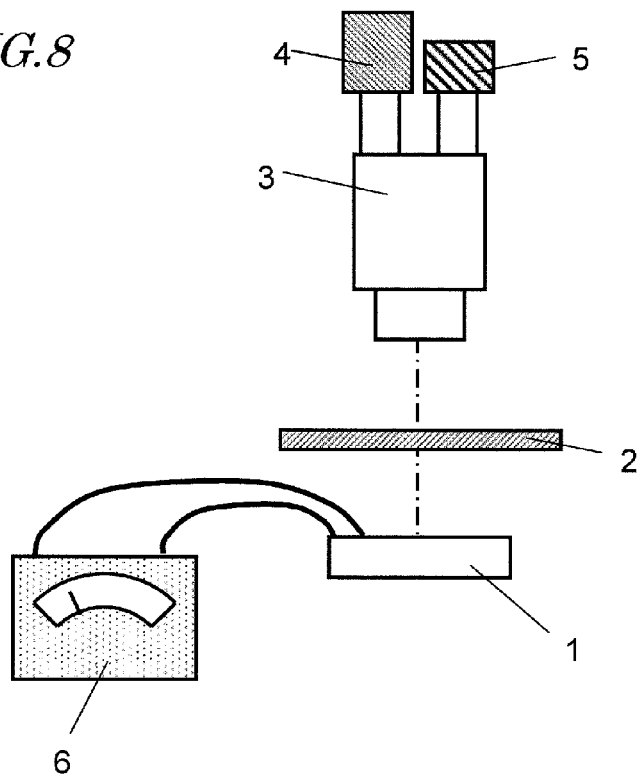
FIG. 8 is a diagram showing a measurement system for the polarization degree.

The above measurement of the polarization degree was carried out using the optical system shown in FIG. 8. Specifically, a LED 1 that has the configuration of FIG. 6 is powered by a power supply 6 to emit light. The emission of the LED 1 was checked using a stereoscopic microscope 3. The stereoscopic microscope 3 had two ports. A silicon photodetector 4 was attached to one of the ports, and a CCD camera was attached to the other. A polarizing plate 2 was provided between the stereoscopic microscope 3 and the LED 1. While the polarizing plate 2 is rotated, the maximum value and the minimum value of the emission intensity were measured using the silicon photodetector 4.

A nitride semiconductor light-emitting device of an embodiment of the present disclosure has a novel configuration which is capable of reducing the polarization degree due to the birefringent property of the nitride semiconductor when light which is reflected by an electrode, such as the p-side electrode 308 shown in FIG. 6, for example, passes through the nitride semiconductor. By decreasing the polarization degree, a light source can be obtained which is capable of emitting illumination light which is excellent in terms of the appearance of an object.

When a light-emitting device which has a polarization characteristic is used as a light source, the amount of reflection at an object surface varies depending on the orientation of the polarization, i.e., the installation orientation of the LED. Therefore, when illumination light is polarized light, a problem occurs that the appearance of the object varies. This is because the P-polarized light and the S-polarized light exhibit different reflectances (the S-polarization has higher reflectance at the object surface). Here, the P-polarized light refers to light which has an electric field component that is parallel to the incidence plane. The S-polarized light refers to light which has an electric field component that is perpendicular to the incidence plane. Thus, in common lighting applications, the polarization characteristic is a troublesome factor.

There are uses in which polarized light from a nitride semiconductor light-emitting device is positively utilized. Japanese Laid-Open Patent Publication No. 2008-305971 discloses a nitride-based semiconductor light-emitting device which is applied to such uses. Thus, in the nitride semiconductor light-emitting device of Japanese Laid-Open Patent Publication No. 2008-305971, in order to maintain the polarization characteristics, recesses and elevations which are in a striped pattern extending in a direction perpendicular to the polarization direction are provided across the light extraction surface.

A nitride-based semiconductor light-emitting device according to an embodiment of the present disclosure is a nitride-based semiconductor light-emitting device which has a light extraction surface. The nitride-based semiconductor light-emitting device includes a semiconductor multilayer structure including an active layer which is made of a nitride semiconductor of which principal surface is a semi-polar plane or a non-polar plane, and an electrode which is configured to reflect at least part of light emitted from the active layer in a direction toward the light extraction surface. The nitride-based semiconductor light-emitting device further includes a birefringent substrate provided between the light extraction surface and the electrode. The birefringent substrate is configured to transmit light emitted from the active layer and light reflected by the electrode. The nitride-based semiconductor light-emitting device according to an embodiment of the present disclosure further includes a recessed/elevated surface provided between the active layer and the electrode. This recessed/elevated surface has the function of changing the polarization direction of light emitted from the active layer. Polarized light which has a polarization direction changed by the recessed/elevated surface decreases its polarization degree due to the birefringence of the substrate before the light outgoes from the light extraction surface to the outside of the device.

A nitride-based semiconductor light-emitting device according to an embodiment of the present disclosure can be in either the "face-down" or "face-up" configuration when mounted to the mounting base. When it is mounted in the face-down configuration, a semiconductor multilayer structure which includes an active layer resides between the birefringent substrate and the mounting base. On the other hand, when it is mounted in the face-down configuration, the birefringent substrate resides between the semiconductor multilayer structure which includes the active layer and the mounting base 301. Hereinafter, an embodiment in which the nitride-based semiconductor light-emitting device is mounted in the "face-down" configuration is mainly described, although the mounting configuration in an embodiment of the present disclosure is not limited to the "face-down" configuration.

Embodiment 1

The first embodiment of the nitride-based semiconductor light-emitting device of the present disclosure is described with reference to FIG. 9.

Firstly, refer to FIGS. 9(a) to 9(c). FIG. 9(a) is a top view schematically showing a nitride-based semiconductor light-emitting device of an embodiment of the present disclosure. FIG. 9(b) is a cross-sectional view taken along line X-X' of FIG. 9(a). FIG. 9(c) is a cross-sectional view taken along line Y-Y' of FIG. 9(a).

A light-emitting device which includes the nitride semiconductor light-emitting chip 300 of the present embodiment has a flip-chip configuration. The nitride semiconductor light-emitting chip 300 is electrically connected to a wire 302 which is provided on a mounting base 301 via a bump 303.

The nitride semiconductor light-emitting chip 300 includes, for example, a substrate 304 which includes an en-plane GaN layer and a semiconductor multilayer structure which is provided on the m-plane GaN substrate. This semiconductor multilayer structure includes a n-type nitride semiconductor layer 305, a nitride semiconductor active layer 306 which is provided on the n-type nitride semiconductor layer 305, and a p-type nitride semiconductor layer 307 which is provided on the nitride semiconductor active layer 306. The nitride semiconductor light-emitting chip 300 further includes a p-side electrode 308 which is in contact with the p-type nitride semiconductor layer 307 and a n-side electrode 309 which is in contact with the n-type nitride semiconductor layer 305. A voltage is applied between the p-side electrode 308 and the n-side electrode 309 such that an electric current flows, whereby the charges (electrons and holes) can be injected into the active layer 306. The electrons and holes injected into the active layer 306 are combined so that light is produced. Part of this light is emitted from the active layer 306 and outgoes to the outside of the device through the light extraction surface as will be described later. In this process, part of the light is reflected by the p-side electrode 308.

The substrate 304 may be formed by only the m-plane GaN layer or may be formed by the m-plane GaN layer and another layer (e.g., sapphire layer, SiC layer). When the substrate 304 includes the m-plane GaN layer and another layer, the m-plane GaN layer may be provided on, for example, the principal surface side of the substrate 304 (i.e., a side of the substrate 304 at which the nitride semiconductor layer grows). That is, the principal surface of the m-plane GaN layer may be the principal surface of the substrate 304. Alternatively, any other type of non-polar plane GaN layer or semi-polar plane GaN layer may be used instead of the m-plane GaN layer. Still alternatively, any other type of nitride semiconductor layer may be used instead of the GaN layer. Here, the nitride semiconductor refers to a GaN-based semiconductor and to, more specifically, an $Al_xIn_yGa_zN$ (x+y+z=1, z≥0, y≥0, z≥0) semiconductor.

The order of stacking of the n-type nitride semiconductor layer 305, the nitride semiconductor active layer 306, and the p-type nitride semiconductor layer 307 may be reversed. That is, the p-type nitride semiconductor layer 307, the nitride semiconductor active layer 306, and the n-type nitride semiconductor layer 30 may be sequentially formed in this order from the substrate 304 side. The semiconductor multilayer structure that includes the p-type nitride semiconductor layer 307 and the n-type nitride semiconductor layer 30 may further include a non-doped layer that does not contain an impurity. The nitride semiconductor active layer 306 is generally parallel to the m-plane and is configured to emit light of which electric field intensity is deviated in the a-axis direction (polarized light).

Figure 9:
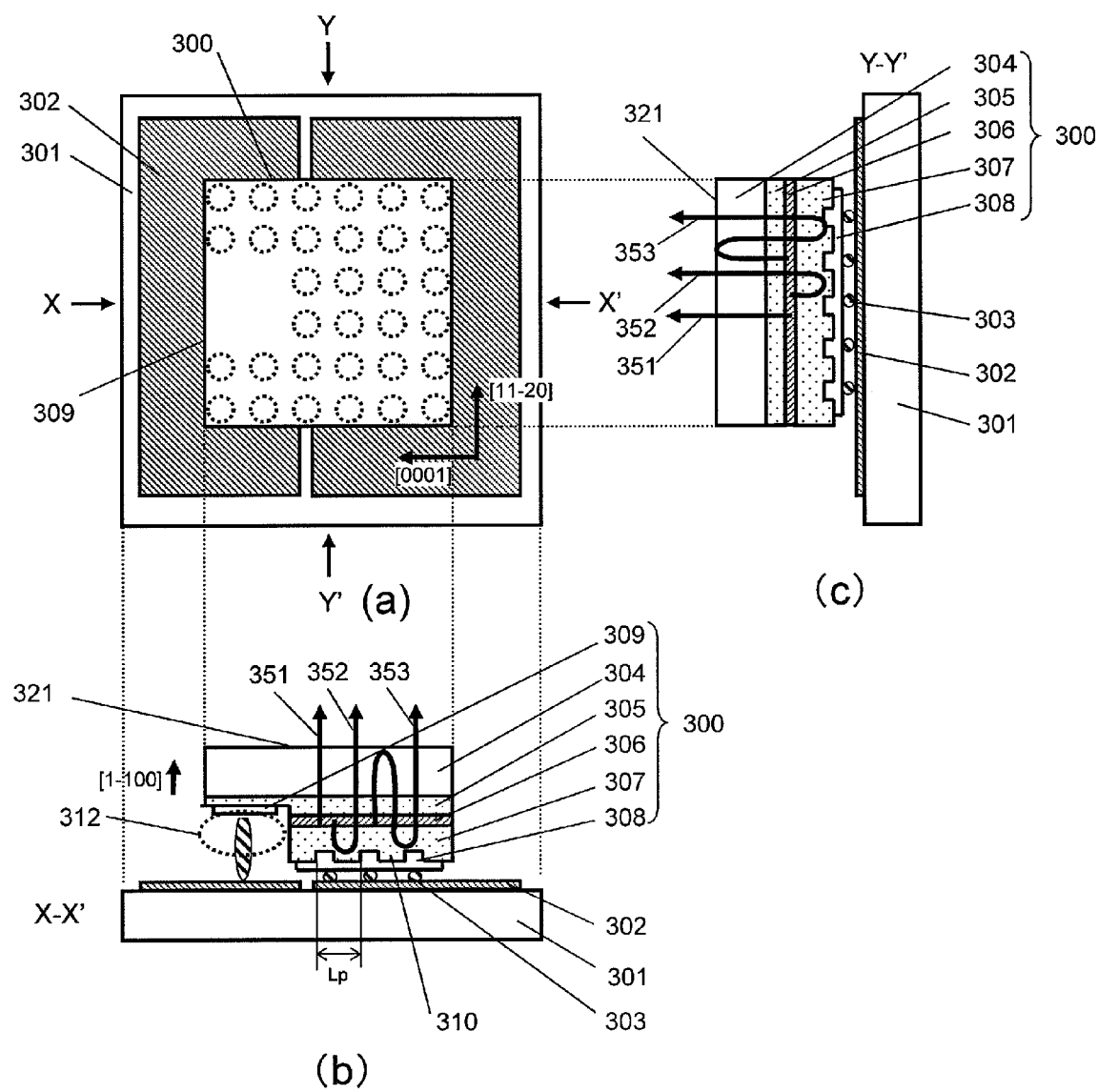
FIG. 9 shows a configuration of illustrative Embodiment 1 where a nitride semiconductor chip in which the recessed/elevated surfaces 310 having the shape of a circular pillar is flip-chip mounted.
Figure 10:
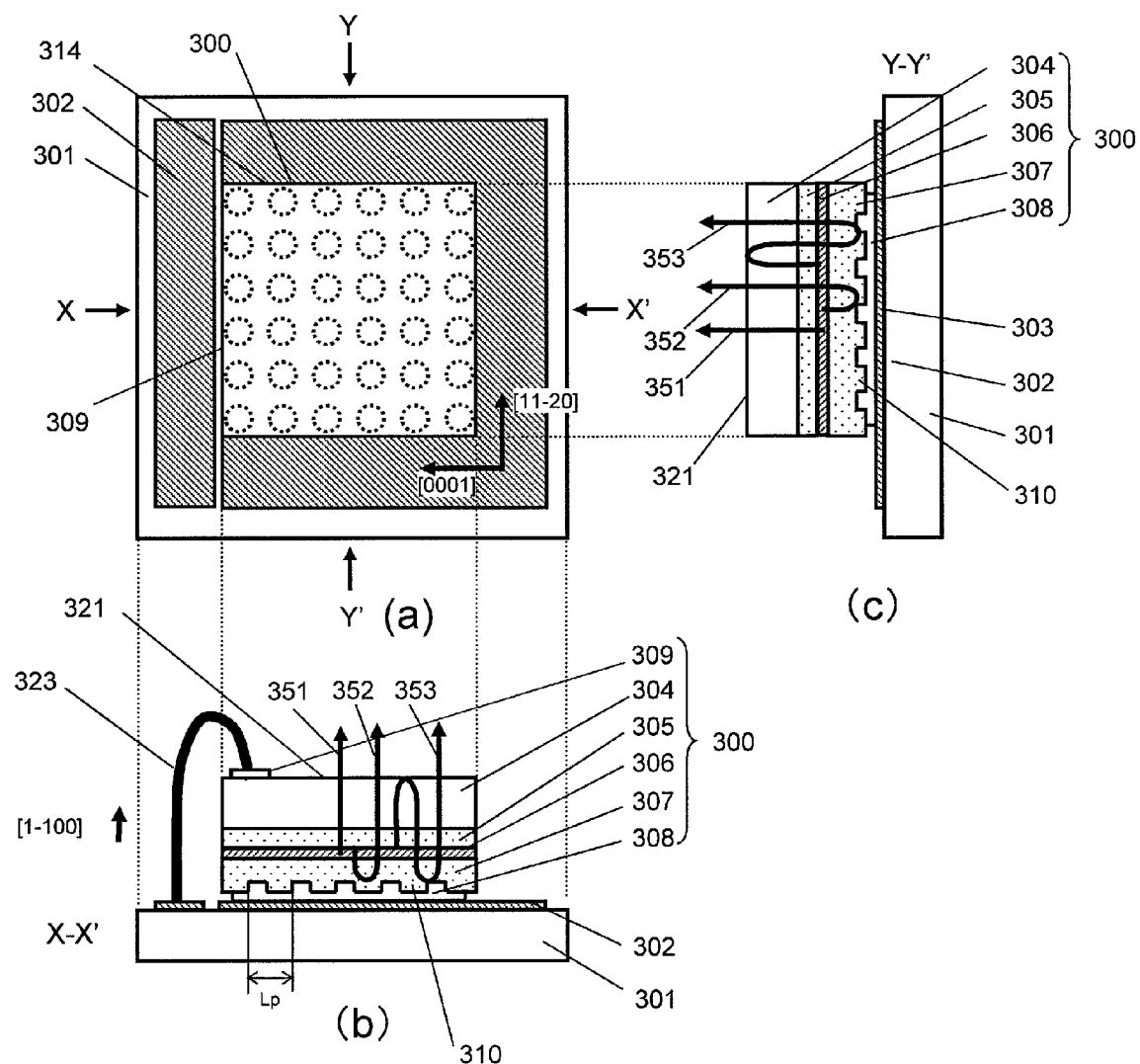
FIG. 10 shows a configuration of illustrative Embodiment 1 where a nitride semiconductor chip in which the recessed/elevated surfaces 310 having the shape of a circular pillar is mounted by wire bonding.

As shown in FIG. 10, the nitride semiconductor light-emitting chip 300 may be connected to the mounting base 301 by wire bonding. In the example of FIG. 10, the n-side electrode 309 is provided on a surface of the substrate 304 which is opposite to the principal surface (i.e., on the light extraction surface 321). The p-side electrode 308 is electrically connected to the wire 302 which is provided on the mounting base 301. The n-side electrode 309 is electrically connected to the wire 302 which is provided on the mounting base 301 using an Au wire 322. The flip-chip configuration and the wire bonding configuration are different in mode of coupling of the p-side electrode 308 and the n-side electrode 309 to the wire 302 that is provided on the mounting base 301. However, the other components of the flip-chip configuration and the wire bonding configuration are the same or similar so that the functions and effects of the present embodiment are achieved likewise. Hereinafter, Embodiment 1 of the disclosure of the present application is described for the case of the flip-chip configuration with reference to FIG. 9, while the description of the wire bonding configuration is omitted.

In this specification, "m-plane", "a-plane", "r-plane", "−r plane", and "non-polar plane" include not only planes which are perfectly parallel to the m-plane, a-plane, r-plane, −r plane, and non-polar plane but also planes which are inclined by an angle of ±5° or less with respect to the m-plane, a-plane, r-plane, −r plane, and non-polar plane. With just a slight incline with respect to the m-plane, a-plane, r-plane, −r plane, and non-polar plane, the effect and variation of the spontaneous electrical polarization are very small. Therefore, it is considered that planes which are inclined by an angle of ±5° or less with respect to the m-plane, a-plane, r-plane, −r plane, and non-polar plane have generally the same characteristics as the m-plane, a-plane, r-plane, −r plane, and non-polar plane. On the other hand, according to the crystal growth technology, epitaxial growth of a semiconductor layer is sometimes easier on a substrate in which the crystal orientation is slightly inclined rather than on a substrate in which the crystal orientation is strictly identical. Thus, in some cases, it may be preferred to incline the crystal plane for the purpose of improving the quality of a semiconductor layer which is to be epitaxially grown or increasing the crystal growth rate, while the effect of the spontaneous electrical polarization is sufficiently decreased.

The substrate 304 of the present embodiment may be a birefringent substrate that has birefringence. The optic axis of the substrate 304 forms an angle which is not 0° with respect to the normal direction of the light extraction surface 321. This means that the light extraction surface 321 of the substrate 304 of the present embodiment is a surface which is inclined with respect to the c-plane of the substrate 304 and corresponds to an inclination of the c-axis (optic axis) of the substrate 304 with respect to the normal direction of the light extraction surface 321. The optic axis of the substrate 304 may be inclined by 90° with respect to the normal direction of the light extraction surface 321. When the principal surface and the rear surface of the substrate 304 are m-plane surfaces, the optic axis of the substrate 304 is inclined by 90° with respect to the normal direction of the light extraction surface 321.

The substrate 304 is selected such that the light emitted from the nitride semiconductor active layer 306 is light of which electric field intensity is deviated in the in-layer direction (in-plane direction) of the nitride semiconductor active layer 306. The substrate 304 which satisfies such a condition may be either of a hexagonal system m-plane GaN substrate, a hexagonal system a-plane GaN substrate, or a hexagonal system −r plane GaN substrate. The substrate 304 may be a hexagonal system m-plane SiC substrate which includes an m-plane GaN layer at its surface. The substrate 304 may be an r-plane sapphire substrate which includes an a-plane GaN layer. The substrate 304 may be an m-plane sapphire substrate or a-plane sapphire substrate which includes an m-plane GaN layer.

In one embodiment, the thickness of the substrate 304 may be set such that the substrate 304 functions as a ¼-wave plate. Specifically, the retardation 5 may be set so as to satisfy the following formula:

[Expression 5]

$$\delta = \Delta n \cdot d \cdot \frac{360}{\lambda} = 90 \cdot (2 \cdot a - 1)[\deg] \quad \text{(Formula 4)}$$

where d is the thickness of the substrate 304, Δn is the birefringence for the thickness direction of the substrate 304, X is the emission wavelength of the nitride semiconductor active layer 306, and a is a natural number.

In an actual light-emitting device, the retardation for the thickness direction of the substrate 304 does not need to be perfectly equal to ¼ wavelength (90°). Even when the retardation has a deviation of about ±⅛ wavelength) (45° from ¼ wavelength (90°) that is assumed as the center value, the effects of the present application can be achieved. Thus, the retardation may be set so as to satisfy the following formula:

[Expression 6]

$$90 \cdot (2 \cdot a - 1) - 45 \leq \Delta n \cdot d \cdot \frac{360}{\lambda} \leq 90 \cdot (2 \cdot a - 1) + 45 \quad \text{(Formula 5)}$$

When the emission wavelength has a broad extent, the wavelength λ may be a value of its peak wavelength or the center value of the broad extent.

More specifically, when Δn is 0.00128 and the emission wavelength is 450 nm, the setpoint of the thickness d of the m-plane GaN substrate may be set so as to satisfy the following formula:

[Expression 7]

$$44 \cdot (4 \cdot a - 3) \leq d[\mu m] 44 \cdot (4 \cdot a - 1) \quad \text{(Formula 6)}$$

As previously described, the substrate 304 does not need to be entirely made of a nitride semiconductor. The important aspect is that the substrate 304 is configured such that the retardation satisfies the relationship of Formula 5 in the route of light emitted from the active layer which propagates inside the nitride semiconductor and goes out of the light-emitting device.

The n-type nitride semiconductor layer 305 is made of, for example, n-type $Al_uGa_vIn_wN$ (u+v+w=1, u≥0, v≥0, w≥0). The n-type dopant used may be, for example, silicon (Si).

The nitride semiconductor active layer 306 has a GaInN/GaInN multi-quantum well (MQW) structure in which, for example, $Ga_{1-x}In_xN$ well layers, each having a thickness of about 3 to 20 nm, and $Ga_{1-y}In_yIN$ well layers (0≤y≤x<1) barrier layers, each having a thickness of about 5 to 30 nm, are alternately stacked one upon each other. The wavelength of light emitted from the nitride semiconductor light-emitting chip 300 depends on the composition of In, x, in the $Ga_{1-x}In_xN$ semiconductor that is the semiconductor composition of the above-described well layers. A piezoelectric field would not be generated in the nitride semiconductor active layer 306 formed on the m-plane. Therefore, decrease of the luminous efficacy can be prevented even when the In composition is increased.

The plane orientation of the nitride semiconductor active layer 306 is not limited to the m-plane but only needs to be a non-polar plane or a semi-polar plane. An example of the non-polar plane other than the m-plane is a-plane. Examples of the semi-polar plane include −r plane and (11-22) plane. As previously described, a nitride semiconductor active layer formed on the m-plane mainly emits light of which electric field intensity is deviated in a direction parallel to the a-axis. A nitride semiconductor active layer formed on the a-plane mainly emits light of which electric field intensity is deviated in a direction parallel to the m-axis. A nitride semiconductor active layer formed on the (11-22) plane, which is a semi-polar plane, mainly emits light of which electric field intensity is deviated in a direction parallel to the m-axis when the composition of In in the nitride semiconductor active layer is small but mainly emits light of which electric field intensity is deviated in a direction parallel to the [−1-123] direction when the composition of In in the nitride semiconductor active layer is large. The polarization characteristic of the nitride semiconductor active layer 306 provided on such a semi-polar plane depends on the behaviors of the upper two of the valence bands (A band and B band) and varies according to the amount of strain imposed on the nitride semiconductor active layer 306 or the quantum confinement effect in some cases.

The p-type nitride semiconductor layer 307 is made of, for example, a p-type $Al_sGa_tN$ (s+t=1, s≥0, t≥0) semiconductor. As the p-type dopant, for example, Mg is added. Examples of the p-type dopant other than Mg include Zn and Be. In the p-type nitride semiconductor layer 307, the composition of Al, s, may be uniform along the thickness direction. Alternatively, the Al composition s may vary either continuously or stepwise along the thickness direction. Specifically, the thickness of the p-type nitride semiconductor layer 307 is, for example, about 0.05 to 2 μm. Part of the p-type nitride semiconductor layer 307 near the upper surface, i.e., near the interface with the p-side electrode 308, may be made of a semiconductor of which Al composition s is zero, i.e., GaN. Also, in this case, the GaN contains a p-type impurity having high concentration and may function as a contact layer.

The surface of the p-type nitride semiconductor layer 307 has a plurality of recessed portions or elevated portions or a plurality of recessed portions and elevated portions. In this specification, formation of recessed portions and/or elevated portions in a flat surface is simply referred to as "formation of a recessed/elevated surface 310". This recessed/elevated surface 310 has surface roughness which is capable of changing the polarization of light which is transmitted through or reflected by the surface. The range of the surface roughness is not excessively small and not excessively large as compared with the wavelength λ. The difference between the highest point and the lowest point of the surface may be set within the range of not less than λ/2 and not more than 100·λ, for example. In this specification, the surface of the nitride semiconductor layer which has such recesses and elevations can be called "patterned surface" or "textured surface".

In the examples shown in FIG. 9 and FIG. 10, a plurality of recessed/elevated surfaces 310 which are provided in the surface of the p-type nitride semiconductor layer 307 are formed by elevated portions which have the shape of a circular pillar. When polarized light emitted from the nitride semiconductor active layer 306 is reflected by the p-side electrode 308, the orientation of the polarization of the light is changed by the plurality of recessed/elevated surfaces 310 that are provided in the surface of the p-type nitride semiconductor layer 307. As a result, the polarization degree of the entire emitted light 351 to 353 is reduced. When the polarization direction of reflected light has an angle which does not include 0° or 90° with respect to the optic axis of the substrate 304, the reflected light is converted to elliptical polarization or circular polarization during passage through the substrate 304. Therefore, the polarization degree of light which is extracted from the light extraction surface 321 decreases. Such conversion to elliptical polarization or circular polarization largely occurs particularly when the configuration of the nitride semiconductor satisfies Formula 4.

The p-side electrode 308 may generally cover the entire surface of the p-type nitride semiconductor layer 307. The p-side electrode 308 may have a multilayer structure of a Pd layer and a Pt layer (Pd/Pt). Alternatively, to increase the reflectance, the p-side electrode 308 may be formed using a multilayer structure of a Ag layer and a Pt layer (Ag/Pt) or a multilayer structure of a Pd layer, a Ag layer, and a Pt layer (Pd/Ag/Pt).

The n-side electrode 309 has, for example, a multilayer structure of a Ti layer and a Pt layer (Ti/Pt). To increase the reflectance, a multilayer structure of a Ti layer, an Al layer, and a Pt layer (Ti/Al/Pt) may be used.

In the examples shown in FIG. 9 and FIG. 10, elevated portions in the shape of a circular pillar which form the recessed/elevated surfaces 310 are two-dimensionally arranged with equal intervals. The elevated portions that form the recessed/elevated surfaces 310 may be randomly and two-dimensionally arranged so long as the interval between the centers of adjoining elevated portions, Lp, is not more than 40 μm. Also, Lp may be not less than 180 nm. When the elevated portions that form the recessed/elevated surfaces 310 are excessively small as compared with the wavelength of light, the light is less likely to be affected by the recessed/elevated surfaces 310. The difference in height of the recessed/elevated surfaces 310, i.e., the depth of the recessed portions or the height of the elevated portions, may be about 0.05 μm to 2 μm. When the recessed/elevated surfaces 310 are formed by forming a plurality of recessed portions in the surface of the p-type nitride semiconductor layer 307, the depth of the recessed portions may be smaller than the thickness of the p-type nitride semiconductor layer 307. However, when there is another layer interposed between the p-type nitride semiconductor layer 307 and the active layer 306, the recessed portions of the recessed/elevated surfaces 310 may have a depth so that they can penetrate through the p-type nitride semiconductor layer 307.

The plurality of recessed/elevated surfaces 310 that are provided in the surface of the p-type nitride semiconductor layer 307 may have various shapes. In the examples which will be described below, the shape of the basic elements which form the recessed/elevated surfaces 310 is classified into dot shapes (FIG. 11 to FIG. 17) and stripe shapes (FIG. 18 to FIG. 21). Hereinafter, the shape of the recessed/elevated surfaces 310 will be described with reference to FIG. 11 to FIG. 21. In FIG. 11 to FIG. 21, the illustration is focused on the nitride semiconductor chip, while the mounting base 301, the wire 302, the bump 303, the Au wire 322, etc., are not shown. Part (a) of each of the drawings is a top view of a nitride semiconductor chip. Part (b) is a cross-sectional view taken along line b-b' of the top view. Part (a) shows the top surface at line a-a' of the cross-sectional view (b).

<Dot Shapes (FIG. 11 to FIG. 17)>

Figure 22:
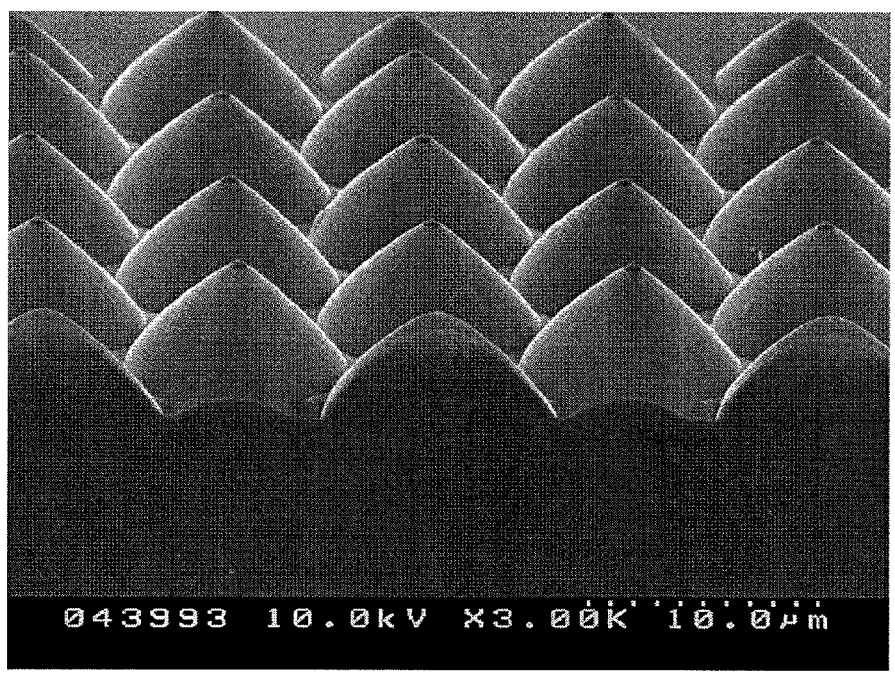
FIG. 22 is a SEM image of a plurality of conical structures formed on an m-plane GaN substrate, which have a diameter of 10 μm.

Recessed/elevated surfaces 310 which have a dot shape do not function to change the polarization direction to a specific direction but function to scatter light on the occasion of reflection. FIG. 22 is a SEM image of recessed/elevated surfaces 310 which were formed by a plurality of elevated portions in the surface of an m-plane GaN substrate, each of the elevated portions having an approximately-conical shape having a diameter of 8 μm and a height of 5 μm. For the sake of comparison, an m-plane GaN substrate having a flat surface, in which the recessed/elevated surfaces 310 were not provided, was prepared. In either sample, the thickness of the substrate was 100 μm. For these two types of samples, the linear reflectance and the linear transmittance were measured using a spectrophotometer (UV-VIS) manufactured by JASCO Corporation. In the m-plane GaN substrate having a flat surface, the reflectance was 18.4%, and the transmittance was 69.5%. The reflectance of 18.4% accords well with a reflectance which is calculated from the refractive index of the GaN. On the other hand, in the m-plane GaN substrate which was provided with the recessed/elevated surfaces 310, the reflectance was 14.0%, and the transmittance was 54.0%. These values were smaller than those of the m-plane GaN substrate having a flat surface. This is probably because light was scattered by the recessed/elevated surfaces 310 provided in the surface of the m-plane GaN substrate, and the scattered light deviated from the optic axis of the measurement, resulting in small values. Thus, as described herein, the dot shape has the property of scattering light.

Figure 11:
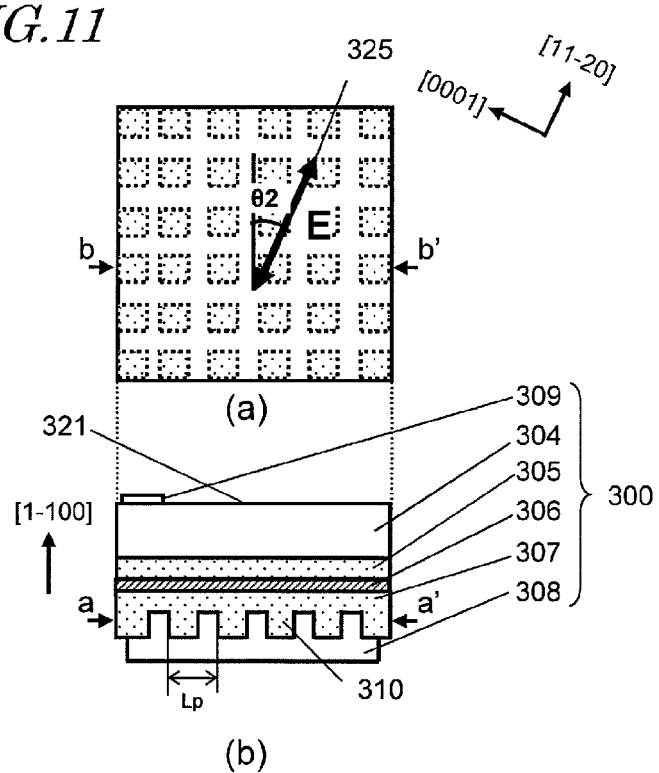
FIG. 11 shows a configuration of illustrative Embodiment 1 where the recessed/elevated surfaces 310 have the shape of a quadrangular pillar.

FIG. 11 shows an example where the elevated portions that form the recessed/elevated surfaces 310 have the shape of a quadrangular pillar. As shown in FIG. 11(a) that is the top view, the angle which is formed between a side of the quadrangle of the elevated portions that form the recessed/elevated surfaces 310 and the polarization direction 325 of the nitride semiconductor active layer 306, η2, is suitably set within the range from 30° to 60°, more suitably from 40° to 50°. By arranging the elevated portions that form the recessed/elevated surfaces 310 such that their lateral surfaces intersect with the polarization direction 325, light is more likely to be scattered. When the elevated portions that form the recessed/elevated surfaces 310 shown in FIG. 9 and FIG. 10 have the shape of a circular pillar, it is not necessary to consider the orientation of the polarization direction 325.

Figure 12:
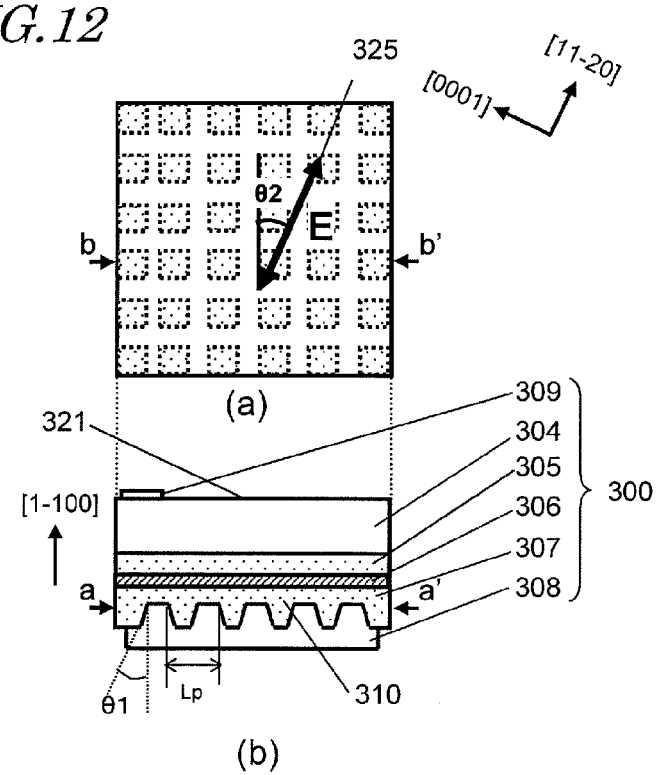
FIG. 12 shows a configuration of illustrative Embodiment 1 where the recessed/elevated surfaces 310 have a quadrangular shape in a top view and have a trapezoidal shape in a cross-sectional view.

FIG. 12 shows an example where the recessed/elevated surfaces 310 have a quadrangular shape in a top view and have a trapezoidal shape in a cross-sectional view. In the top view, the angle which is formed between a side of the quadrangle formed by the recessed/elevated surfaces 310 and the polarization direction 325 of the nitride semiconductor active layer 306, η2, is suitably set within the range from 30° to 60°, more suitably from 40° to 50°. In the cross-sectional view, the angle which is formed between the lateral surface of the elevated portions that form the recessed/elevated surfaces 310 and the normal direction of the principal surface, θ1, is suitably set within the range from 10° to 58°, more suitably from 20° to 48°. When the lateral surface of the recessed/elevated surfaces 310 is thus inclined with respect to the principal surface, light which is incident on this inclined surface (slope surface) includes the s-polarization component and the p-polarization component. As a result, a relative phase difference occurs between the s-polarization component and the p-polarization component on the occasion of reflection, so that the polarization direction is further inclined.

Figure 13:
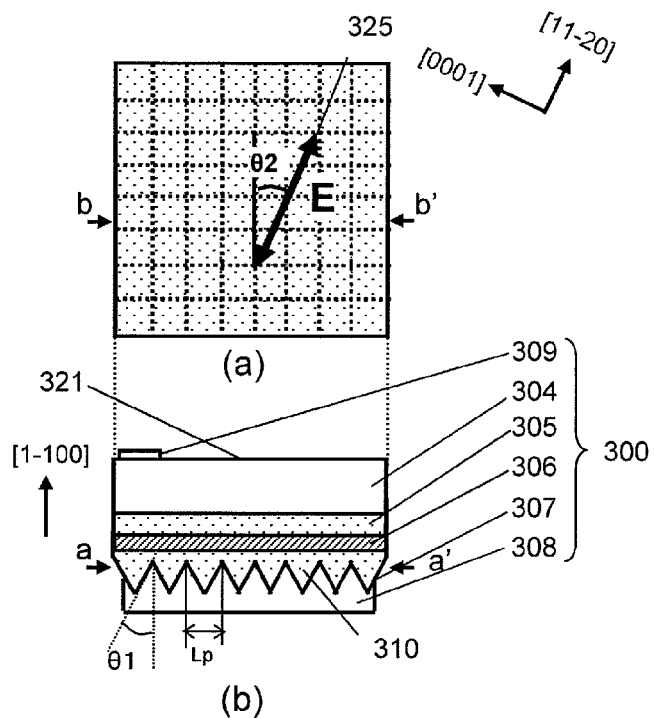
FIG. 13 shows a configuration of illustrative Embodiment 1 where the recessed/elevated surfaces 310 have the shape of a quadrangular pyramid.

FIG. 13 shows an example where the elevated portions that form the recessed/elevated surfaces 310 have the shape of a quadrangular pyramid. In the top view, the angle which is formed between a side of the quadrangle formed by the recessed/elevated surfaces 310 and the polarization direction 325 of the nitride semiconductor active layer 306, θ2, is suitably set within the range from 30° to 60°, more suitably from 40° to 50°. In the cross-sectional view, the angle which is formed between the lateral surface of the elevated portions that form the recessed/elevated surfaces 310 and the normal direction of the principal surface, θ1, is suitably set within the range from 10° to 58°, more suitably from 20° to 48°. In this case, the area of the lateral surface of the elevated portions that form the recessed/elevated surfaces 310 is large as compared with the example shown in FIG. 12 where the cross section has a trapezoidal shape. Therefore, as a result, the polarization plane can be further changed.

Figure 14:
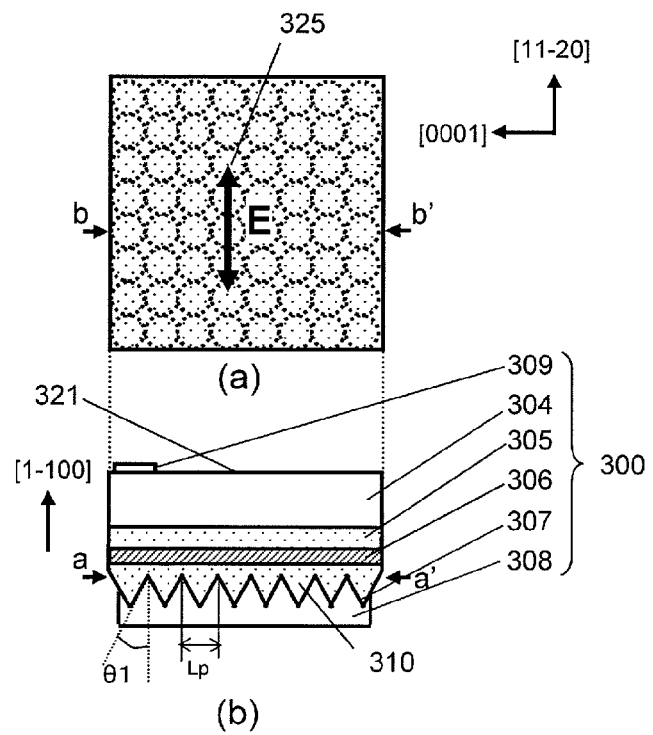
FIG. 14 shows a configuration of illustrative Embodiment 1 where the recessed/elevated surfaces 310 have a conical shape.

FIG. 14 shows an example where the elevated portions that form the recessed/elevated surfaces 310 have a conical shape. In the cross-sectional view, the angle which is formed between the lateral surface of the elevated portions that form the recessed/elevated surfaces 310 and the normal direction of the principal surface, θ1, is suitably set within the range from 10° to 58°, more suitably from 20° to 48°. In this case, the area of the lateral surface of the elevated portions that form the recessed/elevated surfaces 310 is large as compared with the shape of a circular pillar shown in FIG. 9 and FIG. 10. Therefore, as a result, the polarization plane can be further changed. Further, in the case of the conical shape, it is not necessary to consider the polarization direction 325, and designing is therefore easy, whereas in the case of the quadrangular pyramid shape shown in FIG. 13 it is necessary to consider the polarization direction 325.

Figure 15:
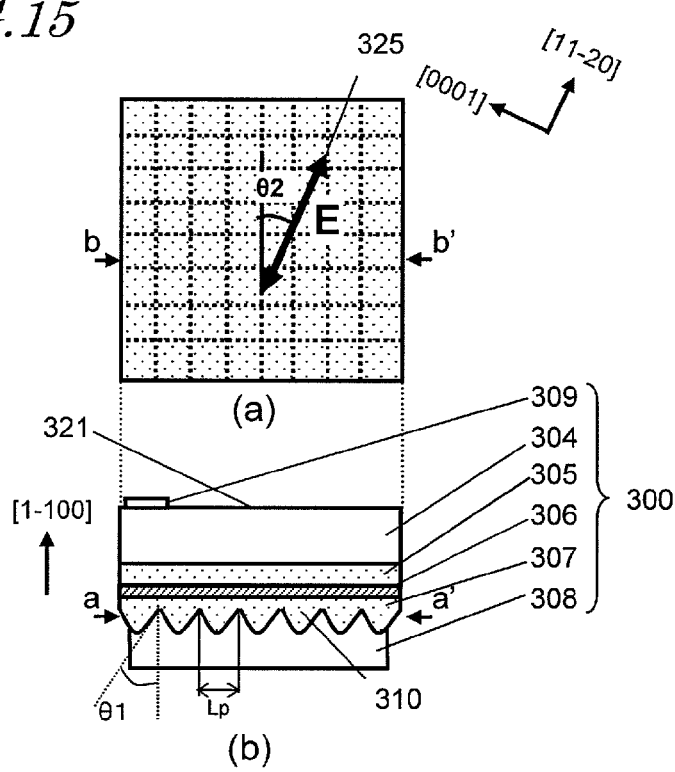
FIG. 15 shows a configuration of illustrative Embodiment 1 where the recessed/elevated surfaces 310 have a quadrangular shape in a top view and have a shape which is defined by a portion cut off from a circle or ellipse in a cross-sectional view.

FIG. 15 shows an example where the elevated portions that form the recessed/elevated surfaces 310 have a quadrangular shape in a top view and have a shape which is defined by a portion cut off from a circle or ellipse in a cross-sectional view. The angle which is formed between a side of the quadrangle formed by the elevated portions that form the recessed/elevated surfaces 310 and the polarization direction 325 of the nitride semiconductor active layer 306, θ2, is suitably set within the range from 30° to 60°, more suitably from 40° to 50°. In the cross-sectional view, the angle which is formed between a tangent line at a point on the elevated portions that form the recessed/elevated surfaces 310 which is closest to the nitride semiconductor active layer 306 and the normal direction of the principal surface, θ1, is suitably set within the range from 10° to 58°, more suitably from 20° to 48°.

Figure 16:
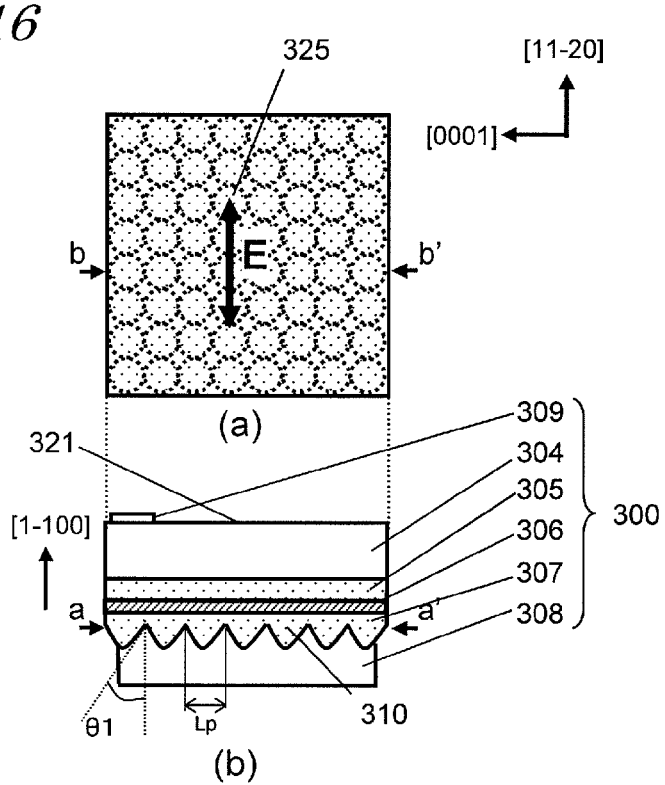
FIG. 16 shows a configuration of illustrative Embodiment 1 where the recessed/elevated surfaces 310 have a circular shape in a top view and have a shape which is defined by a portion cut off from a circle or ellipse in a cross-sectional view.

FIG. 16 shows an example where the elevated portions that form the recessed/elevated surfaces 310 have a circular shape in a top view and have a shape which is defined by a portion cut off from a circle or ellipse in a cross-sectional view. In the cross-sectional view, the angle which is formed between a tangent line at a point on the elevated portions that form the recessed/elevated surfaces 310 which is closest to the nitride semiconductor active layer 306 and the normal direction of the principal surface, θ1, is suitably set within the range from 10° to 58°, more suitably from 20° to 48°. In the case of the shape of FIG. 16, it is not necessary to consider the polarization direction 325, and designing is therefore easy, whereas in the case of the shape shown in FIG. 15 it is necessary to consider the polarization direction 325.

Figure 17:
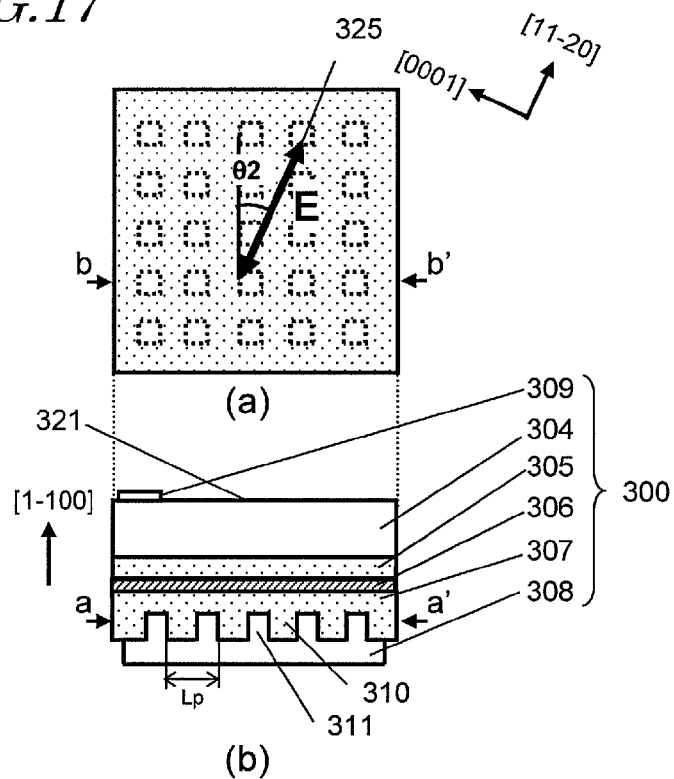
FIG. 17 shows a configuration of illustrative Embodiment 1 where the dot shape is hollowed so as to have a recessed shape.

FIG. 11 to FIG. 16 show the examples where the dot shapes are realized by elevations, while in the example of FIG. 17, the dot shape is hollowed so as to have a recessed shape. The elements that form the recessed/elevated surfaces 310 are not limited to elevated portions, but may be recessed portions or may be a combination of recessed portions and elevated portions. The recessed/elevated surfaces 310 of FIG. 17 has a shape which is obtained by inverting the recessed/elevated surfaces 310 of FIG. 11 relative to a flat plane which is parallel to the principal surface of the substrate 304. In the top view of FIG. 17, the angle which is formed between a side of the quadrangle formed by recessed portions 311 and the polarization direction 325 of the nitride semiconductor active layer 306, θ2, is suitably set within the range from 30° to 60°, more suitably from 40° to 50°.

Thus, in the examples shown in FIG. 11 to FIG. 17, when the interval of the elevated portions or recessed portions that form the recessed/elevated surfaces 310, Lp, is not more than 40 μm, the elevated portions or recessed portions that form the recessed/elevated surfaces 310 may be randomly and two-dimensionally arranged. Further, Lp may be not less than 180 nm. When the elevated portions or recessed portions that form the recessed/elevated surfaces 310 are excessively small, light is less likely to be affected by the recessed/elevated surfaces 310. The height of the elevated portions that form the recessed/elevated surfaces 310 and the depth of the recessed portions that form the recessed/elevated surfaces 310 may be about 0.05 μm to 2 μm. However, the height of the elevated portions and the depth of the recessed portions may be smaller than the thickness of the p-type nitride semiconductor layer 307. The ground of the numerical range of θ1 will be described together in the following section where θ1 will be discussed in connection with the stripe shape.

<Stripe Shapes (FIG. 18 to FIG. 21)>

Figure 23:
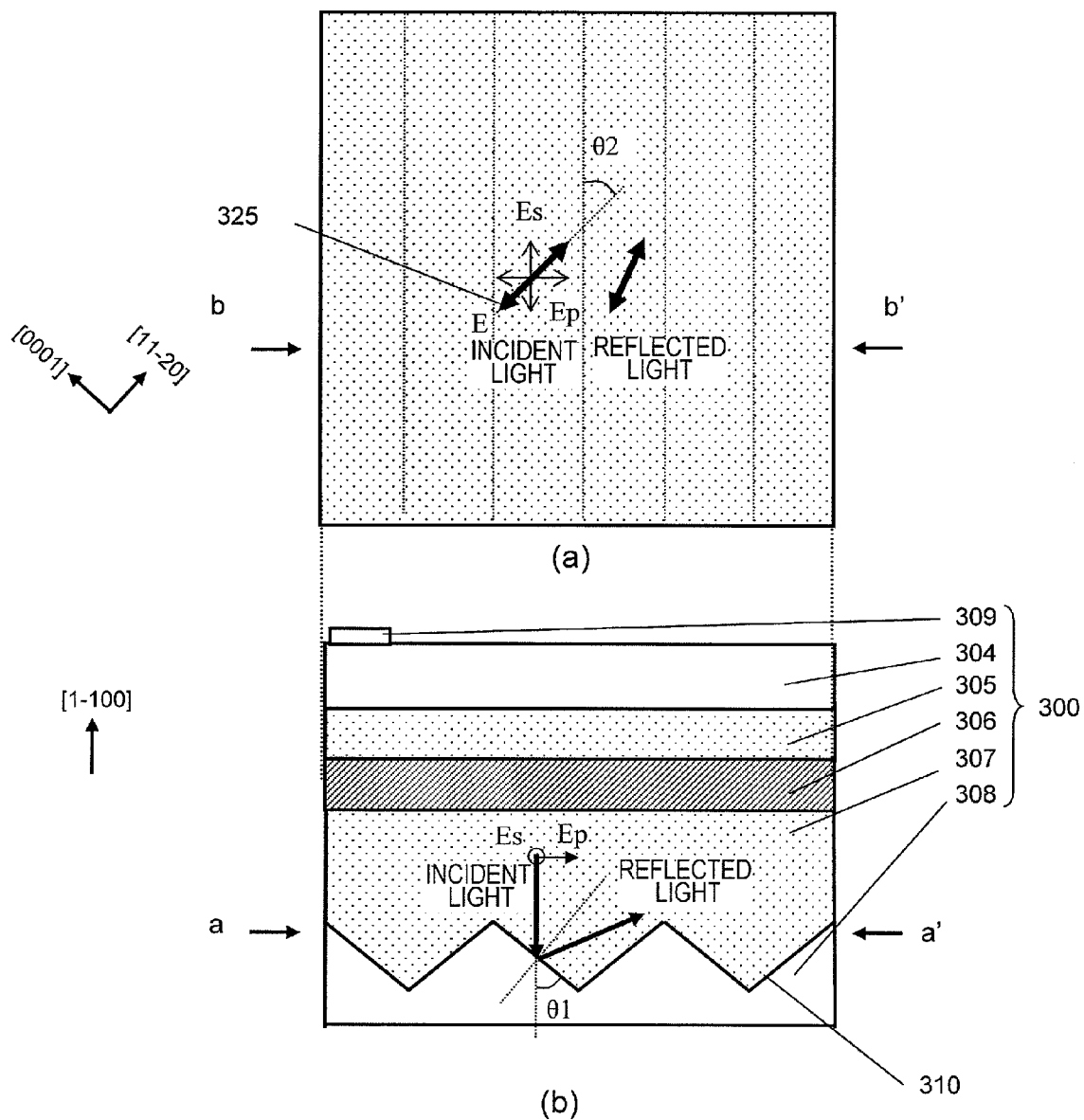
FIG. 23 is a diagram illustrating a phenomenon that the direction of polarization changes in illustrative Embodiment 1.

Reflection of light at recessed/elevated surfaces 310 which have a stripe shape causes the polarization direction to rotate in a specific direction due to an inclination of lateral surfaces of stripes of the recessed/elevated surfaces 310 with respect to the normal direction of the principal surface. This aspect is described with reference to FIG. 23. FIG. 23 is obtained by adding the s-polarization component Es and the p-polarization component Ep of incident light and reflected light to the configuration diagram shown in FIG. 20. When the angle which is formed between the extending direction of the stripes and the polarization direction 325 of the nitride semiconductor active layer 306, θ1, is set to an angle which does not include 0° or 90°, light which is emitted from the nitride semiconductor active layer 306 so as to be incident on the recessed/elevated surfaces 310 includes the s-polarization component and the p-polarization component with respect to the striped lateral surfaces in the recessed/elevated surfaces 310. At the striped lateral surfaces in the recessed/elevated surfaces 310, the s-polarization component Es and the p-polarization component Ep have different reflectances. The reflectance of the s-polarization component is larger than the reflectance of the p-polarization component. As a result, the orientation of the polarization direction of synthesized light of the s-polarization component Es and the p-polarization component Ep after the reflection rotates in a direction which accords with the extending direction of the stripes.

Figure 24:
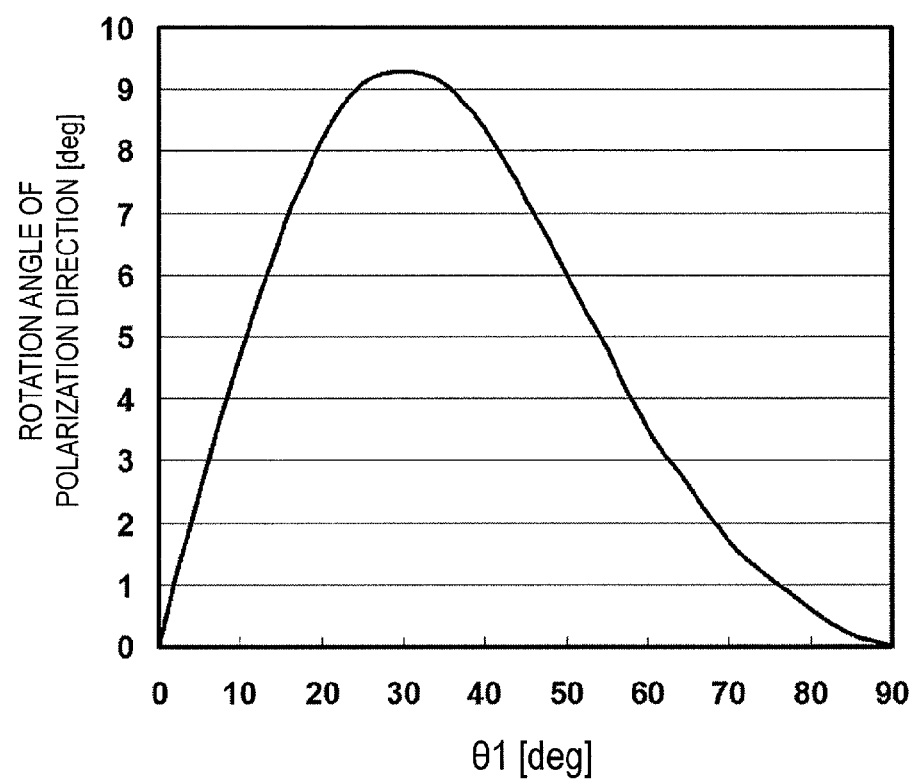
FIG. 24 is a graph showing θ1 and calculation results of the rotation angle of the polarization direction in illustrative Embodiment 1.

FIG. 24 is the calculation result illustrating the relationship between θ1 and the rotation angle of the polarization direction. The calculation was carried out on the assumption that the refractive index of the GaN was 2.5, the p-side electrode 308 was made of Ag, and the refractive index of Ag was given in the form of a complex refractive index. As seen from FIG. 24, within a range of θ1 from 10° to 58°, the polarization direction can be inclined by 5°. Within a range of θ1 from 20° to 48°, the polarization direction can be inclined by 8°. From the viewpoint of reducing the polarization degree by conversion to elliptical polarization, the rotation angle of the polarization direction at the recessed/elevated surfaces 310 is suitably 45°. However, the rotation angle is about 9.2° at the most. This point does not particularly matter. This is because, as previously described, light which is reflected once at the recessed/elevated surfaces 310 and then extracted to the outside corresponds to the second emitted light 352, and when the reflectance of the p-side electrode 308 is 90% and the refractive index of the m-plane GaN substrate 304 is 2.5, the second emitted light 352 is only about 7.5% of the total amount of light emitted from the nitride semiconductor active layer 306, and when the surface of the m-plane GaN substrate 304 is covered with a material of which refractive index is 1.4, the second emitted light 352 is only about 15.4% of the total amount of light emitted from the nitride semiconductor active layer 306. In actuality, light emitted from the nitride semiconductor active layer 306 is reflected a plurality of times between the light extraction surface 321 and the p-side electrode 308. Therefore, as the number of times of reflection increases, the polarization direction becomes closer to the extending direction of the stripes. Thus, the angle which is formed between the extending direction of the stripes and the polarization direction 325 of the nitride semiconductor active layer 306, θ2, may be suitably close to 45°.

Figure 18:
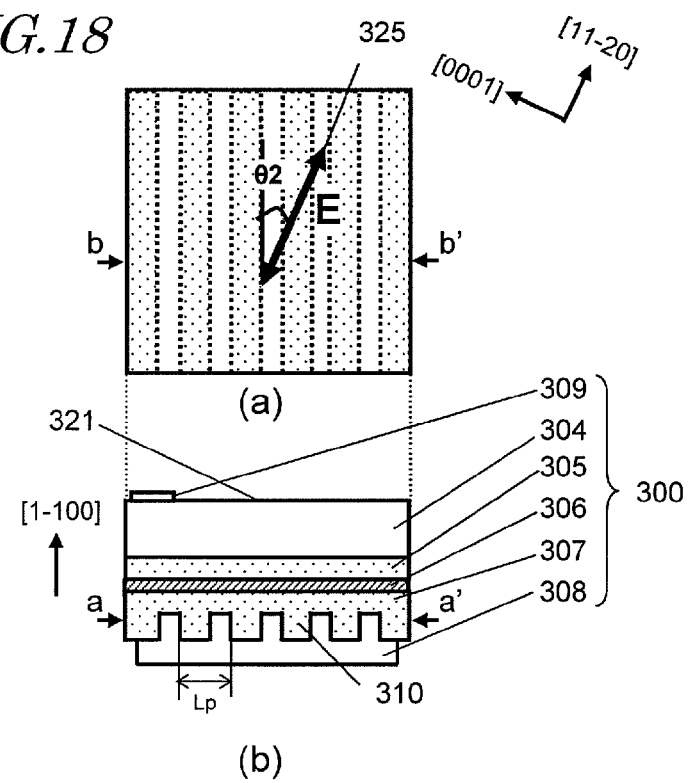
FIG. 18 shows a configuration of illustrative Embodiment 1 where the recessed/elevated surfaces 310 have a stripe shape in a top view and have a rectangular cross-sectional shape.

FIG. 18 shows an example where the stripes that form the recessed/elevated surfaces 310 have a rectangular cross-sectional shape. In the top view, the angle which is formed between the extending direction of the stripes and the polarization direction 325 of the nitride semiconductor active layer 306, θ2, is suitably set within the range from 30° to 60°, more suitably from 40° to 50°.

Figure 19:
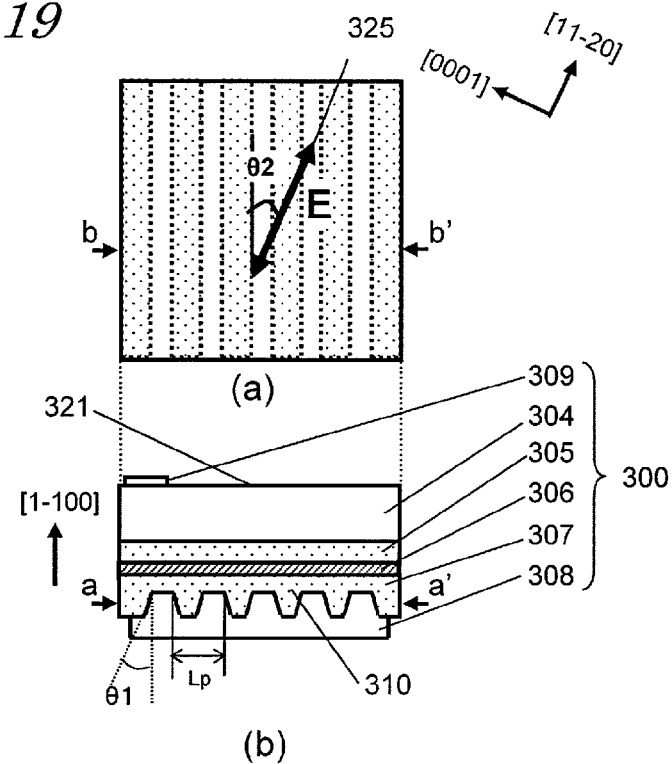
FIG. 19 shows a configuration of illustrative Embodiment 1 where the recessed/elevated surfaces 310 have a stripe shape in a top view and have a trapezoidal cross-sectional shape.

FIG. 19 shows an example where the stripes that form the recessed/elevated surfaces 310 have a trapezoidal cross-sectional shape. In the top view, the angle which is formed between the extending direction of the stripes and the polarization direction 325 of the nitride semiconductor active layer 306, θ2, is suitably set within the range from 30° to 60°, more suitably from 40° to 50°. In the cross-sectional view, the angle which is formed between the lateral surface of the stripes that form the recessed/elevated surfaces 310 and the normal direction of the principal surface, θ1, is suitably set within the range from 10° to 58°, more suitably from 20° to 48°.

Figure 20:
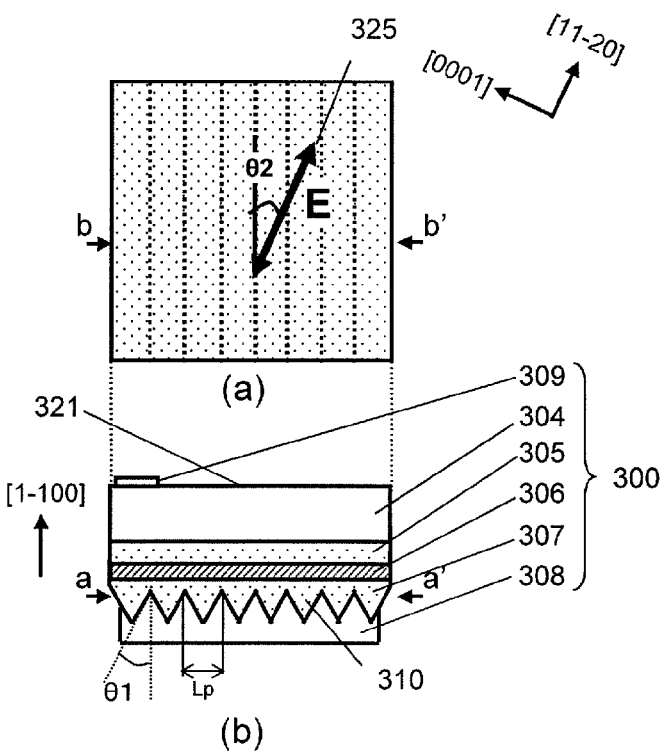
FIG. 20 shows a configuration of illustrative Embodiment 1 where the recessed/elevated surfaces 310 have a stripe shape in a top view and have a triangular cross-sectional shape.

FIG. 20 shows an example where the stripes that form the recessed/elevated surfaces 310 have a triangular cross-sectional shape. In this case, the area of the lateral surface of the stripes that form the recessed/elevated surfaces 310 is large as compared with the example of FIG. 19 where the stripes that form the recessed/elevated surfaces 310 have a trapezoidal cross-sectional shape. Therefore, the orientation of the polarization can be further changed. In the top view, the angle which is formed between the extending direction of the stripes and the polarization direction 325 of the nitride semiconductor active layer 306, θ2, is suitably set within the range from 30° to 60°, more suitably from 40° to 50°. In the cross-sectional view, the angle which is formed between the lateral surface of the stripes that form the recessed/elevated surfaces 310 and the normal direction of the principal surface, θ01, is suitably set within the range from 10° to 58°, more suitably from 20° to 48°.

Figure 21:
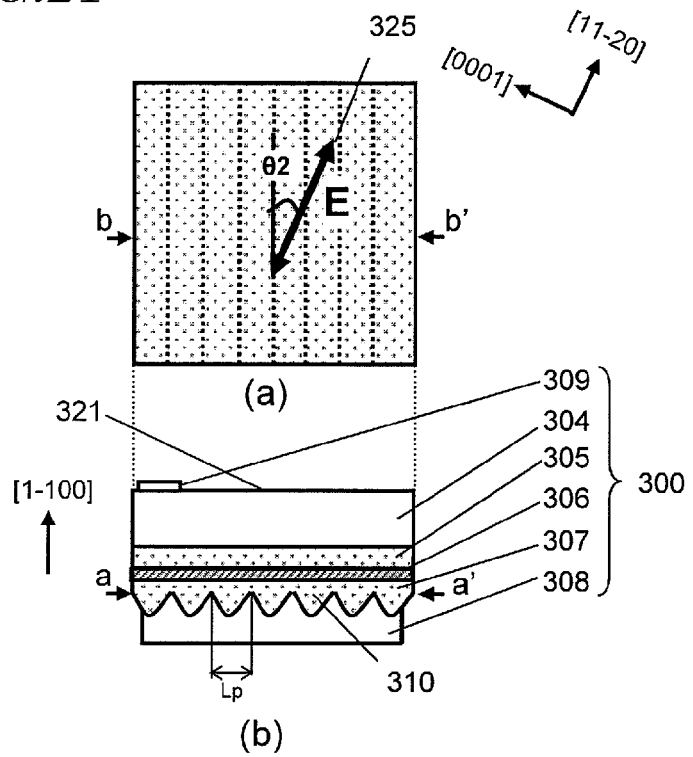
FIG. 21 shows a configuration of illustrative Embodiment 1 where the recessed/elevated surfaces 310 have a stripe shape in a top view and have a cross-sectional shape which is defined by a portion cut off from a circle or ellipse.

FIG. 21 shows an example where the stripes that form the recessed/elevated surfaces 310 have a cross-sectional shape which is defined by a portion cut off from a circle or ellipse. In the cross-sectional view, the angle which is formed between a tangent line at a point on the stripes that form the recessed/elevated surfaces 310 which is closest to the nitride semiconductor active layer 306 and the normal direction of the principal surface, θ1, is suitably set within the range from 10° to 58°, more suitably from 20° to 48°.

Thus, in the examples shown in FIG. 18 to FIG. 21, when the interval between adjoining stripes in the recessed/elevated surfaces 310, Lp, is not more than 40 μm, the intervals of the stripes may be not constant. Further, Lp may be not less than 180 nm. When the recessed/elevated surfaces 310 are excessively small, light is less likely to be affected by the recessed/elevated surfaces 310. The height of the recessed/elevated surfaces 310 may be about 0.05 μm to 2 μm. However, the height of the recessed/elevated surfaces 310 may be smaller than the thickness of the p-type nitride semiconductor layer 307.

Hereinabove, the shapes of the recessed/elevated surfaces 310 have been described with reference to FIG. 9 to FIG. 21. The shapes of the recessed/elevated surfaces 310 which are shown in these drawings may be employed in combination.

Next, a manufacturing method of the present embodiment, i.e., Embodiment 1, is described with reference to FIG. 9.

On an n-type GaN substrate 304 having an M-plane principal surface, an n-type nitride semiconductor layer 305 is epitaxially grown using an MOCVD method. For example, an n-type nitride semiconductor layer 305 which is made of GaN and which has a thickness of about 1 to 3 μm is formed at a growth temperature of not less than 900° C. and not more than 1100° C., using silicon as the n-type impurity, while TMG $(Ga(CH_3)_3)$ and $NH_3$ are supplied as the source materials.

Then, a nitride semiconductor active layer 306 is formed on the n-type nitride semiconductor layer 305. The nitride semiconductor active layer 306 has a GaInN/GaN multi-quantum well (MQW) structure in which, for example, 15 nm thick $Ga_{1-x}In_xN$ well layers and 30 nm thick GaN barrier layers are alternately stacked one upon each other. In forming the $Ga_{1-x}In_xN$ well layers, the growth temperature may be decreased to 800° C. such that In can be taken in. The emission wavelength is selected according to the use for the nitride-based semiconductor light-emitting device 300, and the In composition x is determined according to the wavelength. When the wavelength is 450 nm (blue), the In composition x is determined to be in the range of 0.18 to 0.2. When the wavelength is 520 nm (green), x is in the range of 0.29 to 0.31 (x=0.29 to 0.31). When the wavelength is 630 nm (red), x is in the range of 0.43 to 0.44 (x=0.43 to 0.44).

On the nitride semiconductor active layer 306, a p-type nitride semiconductor layer 307 is formed. For example, a p-type nitride semiconductor layer 307 which has a thickness of about 50 nm to 500 nm and which is made of p-type GaN is formed at a growth temperature of not less than 900° C. and not more than 1100° C., using $Cp_2Mg$ (cyclopentadienyl magnesium) as the p-type impurity, while TMG and $NH_3$ are supplied as the source materials. Inside the p-type nitride semiconductor layer 307, a p-AlGaN layer which has a thickness of about 15 nm to 30 nm may be included. Providing the p-AlGaN layer enables prevention of an overflow of electrons in operation.

Then, for the purpose of activating a p-GaN layer, a heat treatment is performed at a temperature of about 800° C. to 900° C. for about 20 minutes.

Thereafter, dry etching is performed using a chlorine gas such that the p-type nitride semiconductor layer 307, the nitride semiconductor active layer 306, and the n-type nitride semiconductor layer 305 are partially removed to form a recessed portion 312, whereby part of the n-type nitride semiconductor layer 305 is exposed.

Then, recessed/elevated surfaces 310 are formed in the surface of the p-type nitride semiconductor layer 307. For the formation of the recessed/elevated surfaces 310, photolithography and dry etching are employed. Employing photolithography enables to arbitrarily determine the shape and arrangement of the recessed/elevated surfaces 310 viewed from the top surface direction. The cross-sectional shape of the recessed/elevated surfaces 310 can be controlled by the conditions for the dry etching. For example, when such conditions that provide a high physical etching property are employed where the etching pressure is decreased and the ion extraction voltage is increased, a lateral surface which is close to the normal direction of the principal surface (a lateral surface where θ1 is close to 0°) can be formed. On the other hand, when such conditions that provide a high chemical etching property are employed where an ICP plasma source of high plasma density is used and the ion extraction voltage is low, a lateral surface which is inclined with respect to the normal direction of the principal surface (a lateral surface where θ1 is greater than 0°) can be formed.

Then, a n-side electrode 309 is formed so as to be in contact with the exposed part of the n-type nitride semiconductor layer 305. For example, Ti/Pt layers are formed as the n-side electrode 309. Further, a p-side electrode 308 is formed so as to be in contact with the p-type nitride semiconductor layer 307. For example, Pd/Pt layers are formed as the p-side electrode 308. Thereafter, a heat treatment is performed such that the Ti/Pt layers and the n-type nitride semiconductor layer 305 are alloyed together, and the Pd/Pt layers and the p-type nitride semiconductor layer 307 are also alloyed together.

Thereafter, the n-type GaN substrate 304 is ground so as to be a thin film. In this process, the grinding is carried out to adjust the thickness of the n-type GaN substrate 304 such that the retardation D reaches a setpoint. This setpoint may be selected from the range that is defined by Formula 4.

The thus-manufactured nitride-based semiconductor light-emitting device 300 is separated into small chips. In the separation process, a technique such as laser dicing or cleaving may be used. The separated nitride-based semiconductor light-emitting device 300 in the form of a small chip has been mounted to the mounting base 301. Here, an example of the method of flip-chip mounting is described.

First, the mounting base 301 is provided. On the mounting base 301, the wire 302 is formed in advance. As the base material of the mounting base, an insulating material such as alumina or AlN, a metal such as Al or Cu, a semiconductor such as Si or Ge, or a composite material thereof may be used. When the metal or semiconductor is used as the base material of the mounting base 301, the surface of the mounting base 301 may be covered with an insulating film. The wire 302 may be arranged according to the electrode shape of the nitride-based semiconductor light-emitting device 300. For the wire 302, Cu, Au, Ag or Al, may be used. These materials may be provided on the mounting base 301 by sputtering or plating.

A bump 303 is formed on the wire 302. Au is suitably used for the bump. In forming the Au bump, a Au bump having a diameter of about 50 μm to 70 μm may be formed using a bump bonder. Alternatively, the Au bump may also be formed by Au plating. To the mounting base 301 on which the bump 303 has been formed in this way, the nitride-based semiconductor light-emitting device 300 is connected by ultrasonic bonding. In this way, the semiconductor light-emitting device of the present embodiment is completed.

As described above, in Embodiment 1, when light is reflected by the p-side electrode 308, recesses/elevations provided on the surface of the p-type nitride semiconductor layer 307 are utilized to change the orientation of the polarization of at least a component of the reflected light so as to have an angle which does not include 0° or 90° with respect to the optic axis of a substrate which has birefringence. In this way, polarized light emitted from the nitride semiconductor active layer 306 is converted to elliptical polarization when the polarized light passes through the substrate, whereby reduction of the polarization degree is realized. Further, since the polarization degree can be reduced, the light distribution characteristics can be ameliorated.

Embodiment 2

The second embodiment of the nitride-based semiconductor light-emitting device of the present disclosure is described with reference to FIG. 25 to FIG. 37. Components corresponding between Embodiment 1 and Embodiment 2 are denoted by the same reference numerals. Descriptions of components which are common among Embodiments 1 and 2 are herein omitted, and the differences between them are described in detail. In FIG. 25 to FIG. 37, the illustration is focused on the nitride semiconductor chip, while the mounting base 301, the wire 302, the bump 303, the Au wire 322, etc., are not shown. In each of the drawings, part (a) is a top view of a nitride semiconductor chip. Part (b) is a cross-sectional view taken along line b-b' of the top view. Part (a) shows the top surface at line a-a' of the cross-sectional view (b). For the other part of the structure than the nitride semiconductor chip, the flip-chip configuration shown in FIG. 9 or the wire bonding configuration shown in FIG. 10 may be used.

Firstly, refer to FIGS. 25(a) and 25(b). The nitride semiconductor light-emitting chip 300 includes, for example, a substrate 304 which includes an m-plane GaN layer at least on its surface, a n-type nitride semiconductor layer 305 which is formed on the m-plane GaN substrate, a nitride semiconductor active layer 306, a p-type nitride semiconductor layer 307, a p-side electrode 308 which is provided so as to be in contact with the p-type nitride semiconductor layer 307, and a n-side electrode 309 which is provided so as to be in contact with the n-type nitride semiconductor layer 305. In the present embodiment, a transparent region 322 is provided so as to cover at least part of the recessed/elevated surfaces 310 that are provided in the surface of the p-type nitride semiconductor layer 307.

Figure 25:
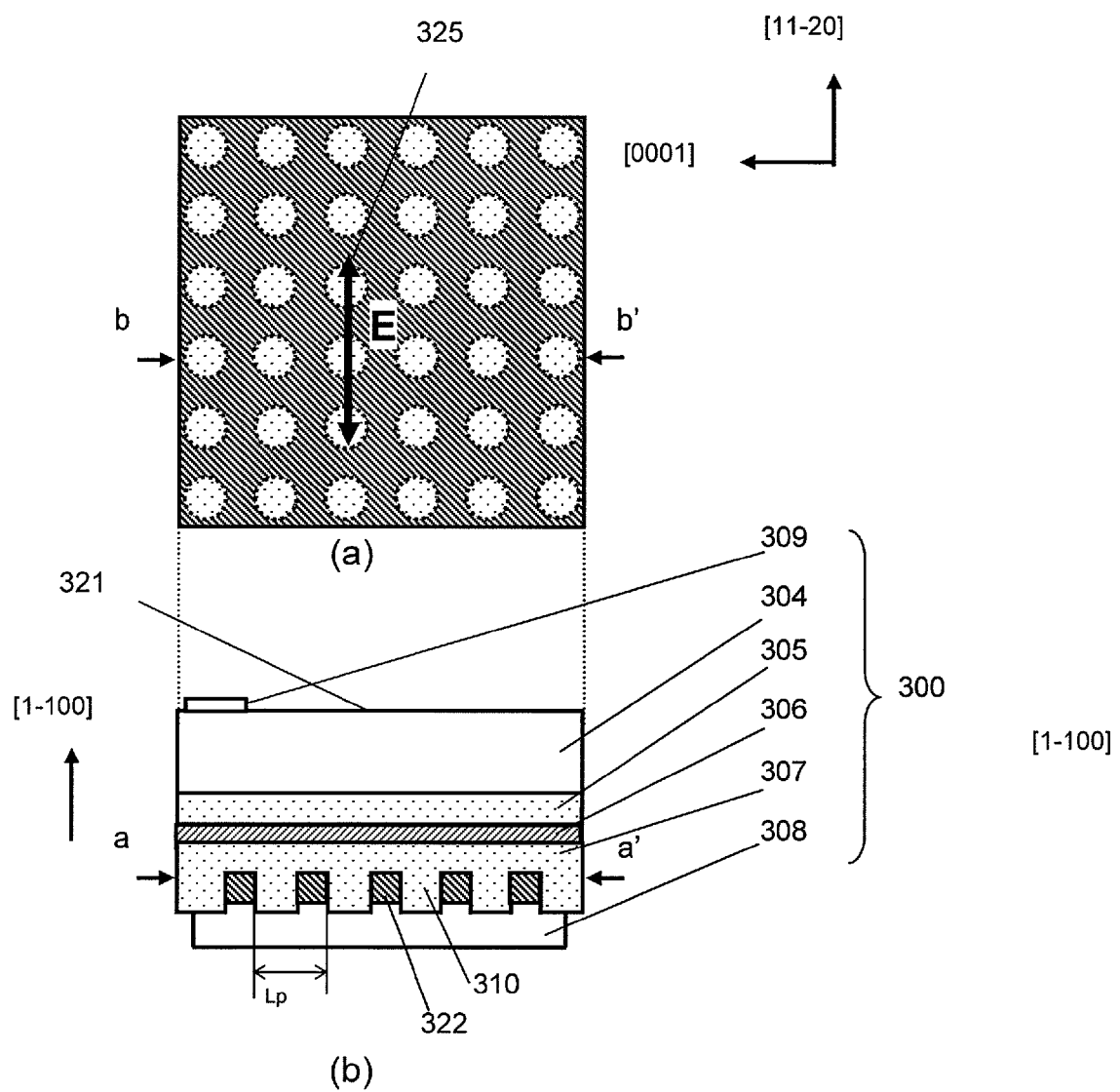
FIG. 25 shows a configuration of illustrative Embodiment 2 where the recessed/elevated surfaces 310 have the shape of a circular pillar.

The first feature of Embodiment 2 resides in that the substrate 304 has birefringence, and the optic axis of the substrate 304 forms an angle other than 0° with respect to the normal direction of the light extraction surface 321. In respect of this feature, Embodiment 2 is the same as Embodiment 1. The second feature of Embodiment 2 resides in that a plurality of recessed/elevated surfaces 310 are provided in the surface of the p-type nitride semiconductor layer 307. In respect of this feature, Embodiment 2 is the same as Embodiment 1. FIG. 25 shows an example where the recessed/elevated surfaces 310 have the shape of a circular pillar. The third feature of Embodiment 2 resides in that the transparent region 322 is provided so as to cover at least part of the plurality of recessed/elevated surfaces 310 that are provided in the surface of the p-type nitride semiconductor layer 307. In respect of this feature, Embodiment 2 is greatly different from Embodiment 1.

The transparent region 322 may be provided in the recessed portions that are provided between the elevated portions of the recessed/elevated surfaces 310. The p-side electrode 308 may be provided so as to cover the transparent region 322. When the transparent region 322 is thus provided between the p-type nitride semiconductor layer 307 and the p-side electrode 308, light which is emitted from the nitride semiconductor active layer 306 and reflected by the recessed/elevated surfaces 310 can be converted to elliptical polarization on the occasion of reflection. In Embodiment 1, the orientation of the polarization is changed by utilization of the difference in reflectance between the s-polarization component and the p-polarization component. In Embodiment 2, in addition to changing the orientation of the polarization, a Goos-Hanchen shift is positively utilized to produce a phase difference between the s-polarization component and the p-polarization component, whereby conversion to elliptical polarization is realized.

Figure 38:
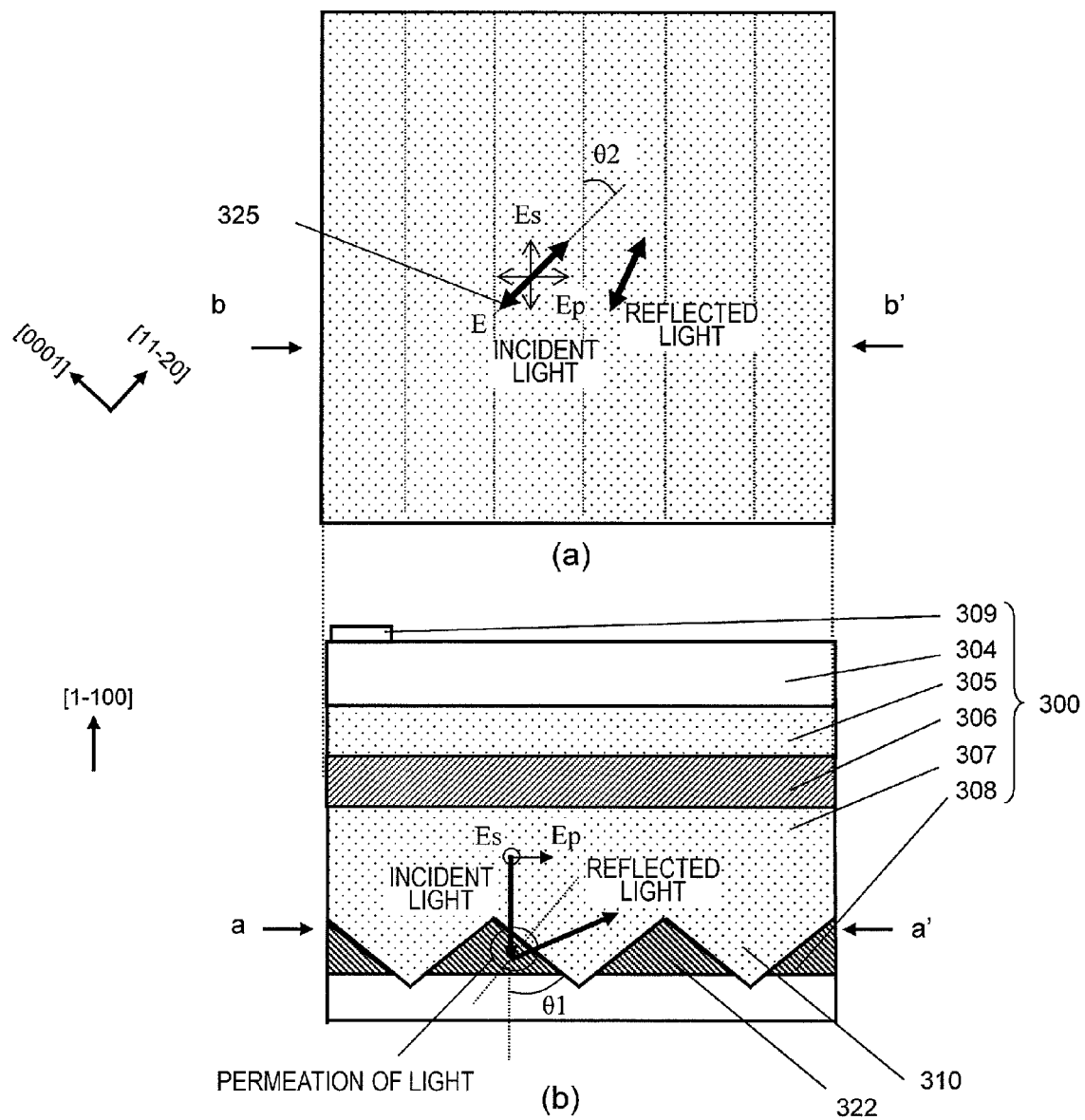
FIG. 38 is a diagram illustrating a phenomenon of conversion to elliptical polarization in illustrative Embodiment 2.

This respect is described with reference to FIG. 38. FIG. 38 shows an example where the recessed/elevated surfaces 310 which will be described later have a stripe shape in a top view, and the cross-sectional shape of the recessed/elevated surfaces 310 is triangular. In FIG. 38(a), the polarization direction of incident light and the polarization direction of reflected light are represented by bidirectional arrows. In FIG. 38(a), the direction of the s-polarization component Es and the direction of the p-polarization component Ep are also shown. In FIG. 38(b) that is a cross-sectional view, an optical path of light which is incident on a lateral surface of a stripe which forms the recessed/elevated surface 310 (incident light) and an optical path of light which is reflected at the lateral surface (reflected light) are shown. As previously described in Embodiment 1, the angle which is formed between a surface of the stripe and the normal direction of the principal surface is θ1.

Figure 39:
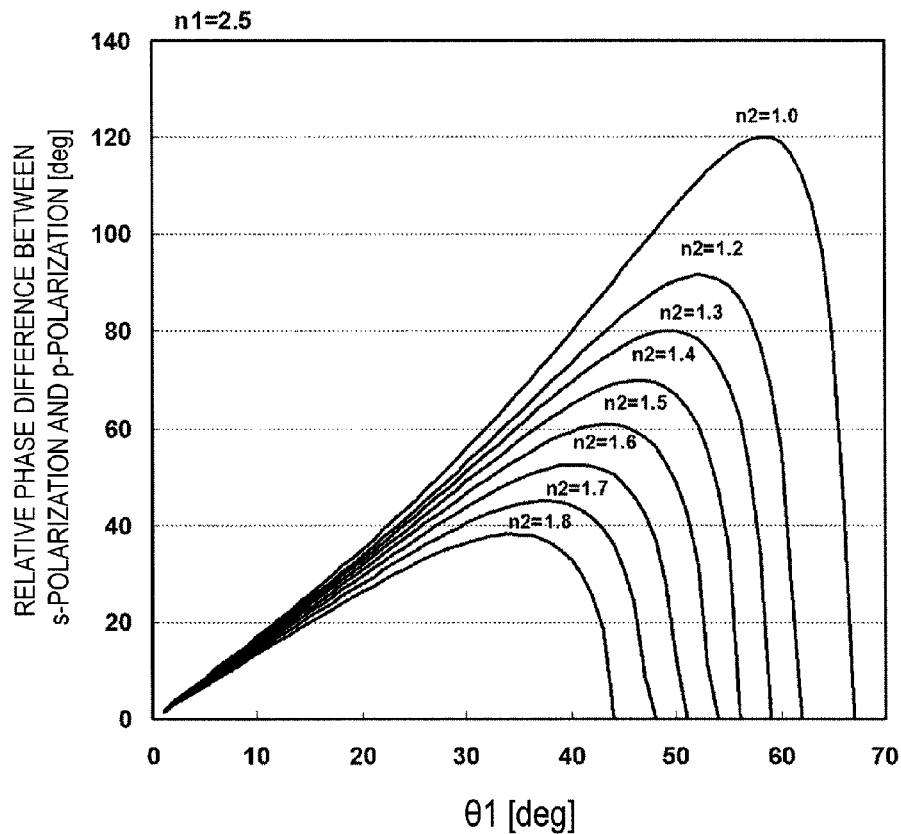
FIG. 39 is a graph showing θ1 and calculation results of the relative phase difference between s-polarization and p-polarization in illustrative Embodiment 2.

When the lateral surfaces of the stripes that form the recessed/elevated surfaces 310 are covered with the transparent region 322 as in the present embodiment, a light permeation phenomenon occurs. This phenomenon is called a Goos-Hanchen shift. However, when the lateral surfaces of the recessed/elevated surfaces 310 are covered with a metal as in Inventive Example 1, a light permeation phenomenon would not be detected. The Goos-Hanchen shift depends on the difference in refractive index at the light reflection interface. As the refractive index difference increases, the amount of the Goos-Hanchen shift increases. Here, when light is introduced so as to be incident on the slope surfaces of the recessed/elevated surfaces 310 such that the light includes the s-polarization component Es and the p-polarization component Ep, the amount of light which permeates out is different between the s-polarization component Es and the p-polarization component Ep. Therefore, a phase difference occurs between the reflected s-polarization component and the reflected s-polarization component. As a result, the synthesized reflected light is converted to elliptical polarization. FIG. 39 is a graph showing calculation results of the relative phase difference between the s-polarization component Es and the p-polarization component Ep which were reflected at the lateral surfaces of the recessed/elevated surfaces 310 where 91 is the angle which is formed between the lateral surfaces of the recessed/elevated surfaces 310 and the normal direction of the principal surface. In the calculation, the refractive index n1 of the p-type nitride semiconductor layer 307 is equal to that of the GaN, i.e., 2.5. The relative phase difference depends on the refractive index n2 of the transparent region 322. As n2 decreases, the relative phase difference increases. Further, the relative phase difference depends on θ1 and reaches the maximum value at a specific angle. When the relative phase difference is 90°, the polarization degree of reflected light can be the minimum.

As the material of the transparent region 322, $SiO_2$, SiN, SiON, may be used. When these materials are used, the refractive index of the transparent region 322 can be controlled within the range of 1.45 to 2.00. Alternatively, as the material of the transparent region 322, a silicone resin or an epoxy resin may be used. For example, when the material of the transparent region 322 is a silicone resin, the refractive index of the transparent region 322 can be controlled within the range of 1.40 to 1.54. For example, when an epoxy resin is used as the material of the transparent region 322, the refractive index of the transparent region 322 can be controlled within the range of 1.47 to 1.60. Still alternatively, as the material of the transparent region 322, an electrically conductive material, such as ITO, may be used. When an electrically conductive material is used as the material of the transparent region 322, it functions to decrease the resistance component. These materials may be selected from among thermosetting materials and UV-curable materials.

In Embodiment 2, the elevated portions that form the recessed/elevated surfaces 310 may also have various shapes as in Embodiment 1. In the examples which will be described below, they are classified into dot shapes (FIG. 25 to FIG. 32) and stripe shapes (FIG. 33 to FIG. 36). The configurations shown in FIGS. 26 to 27 correspond to the configurations shown in FIGS. 11 to 15, respectively. The difference resides in that the transparent material 322 is provided between the p-type nitride semiconductor layer 307 and the p-side electrode 308.

<Dot Shapes (FIG. 25 to FIG. 32)>

Figure 26:
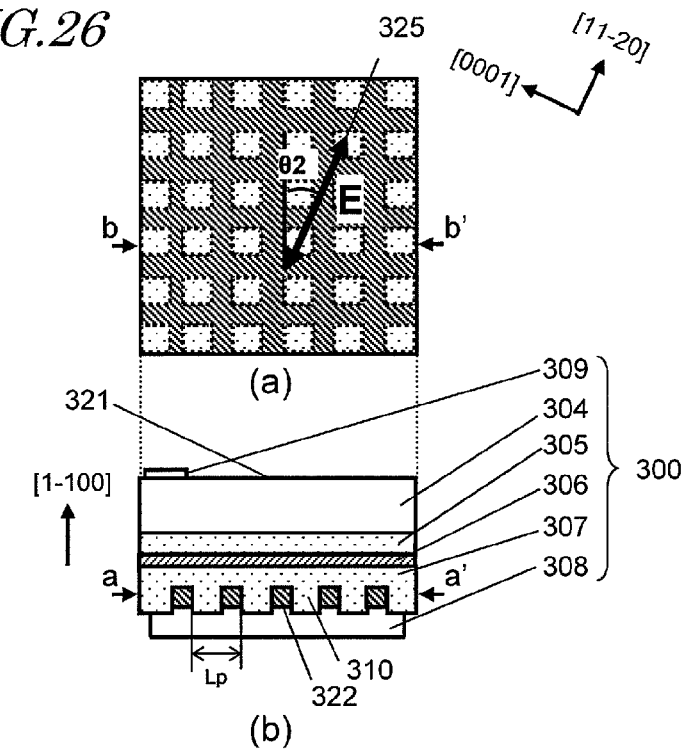
FIG. 26 shows a configuration of illustrative Embodiment 2 where the recessed/elevated surfaces 310 have the shape of a quadrangular pillar.
Figure 27:
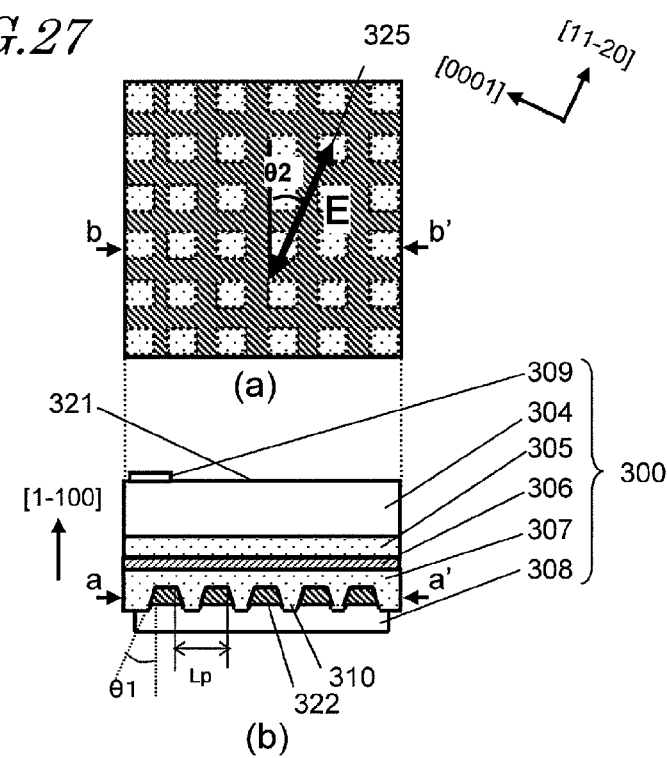
FIG. 27 shows a configuration of illustrative Embodiment 2 where the recessed/elevated surfaces 310 have a quadrangular shape in a top view and have a trapezoidal shape in a cross-sectional view.
Figure 28:
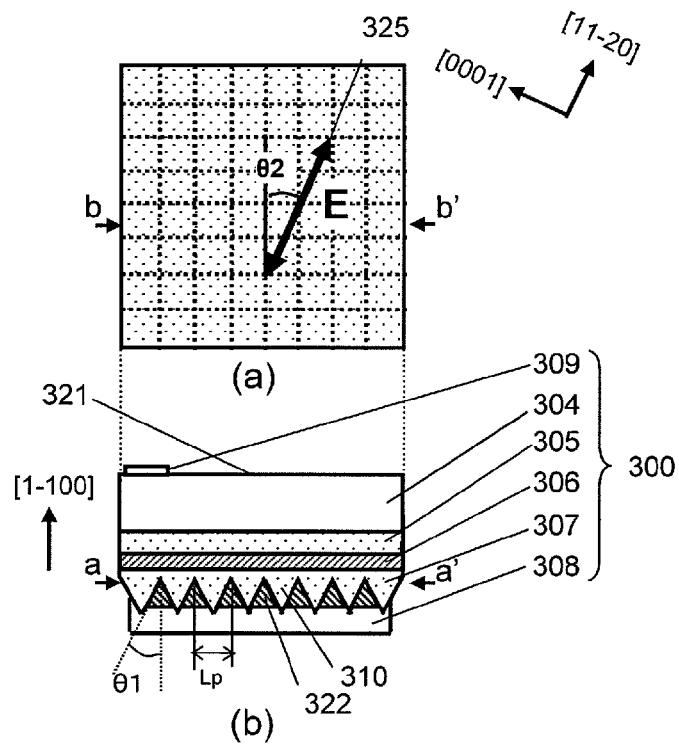
FIG. 28 shows a configuration of illustrative Embodiment 2 where the recessed/elevated surfaces 310 have the shape of a quadrangular pyramid.
Figure 29:
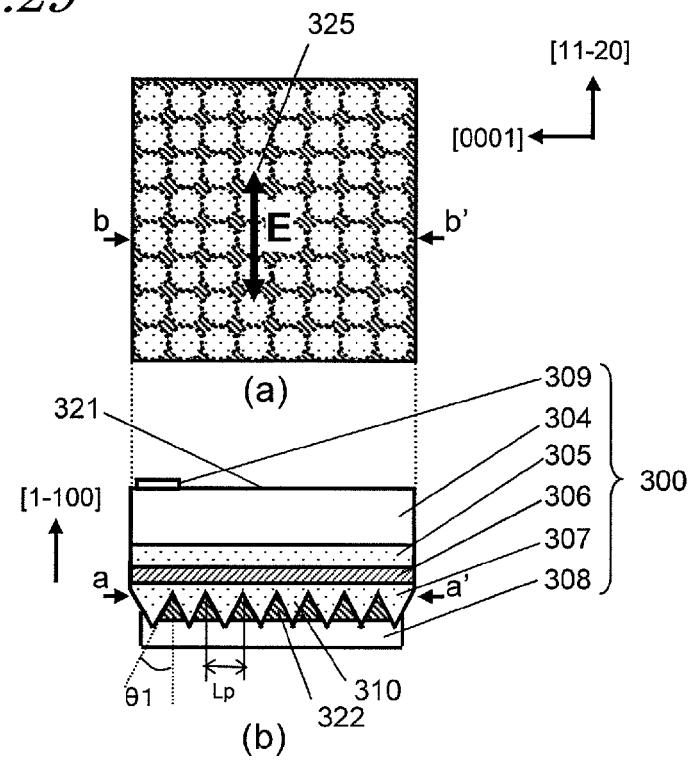
FIG. 29 shows a configuration of illustrative Embodiment 2 where the recessed/elevated surfaces 310 have a conical shape.
Figure 30:
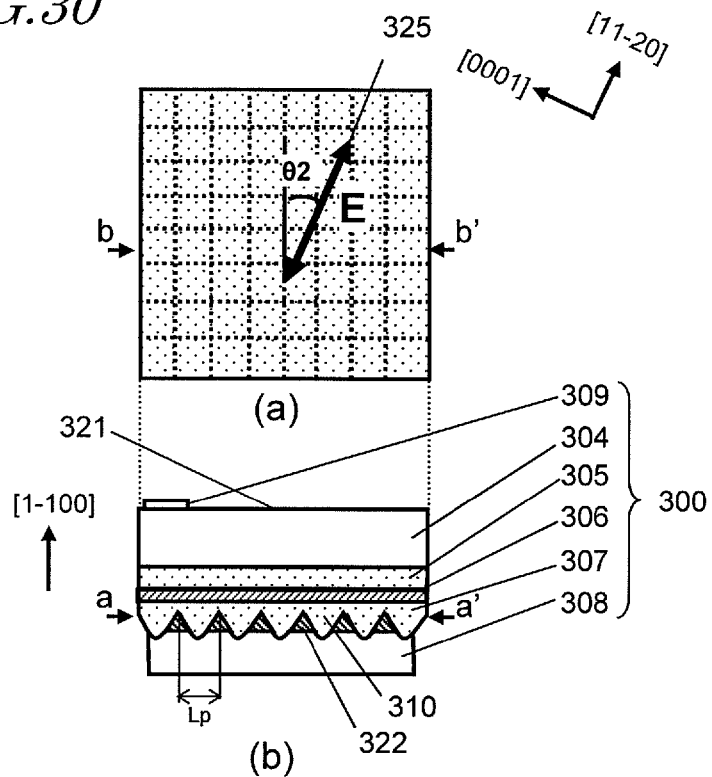
FIG. 30 shows a configuration of illustrative Embodiment 2 where the recessed/elevated surfaces 310 have a quadrangular shape in a top view and have a shape which is defined by a portion cut off from a circle or ellipse in a cross-sectional view.
Figure 31:
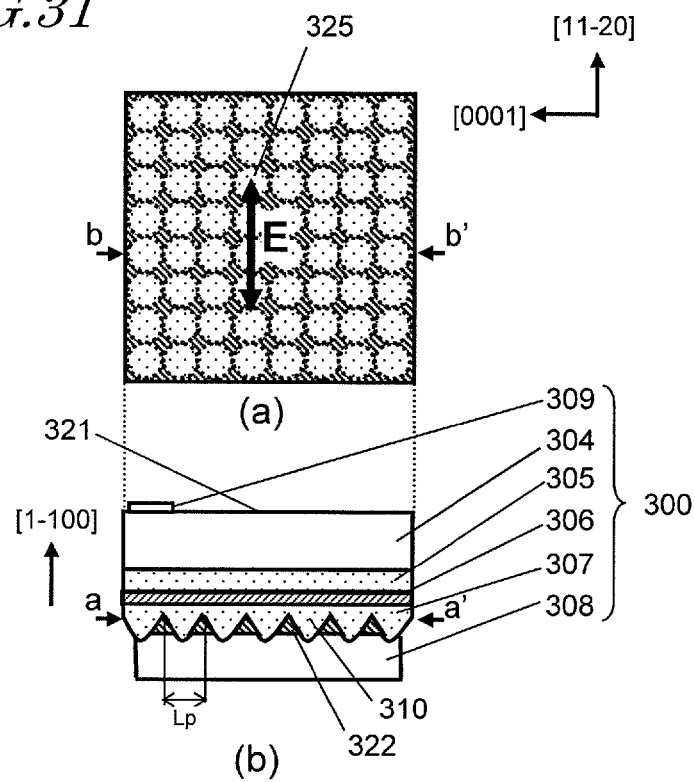
FIG. 31 shows a configuration of illustrative Embodiment 2 where the recessed/elevated surfaces 310 have a circular shape in a top view and have a shape which is defined by a portion cut off from a circle or ellipse in a cross-sectional view.

FIG. 26 is an example where the elevated portions that form the recessed/elevated surfaces 310 have the shape of a quadrangular pillar. FIG. 27 is an example where the elevated portions that form the recessed/elevated surfaces 310 have a quadrangular shape in a top view and have a trapezoidal shape in a cross-sectional view. FIG. 28 is an example where the elevated portions that form the recessed/elevated surfaces 310 have the shape of a quadrangular pyramid. FIG. 29 is an example where the elevated portions that form the recessed/elevated surfaces 310 have a conical shape. FIG. 30 is an example where the elevated portions that form the recessed/elevated surfaces 310 have a quadrangular shape in a top view and have a cross-sectional shape which is defined by a portion cut off from a circle or ellipse. FIG. 31 is an example where the elevated portions that form the recessed/elevated surfaces 310 have a circular shape in a top view and have a cross-sectional shape which is defined by a portion cut off from a circle or ellipse.

Figure 32:
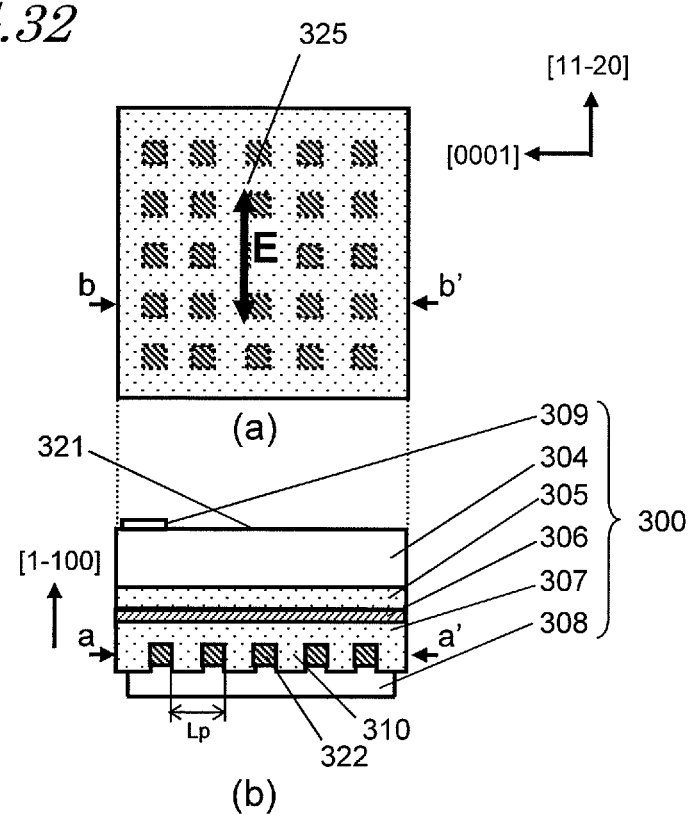
FIG. 32 shows a configuration of illustrative Embodiment 2 where the dot shape is hollowed so as to have a recessed shape.

FIG. 25 to FIG. 31 show the examples where the dot shapes are realized by elevated portions, while in the example of FIG. 32, the dot shape is hollowed so as to have a recessed shape.

<Stripe Shapes (FIG. 33 to FIG. 36)>

Figure 33:
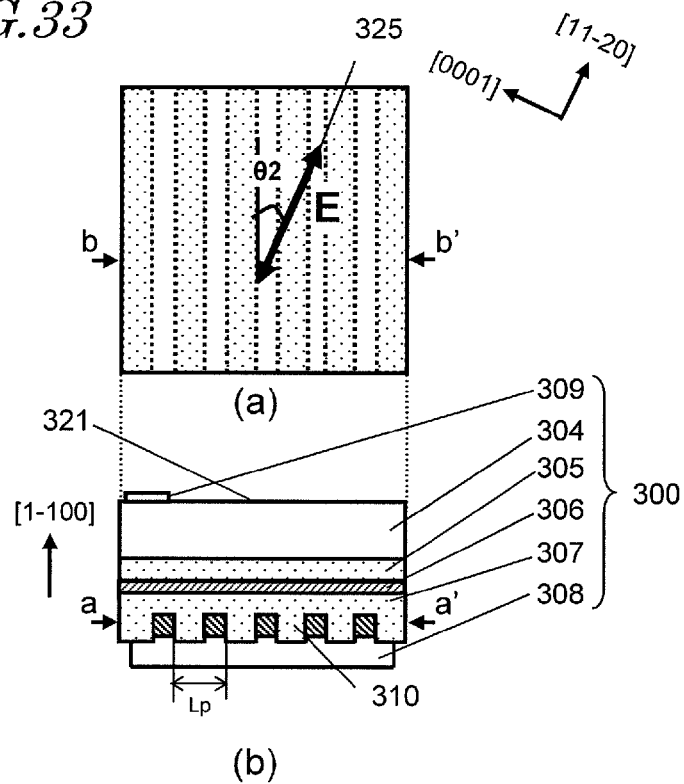
FIG. 33 shows a configuration of illustrative Embodiment 2 where the recessed/elevated surfaces 310 have a stripe shape in a top view and have a rectangular cross-sectional shape.
Figure 34:
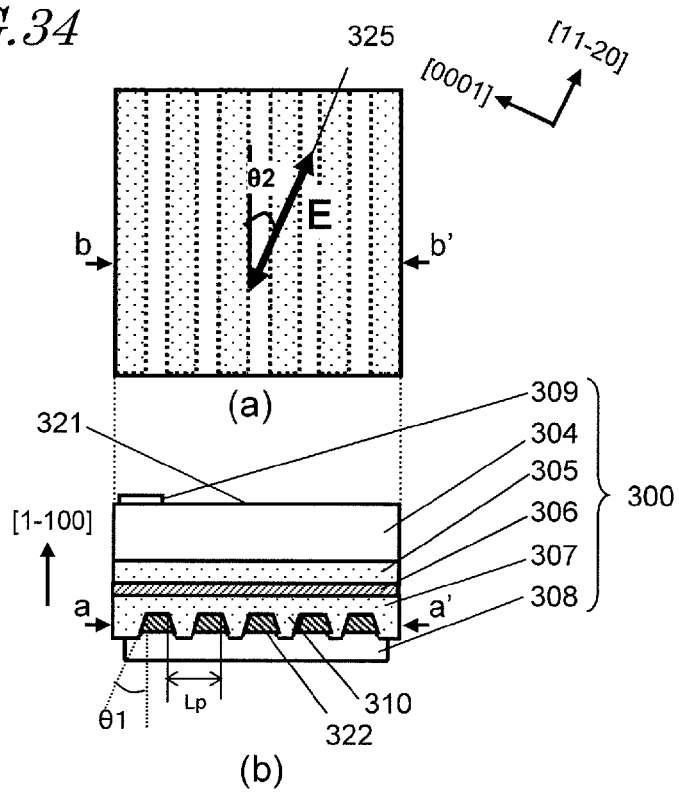
FIG. 34 shows a configuration of illustrative Embodiment 2 where the recessed/elevated surfaces 310 have a stripe shape in a top view and have a trapezoidal cross-sectional shape.
Figure 35:
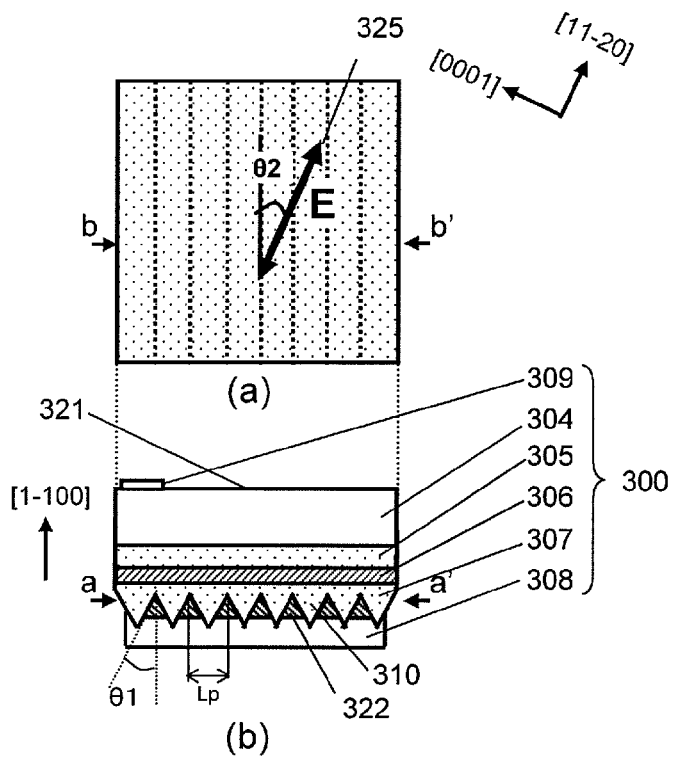
FIG. 35 shows a configuration of illustrative Embodiment 2 where the recessed/elevated surfaces 310 have a stripe shape in a top view and have a triangular cross-sectional shape.
Figure 36:
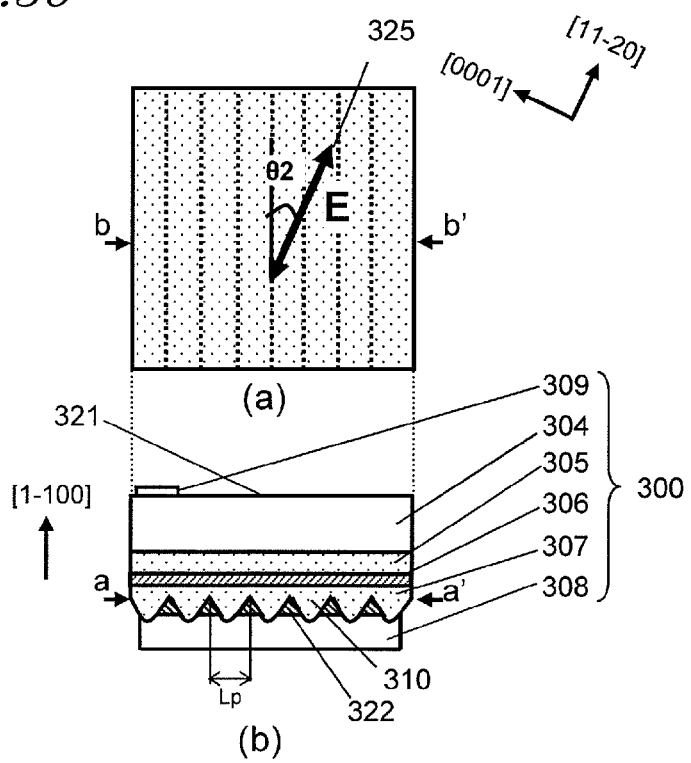
FIG. 36 shows a configuration of illustrative Embodiment 2 where the recessed/elevated surfaces 310 have a stripe shape in a top view and have a cross-sectional shape which is defined by a portion cut off from a circle or ellipse.

FIG. 33 is an example where the recessed/elevated surfaces 310 have a stripe shape in a top view and have a rectangular cross-sectional shape. FIG. 34 is an example where the recessed/elevated surfaces 310 have a stripe shape in a top view and have a trapezoidal cross-sectional shape. FIG. 35 is an example where the recessed/elevated surfaces 310 have a stripe shape in a top view and have a triangular cross-sectional shape. FIG. 36 is an example where the recessed/elevated surfaces 310 have a stripe shape in a top view and have a cross-sectional shape which is defined by a portion cut off from a circle or ellipse.

Hereinabove, the shapes of the recessed/elevated surfaces 310 have been described with reference to FIG. 25 to FIG. 36. These shapes of the recessed/elevated surfaces 310 may be employed in combination. In either of the cases shown in FIG. 25 to FIG. 36, the transparent region 322 is provided so as to cover at least part of the plurality of recessed/elevated surfaces 310 that are provided in the surface of the p-type nitride semiconductor layer 307. The transparent region 322 may be provided so as to fill at least part of the recessed portions of the recessed/elevated surfaces 310. Further, the p-side electrode 308 may be provided so as to cover the transparent region 322. The descriptions of the features of the respective shapes of the recessed/elevated surfaces 310 are herein omitted because they have previously been described in Embodiment 1.

Figure 37:
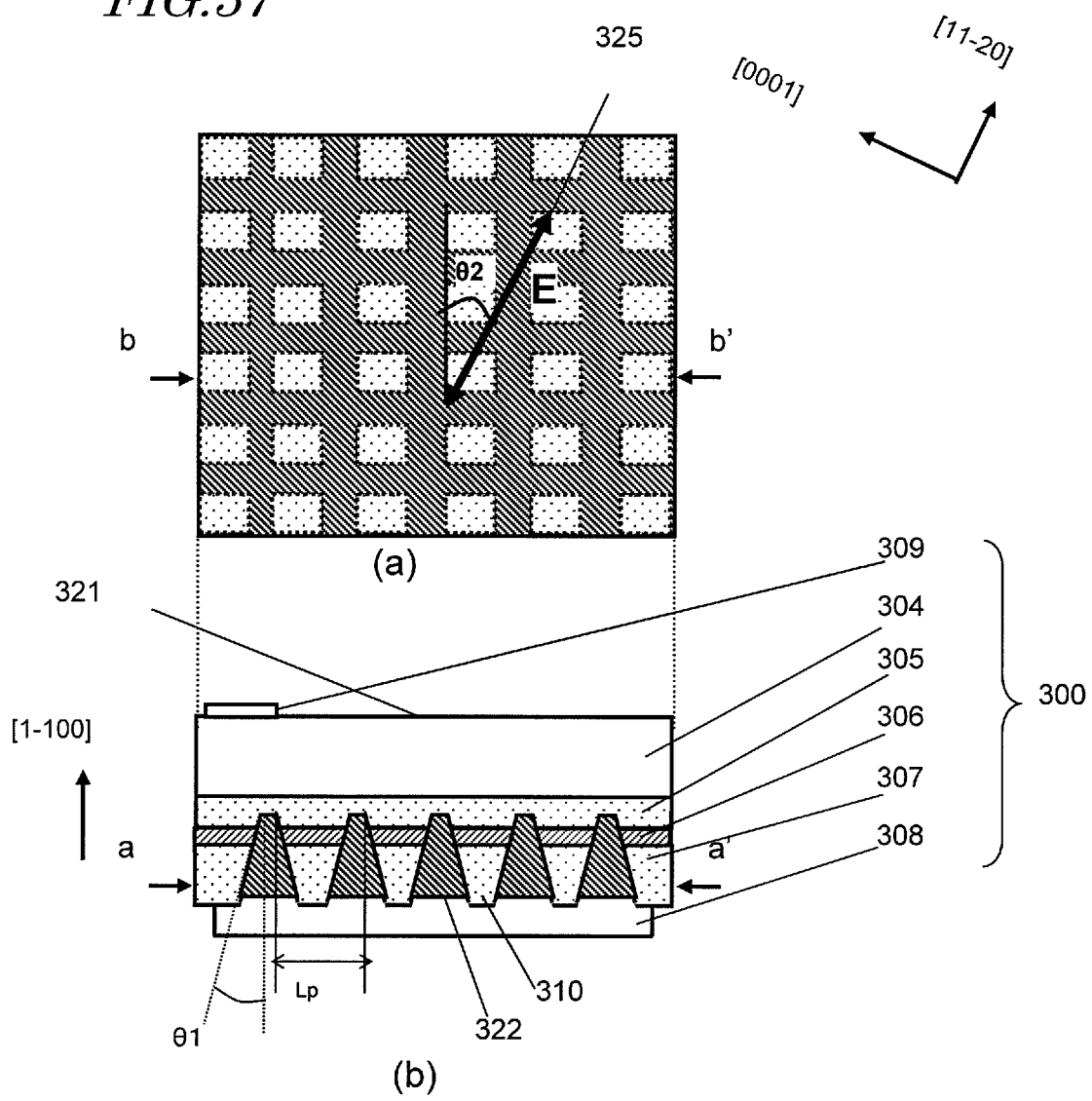
FIG. 37 is a diagram showing a variation of illustrative Embodiment 2.

FIG. 37 shows a variation of Embodiment 2. The elevated portions that form the recessed/elevated surfaces 310 are formed by part of the n-type nitride semiconductor layer 305, the nitride semiconductor active layer 306, and the p-type nitride semiconductor layer 307. The transparent region 322 is provided so as to fill the recessed portions provided between the elevated portions that are formed by part of the n-type nitride semiconductor layer 305, the nitride semiconductor active layer 306, and the p-type nitride semiconductor layer 307. The transparent region 322 may have an insulating property. As the material of the transparent region 322, for example, $SiO_2$, SiN, SiON, may be used.

FIG. 37 shows an example where the recessed/elevated surfaces 310 have a quadrangular shape in a top view and have a trapezoidal shape in a cross-sectional view. However, the shape of the recessed/elevated surfaces 310 may be any of the various shapes which have previously been described with reference to FIG. 25 to FIG. 36 or a combination thereof. In the variation of Embodiment 2, formation of the recessed/elevated surfaces 310 may be carried out concurrently with formation of the recessed portion 312. Therefore, advantageously, the number of fabrication steps does not increase. In the variation of Embodiment 2, the nitride semiconductor active layer 306 is also used as part of the recessed/elevated surfaces 310, so that the electric current density can be increased.

Figure 40:
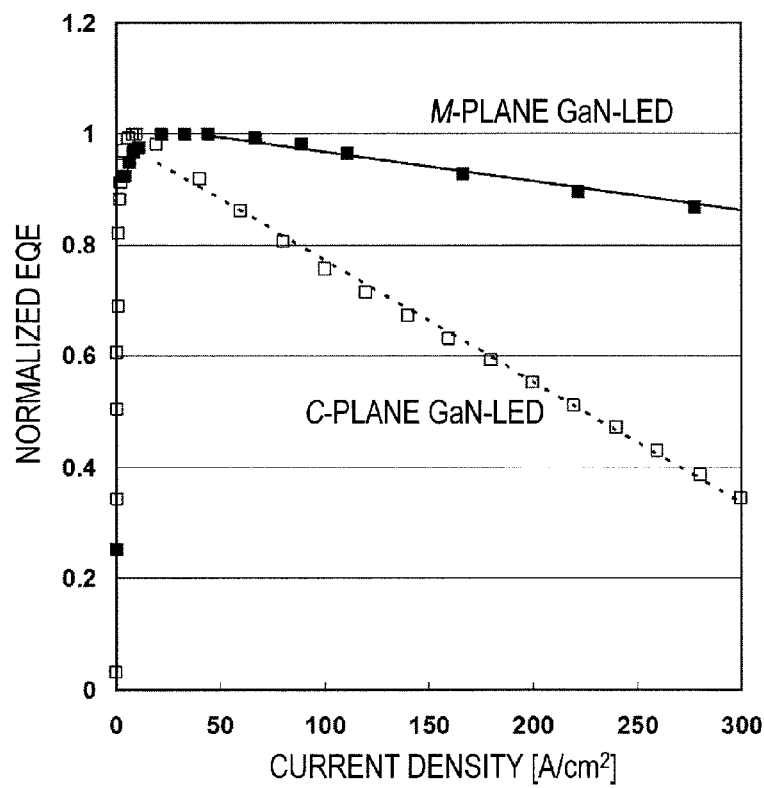
FIG. 40 is a graph showing the relationship between the electric current density and the normalized EQE.

FIG. 40 is a graph showing the relationship between the electric current density and the external quantum efficiency (EQE) for a nitride-based semiconductor light-emitting device manufactured on a c-plane GaN substrate and a nitride-based semiconductor light-emitting device manufactured on an m-plane GaN substrate. Here, the EQE is normalized with the maximum value. Here, the nitride-based semiconductor light-emitting device is configured so as not to have recessed portions or elevated portions. As clearly seen from FIG. 40, in the nitride-based semiconductor light-emitting device manufactured on the m-plane GaN substrate, the EQE is unlikely to decrease even when the electric current density is high. Therefore, it can be said that, even when the configuration of the variation of Embodiment 2 is used so that the electric current density is large, the efficiency of the nitride-based semiconductor light-emitting device is unlikely to decrease.

As described hereinabove, according to Embodiment 2, when light is reflected by the p-side electrode 308, the transparent region 322 that is provided between the p-type nitride semiconductor layer 307 and the p-side electrode 308 is used to change the orientation of the polarization of the polarized reflected light to an angle which does not include 0° and 90° with respect to the optic axis of a substrate that has birefringence. According to Embodiment 2, reflected light at the p-side electrode 308 is converted to elliptical polarization, and this reflected light is allowed to pass through the substrate that has birefringence, whereby polarized light emitted from the nitride semiconductor active layer 306 is efficiently converted to elliptical polarization, so that reduction of the polarization degree is realized. Further, since the polarization degree can be reduced, the light distribution characteristics can be ameliorated.

The manufacturing method of Embodiment 2 may be generally the same as that of Embodiment 1. Hereinafter, a method for forming the transparent region 322 is described.

After recesses and elevations have been formed in the surface of the p-type nitride semiconductor layer 307, formation of the transparent region 322 is carried out. For example, when $SiO_2$ or SiN is used for the transparent region 322, film formation of $SiO_2$ or SiN is carried out using a thermal CVD method or a plasma CVD method. When a thermal CVD method or a plasma CVD method is used, these films are formed over the entire surface of the p-type nitride semiconductor layer 307 in which recesses and elevations have been formed. Then, opening regions are formed in the transparent region 322 above the recesses and elevations by photolithography and dry etching. Then, the p-side electrode 308 is formed. The subsequent part of the formation method is the same as that of Embodiment 1.

Figure 44A:
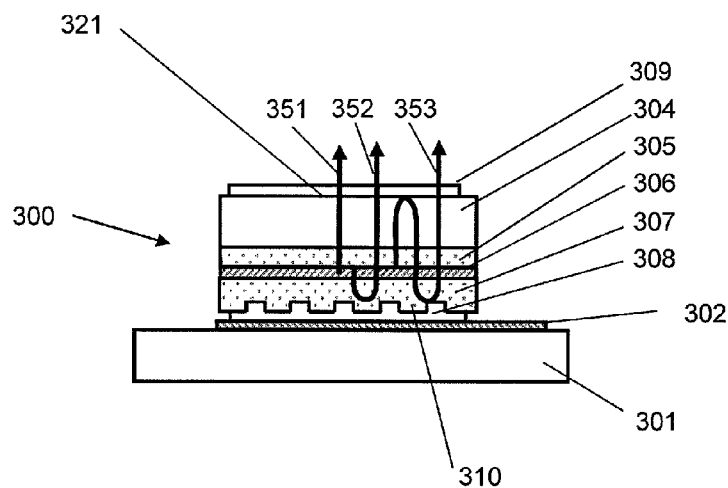
FIGS. 44A and 44B are a cross-sectional view showing a face-down configuration and a face-up configuration.
Figure 44B:
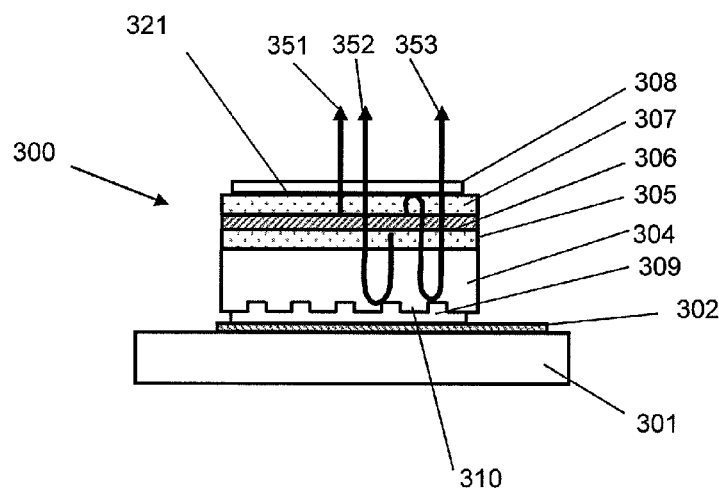

The light-emitting devices of the respective embodiments which have been described above either have a face-down configuration where the semiconductor multilayer structure that includes the active layer 306 is provided between the substrate 304 that has birefringence and the mounting base 301. However, the present disclosure is not limited to such an example. A light-emitting device of the present disclosure may have a face-up configuration. In the face-up configuration, the substrate 304 that has birefringence is provided between the semiconductor multilayer structure that includes the active layer 306 and the mounting base 301. FIGS. 44A and 44B show the face-down configuration and the face-up configuration, respectively. As shown in FIG. 44B, in the face-up configuration, the recessed/elevated surfaces 310 are formed in the substrate 304 that has birefringence. Note that, in the example shown in FIGS. 44A and 44B, an electrode which is provided on the light extraction surface 321 side is a transparent electrode which is made of a transparent electrically-conductive material. Such a transparent electrode may cover the light extraction surface 321. According to the embodiments of the present disclosure, in either example, an electrode which is provided on the mounting base 301 side is made of a reflective material and functions as a reflective electrode. Light reflected by the reflective electrode is transmitted through the substrate 304 that has a birefringent property and outgoes from the light extraction surface 321 to the outside of the device.

EXAMPLES

As an inventive example, a nitride-based semiconductor light-emitting device which has been described as the variation of Embodiment 2 was manufactured.

First, a 1.5 μm thick n-type nitride semiconductor layer, a nitride semiconductor active layer which was formed by a three-layer quantum well consisting of 9 nm thick InGaN well layers and 15 nm thick GaN barrier layers, and a p-type nitride semiconductor layer were formed on an n-type GaN substrate 304 having an M-plane principal surface using an MOCVD method.

Then, for the purpose of activating the p-GaN layer, a heat treatment was performed at 800° C. for 20 minutes.

Thereafter, a resist was patterned on the surface of the p-type nitride semiconductor layer by photolithography. On the surface of the p-type nitride semiconductor layer which was partially masked with the patterned resist, dry etching was performed using a chlorine gas with ICP as the plasma source such that the p-type nitride semiconductor layer, the nitride semiconductor active layer, and the n-type nitride semiconductor layer were partially removed to form a plurality of recesses and elevations. This dry etching process was performed till the n-type nitride semiconductor layer was partially exposed.

In this inventive example, devices in which the elevated portions had a square shape in a top view (Device 1, Device 2, Device 3, Device 4) and devices in which the elevated portions had a circular shape in a top view (Device 5, Device 6) were manufactured. The cross-sectional shape of the elevated portions was a trapezoidal shape. The angle formed between the lateral surfaces of the elevated portions and the normal direction of the m-plane was about 15°. The height of the elevated portions was about 1 μm.

Then, a transparent region was formed so as to cover the lateral surfaces of the elevated portions. The transparent region was formed by forming a spin-on-glass (SOG) layer having a thickness of about 150 nm and then forming a plasma $SiO_2$ film having a thickness of about 300 nm.

Then, an opening was formed in part of the transparent region for forming a connection between the p-type nitride semiconductor layer and the p-side electrode. For the formation of the opening, photolithography and wet etching with hydrofluoric acid were employed. Thereafter, a p-side electrode formed by a multilayer structure consisting of a Ag layer and a Pt layer (Ag/Pt) was formed so as to cover the recesses and elevations and the transparent region.

After formation of a multilayer structure of a Ti layer, an Al layer, and a Pt layer (Ti/Al/Pt), the n-type GaN substrate 304 was ground to a thickness of 100 μm. Thereafter, the resultant structure was diced into small chips of 300 μm square, whereby nitride semiconductor chips were fabricated. In the last, the thus-fabricated nitride semiconductor chip was flip-chip mounted to a mounting base, whereby a nitride-based semiconductor light-emitting device was manufactured.

Figure 41A:
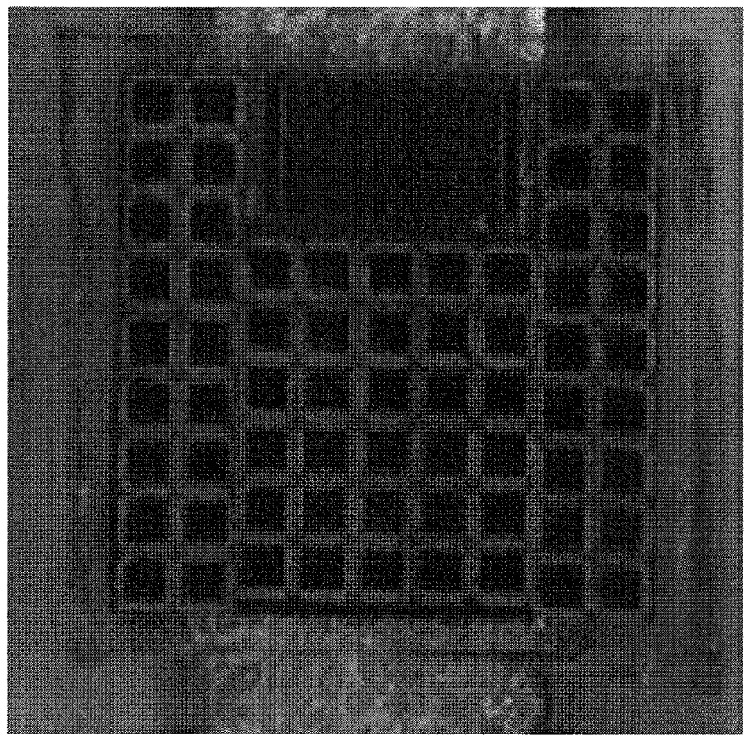
FIG. 41A is an optical microscopic image of a nitride-based semiconductor light-emitting device which has a plurality of recesses and elevations in Inventive Example.
Figure 41B:
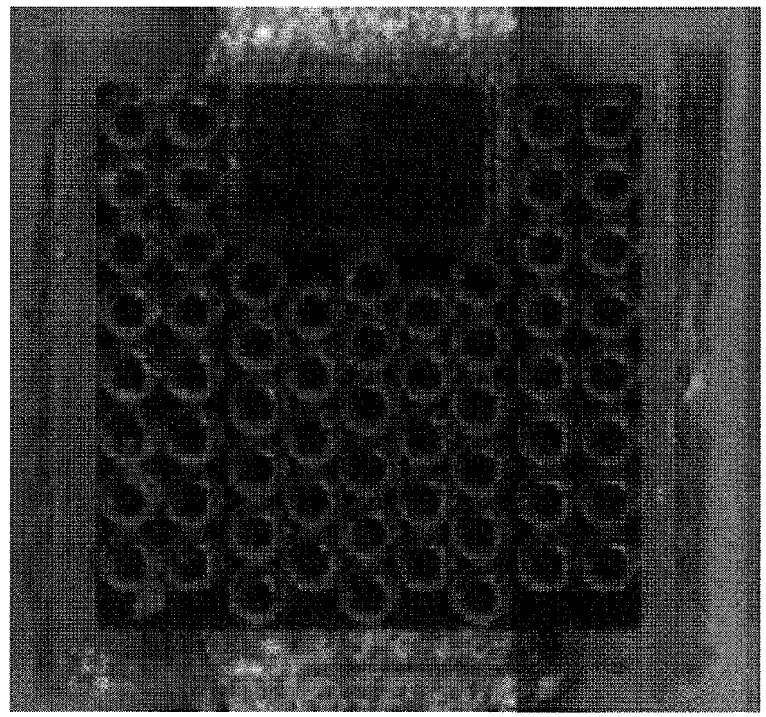
FIG. 41B is an optical microscopic image of a nitride-based semiconductor light-emitting device which has a plurality of recesses and elevations in Inventive Example.

For the sake of comparison, a nitride-based semiconductor light-emitting device which did not have the plurality of recesses and elevations as shown in FIG. 6 was manufactured. When an electric current of 10 mA was supplied to flow through these devices, each device exhibited an emission wavelength of about 445 nm. Table 1 is a list of the shapes of the recesses and elevations of the manufactured devices and the values of the normalized polarization degree. Here, the normalized polarization degree refers to a value normalized with a polarization degree which is achieved without the recesses and elevations being assumed as 1. The polarization degree was measured with a current value of 5 mA. FIG. 41A is an optical microscopic image of Device 2 which was observed from the top surface. FIG. 41B is an optical microscopic image of Device 6 which was observed from the top surface.

TABLE 1

| Device Name | Shape of recesses/elevations | Lp | Size | Normalized polarization degree |
|---|---|---|---|---|
| Device 1 | Square | 23 μm | 10 μm square | 0.69 |
| Device 2 | Square | 33 μm | 20 μm square | 0.78 |
| Device 3 | Square | 40 μm | 30 μm square | 0.91 |
| Device 4 | Square | 100 μm | 80 μm square | 0.97 |
| Device 5 | Circular | 24 μm | 10 μm diameter | 0.45 |
| Device 6 | Circular | 36 μm | 20 μm diameter | 0.56 |
| Comparative Example | None | | | 1.00 |

Figure 42:
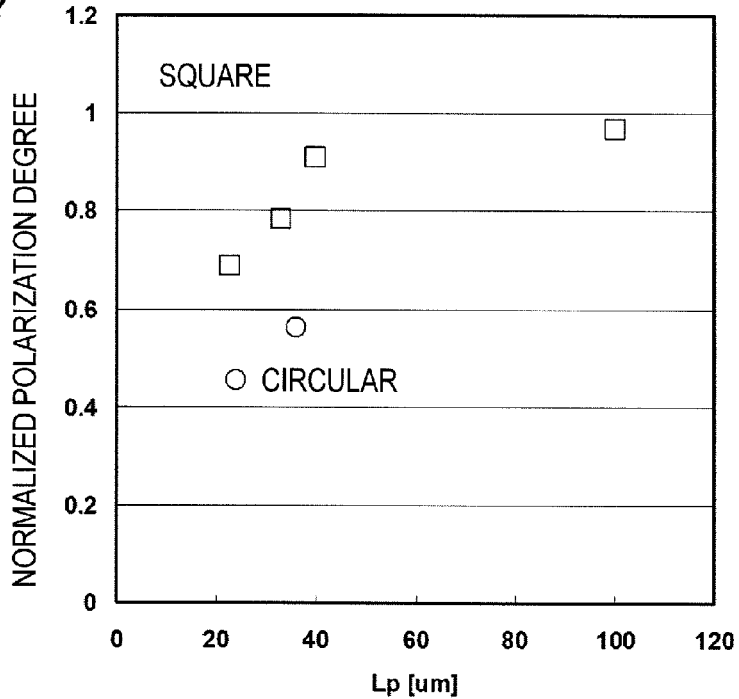
FIG. 42 is a graph showing the relationship between Lp and the normalized polarization degree in Inventive Example.

FIG. 42 is a graph showing the relationship between Lp and the normalized polarization degree. As Lp decreased, the normalized polarization degree also decreased. Particularly when Lp was not more than 40 μm, the effect of reducing the polarization degree was considerable. As for the shape of the recesses and elevations in the top view, the square shape achieved a greater polarization degree reducing effect than the circular shape.

Figure 43:
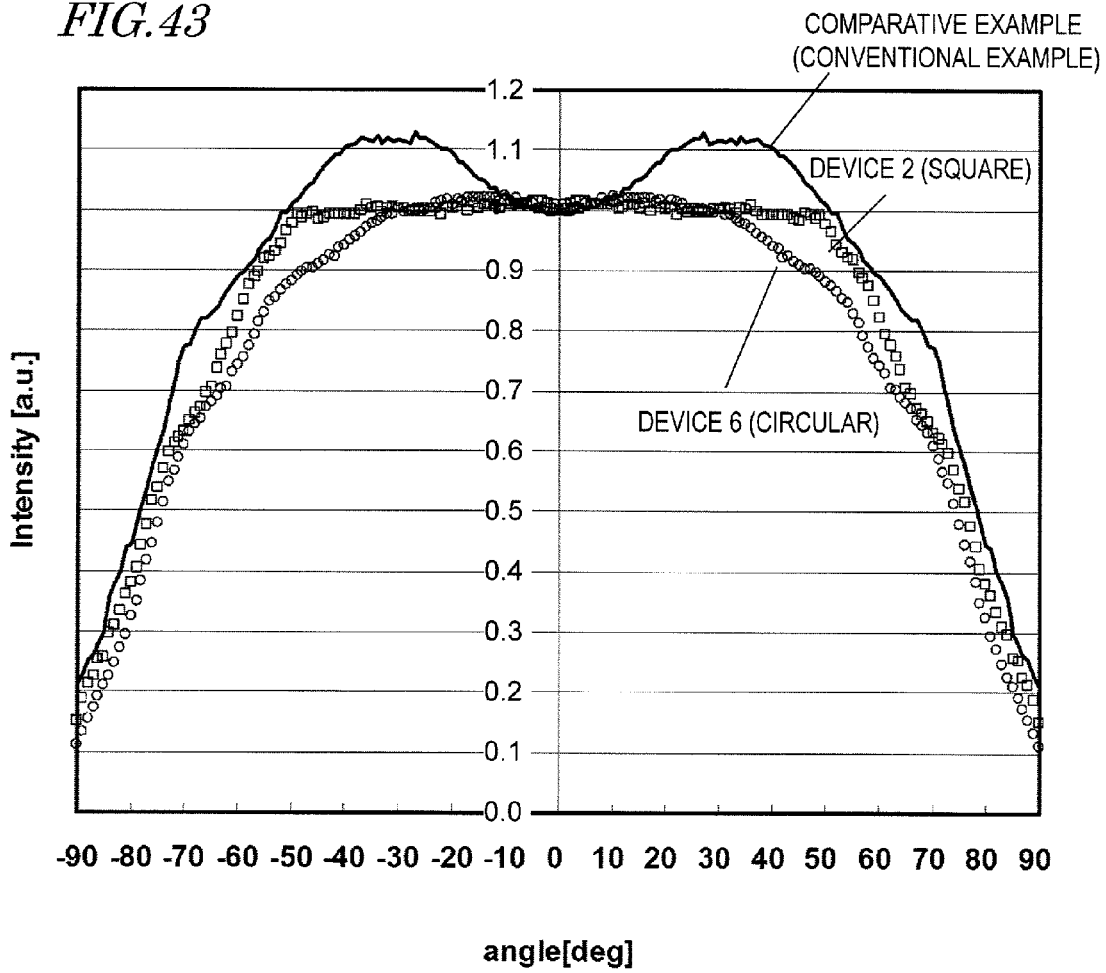
FIG. 43 is a graph showing the light distribution characteristics in Inventive Example.

FIG. 43 is a graph showing the light distribution characteristic along the c-axis direction in Device 2, Device 6, and Comparative Example. The light distribution characteristic was measured using OL700-30 LED GONIOMETER manufactured by Optronic Laboratories, Inc., based on condition A (the distance between the tip of an LED and the light receiving section 318 was 316 mm), which was described in CIE127 published by the International Commission on Illumination (CIE). During the measurement, the current value was 10 mA. Here, on the horizontal axis of the light distribution, −90° corresponds to the c-axis of the GaN, 0° corresponds to the m-axis of the GaN, and +90° corresponds to the +c axis of the GaN. The vertical axis of the light distribution corresponds to the measured output. Comparative Example exhibited, due to the polarization characteristics, a warped light distribution characteristic where the maximum value occurred around ±40°. On the other hand, in Device 2 and Device 6, the polarization degree was reduced, resulting in an ameliorated light distribution characteristic where the maximum value occurred around 0°.

OTHER EMBODIMENTS

The above-described light-emitting devices of the embodiments of the present disclosure may be used as a light source without any modification. However, if the light-emitting device of the present embodiment is combined with a resin including a phosphor that produces wavelength conversion, for example, the device can be used effectively as a light source with an expanded operating wavelength range (such as a white light source).

Figure 45:
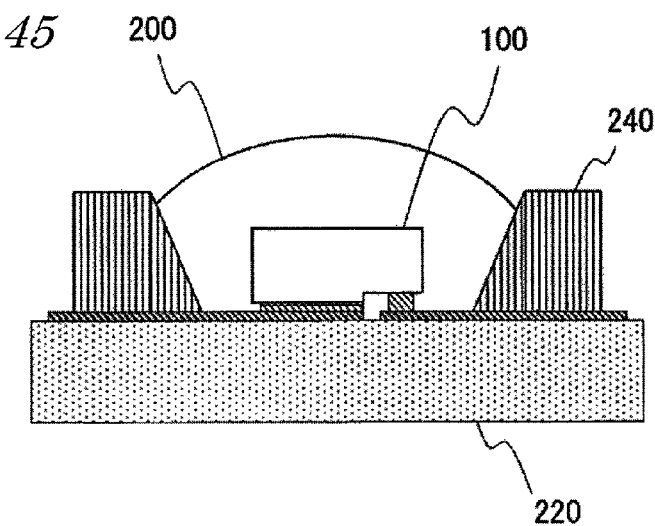
FIG. 45 is a cross-sectional view showing an illustrative embodiment of a white light source.

FIG. 45 is a schematic representation illustrating an example of such a white light source. The light source of FIG. 45 includes a light-emitting device 100 which has any configuration of the light-emitting devices of the above-described embodiments and a resin layer 200 in which particles of a phosphor such as YAG (yttrium aluminum garnet) are dispersed to change the wavelength of the light emitted from the light-emitting device 100 into a longer one. The light-emitting device 100 has been mounted on a supporting member 220 on which a wiring pattern has been formed. And on the supporting member 220, a reflective member 240 is arranged so as to surround the light-emitting device 100. The resin layer 200 has been formed so as to cover the light-emitting device 100.

Note that, in Applied Physics Express 2 (2009) 031002, for the purpose of forming an m-plane GaN layer of excellent crystallinity on a-plane sapphire, striped recesses and elevations extending in the m-axis direction of the sapphire are formed across the a-plane sapphire substrate, and crystal growth of the GaN is carried out. As a result, striped recesses and elevations extending in the a-axis direction of the GaN are provided. Applied Physics Express 2 (2009) 031002 fails to disclose that the hexagonal system nitride semiconductor has birefringence.

Japanese Laid-Open Patent Publication No. 2008-109098 discloses a configuration which is capable of solving a problem that the emission intensity increases with respect to a direction perpendicular to the polarization direction. However, this configuration intends to improve the light distribution, and therefore, Japanese Laid-Open Patent Publication No. 2008-109098 fails to consider the polarization degree of light emitted from a package. Japanese Laid-Open Patent Publication No. 2008-109098 also fails to disclose that the hexagonal system nitride semiconductor has birefringence.

According to an embodiment of the present disclosure, the polarization degree of extracted light is reduced. According to an embodiment, the light distribution characteristics are ameliorated, and the quality of emission improves. An embodiment of the present disclosure is suitable for decorative illumination and lighting purposes.

While the present disclosure has been described with respect to preferred embodiments thereof, it will be apparent to those skilled in the art that the disclosed disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A nitride-based semiconductor light-emitting device having a light extraction surface, comprising:
   a semiconductor multilayer structure including an active layer which is made of a nitride semiconductor, a principal surface of the nitride semiconductor being a semi-polar plane or a non-polar plane;
   an electrode which is configured to reflect at least part of light emitted from the active layer in a direction toward the light extraction surface;
   a birefringent substrate provided between the light extraction surface and the electrode, the birefringent substrate being configured to transmit light emitted from the active layer and light reflected by the electrode; and
   a recessed/elevated surface provided between the active layer and the electrode,
   wherein the following relationship holds true:

$$90 \cdot (2 \cdot a - 1) - 45 \leq \Delta n \cdot d \cdot \frac{360}{\lambda} \leq 90 \cdot (2 \cdot a - 1) + 45 \quad \text{[Expression 8]}$$

where $\Delta n$ is a birefringence of the substrate, d is a thickness of the substrate, $\lambda$ is an emission wavelength, and a is a natural number, and
   an angle which is formed between a lateral surface of each of the recessed or elevated portions and a normal line of a principal surface of the active layer, $\theta 1$, is not less than 10° and not more than 58°.

2. The nitride-based semiconductor light-emitting device of claim 1, wherein the recessed/elevated surface is provided in the principal surface of the semiconductor multilayer structure.

3. The nitride-based semiconductor light-emitting device of claim 1, wherein recessed portions that form the recessed/elevated surface of the semiconductor multilayer structure reach the active layer.

4. The nitride-based semiconductor light-emitting device of claim 1, wherein the recessed/elevated surface is provided in the birefringent substrate.

5. The nitride-based semiconductor light-emitting device of claim 1, wherein the active layer is configured to emit light of which electric field intensity is deviated in a direction parallel to the principal surface.

6. The nitride-based semiconductor light-emitting device of claim 1, wherein the birefringent substrate includes a portion which is made of a nitride semiconductor, a principal surface of the nitride semiconductor being a semi-polar plane or a non-polar plane.

7. The nitride-based semiconductor light-emitting device of claim 6, wherein an optic axis of the birefringent substrate is inclined by an angle which does not include 0° or 90° with respect to a principal surface of the substrate.

8. The nitride-based semiconductor light-emitting device of claim 6, wherein the birefringent substrate is any one of the following substrates:
   a substrate which is made of a GaN, a principal surface of the GaN being an m-plane;
   a substrate which is made of a GaN, a principal surface of the GaN being an a-plane;
   a substrate which is made of a GaN, a principal surface of the GaN being a −r plane;
   an r-plane sapphire substrate which has a GaN layer, a principal surface of the GaN layer being an a-plane on surface of the r-plane sapphire substrate;
   an m-plane sapphire substrate which has a GaN layer, a principal surface of the GaN layer being an m-plane on surface of the m-plane sapphire substrate;
   an a-plane sapphire substrate which has a GaN layer, a principal surface of the GaN layer being an m-plane on surface of the a-plane sapphire substrate; and an m-plane SiC substrate which has a GaN layer, a principal surface of the GaN layer being an m-plane on surface of the m-plane SiC substrate.

9. The nitride-based semiconductor light-emitting device of claim 6, wherein the birefringent substrate is a GaN substrate, a principal surface of the GaN substrate being an m-plane.

10. The nitride-based semiconductor light-emitting device of claim 1, wherein,
a shape of each of the recessed or elevated portions that form the recessed/elevated surface which is viewed from a normal direction of a principal surface of the active layer is a circular or quadrangular shape or a shape which is defined by a combination thereof, and
the recessed or elevated portions that form the recessed/elevated surface are two-dimensionally arranged in a plane of the principal surface of the semiconductor multilayer structure or a rear surface of the birefringent substrate.

11. The nitride-based semiconductor light-emitting device of claim 1, wherein,
a shape of a cross section of each of the recessed or elevated portions that form the recessed/elevated surface which is perpendicular to a principal surface of the active layer is a trapezoidal shape, a triangular shape, a shape which is defined by a portion cut off from a circle or ellipse, or a shape which is defined by a combination thereof, and
an angle formed between a tangent line at a point on each of the recessed or elevated portions which is closest to the active layer and a normal line of a principal surface of the active layer, θ1, is not less than 10° and not more than 58°.

12. The nitride-based semiconductor light-emitting device of claim 1, wherein,
a shape of the recessed or elevated portions that form the recessed/elevated surface which is viewed from a normal direction of a principal surface of the active layer is a stripe shape, and
an angle which is formed by an extending direction of the stripe shape with respect to the polarization direction of light emitted from the active layer, θ2, is not less than 30° and not more than 60°.

13. The nitride-based semiconductor light-emitting device of claim 1, wherein an interval between centers of adjoining recessed portions or adjoining elevated portions of the recessed or elevated portions that form the recessed/elevated surface, Lp, is not more than 40 μm.

14. The nitride-based semiconductor light-emitting device of claim 1, wherein a transparent region is provided between the recessed/elevated surface of the semiconductor multilayer structure and the electrode.

15. The nitride-based semiconductor light-emitting device of claim 14, wherein the transparent region is provided in the recessed portions that form the recessed/elevated surface of the semiconductor multilayer structure.

16. The nitride-based semiconductor light-emitting device of claim 14, wherein the transparent region is configured to convert light passing through the transparent region to elliptical polarization.

17. The nitride-based semiconductor light-emitting device of claim 1, wherein the semiconductor multilayer structure includes a p-type semiconductor layer and a n-type semiconductor layer between which the active layer is provided.

18. The nitride-based semiconductor light-emitting device of claim 1, wherein the electrode is provided so as to cover the recessed/elevated surface and is configured to reflect light such that the polarization direction is rotated.

19. A light source, comprising:
the nitride-based semiconductor light-emitting device as set forth in claim 1; and
a wavelength converter including a phosphor that converts a wavelength of light emitted from the nitride-based semiconductor light-emitting device.

* * * * *